United States Patent
Wu et al.

(10) Patent No.: US 11,177,268 B2
(45) Date of Patent: Nov. 16, 2021

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Wei-Cheng Wu, Hsinchu County (TW); Chien-Hung Chang, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/584,710

(22) Filed: Sep. 26, 2019

(65) Prior Publication Data

US 2020/0161319 A1 May 21, 2020

Related U.S. Application Data

(60) Provisional application No. 62/770,669, filed on Nov. 21, 2018.

(51) Int. Cl.
*H01L 27/11524* (2017.01)
*H01L 29/66* (2006.01)
*H01L 29/788* (2006.01)

(52) U.S. Cl.
CPC .. *H01L 27/11524* (2013.01); *H01L 29/66545* (2013.01); *H01L 29/66825* (2013.01); *H01L 29/788* (2013.01)

(58) Field of Classification Search
CPC ......... H01L 29/66545; H01L 29/66825; H01L 29/788; H01L 27/11536; H01L 27/11541; H01L 27/11524
See application file for complete search history.

(56) References Cited

U.S. PATENT DOCUMENTS

| | | | |
|---|---|---|---|
| 2011/0198699 A1* | 8/2011 | Hung | H01L 27/11 257/369 |
| 2013/0075827 A1* | 3/2013 | Lee | H01L 29/517 257/369 |
| 2014/0252423 A1* | 9/2014 | Tsao | H01L 21/28185 257/288 |
| 2015/0129952 A1* | 5/2015 | Chuang | H01L 27/11573 257/326 |
| 2015/0137207 A1* | 5/2015 | Chuang | H01L 29/517 257/316 |
| 2018/0053773 A1* | 2/2018 | Leobandung | H01L 29/40114 |
| 2018/0151581 A1* | 5/2018 | Wu | H01L 27/11541 |
| 2018/0301562 A1* | 10/2018 | Li | H01L 21/266 |

\* cited by examiner

*Primary Examiner* — Vongsavanh Sengdara
(74) *Attorney, Agent, or Firm* — Maschoff Brennan

(57) ABSTRACT

A memory device includes a substrate, a transistor, and a memory cell. The substrate includes a cell region and a logic region. The transistor is over the logic region and includes a first metal gate stack. The memory cell is over the cell region and includes an erase gate. The erase gate is a metal gate stack.

20 Claims, 55 Drawing Sheets

MEMORY DEVICE AND MANUFACTURING METHOD THEREOF

PRIORITY CLAIM AND CROSS-REFERENCE

This application claims priority to U.S. Provisional Application Ser. No. 62/770,669, filed Nov. 21, 2018, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 27A and 28 illustrate a method for manufacturing a memory device in different stages in accordance with some embodiments.

DETAILED DESCRIPTION

Figure 1:
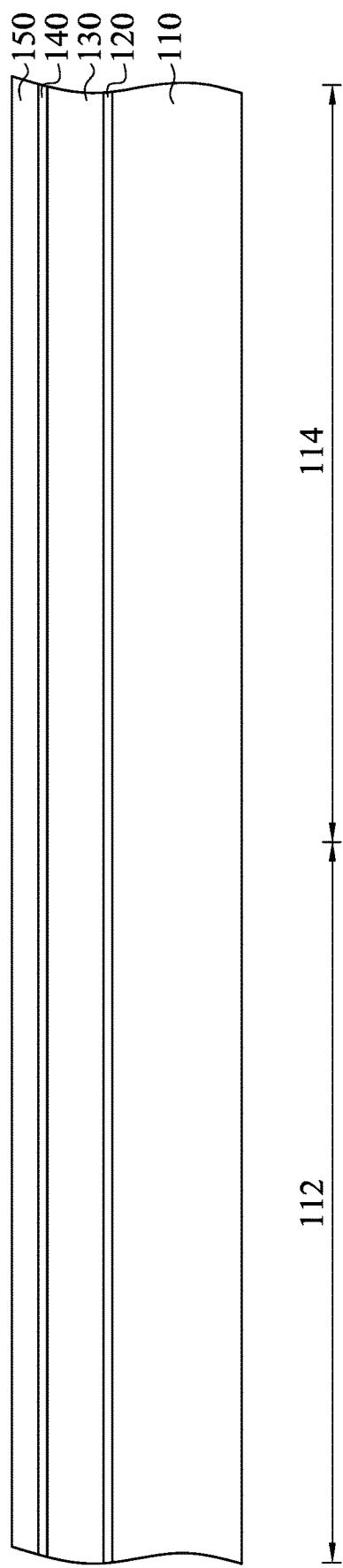

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Flash memory can be formed on a bulk silicon substrate and uses various bias conditions to read and write data values. For example, an ESF3 cell—or so-called "third generation SUPERFLASH" cell—includes a pair of symmetric split gate memory cells, each of which includes a pair of source/drain regions with a channel region arranged there between. In the ESF3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the ESF3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Some embodiments of the present disclosure relate to embedded flash memory devices that include metal erase gates. Although some implementations are illustrated below with regards to split gate flash memory, it will be appreciated that this concept is not limited to split gate flash memory cells, but is also applicable to other types of flash memory cells.

FIGS. 1 to 27A and 28 illustrate a method for manufacturing a memory device in different stages in accordance with some embodiments. Reference is made to FIG. 1. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, a semiconductor-on-insulator (SOI) structure, or the like. The substrate 110 includes a cell region 112 and a logic region 114. The logic region 114 is located at least one edge of the cell region 112. For example, the logic region 114 surrounds the cell region 112.

A gate dielectric layer 120 is then formed over the substrate 110. In some embodiments, the gate dielectric layer 120 may include, for example, a dielectric material such as silicon dioxide ($SiO_2$), silicon nitride ($Si_3N_4$), oxynitrides (SiON), high-k materials, other non-conductive materials, combinations thereof, or the like. The gate dielectric layer 120 may be formed using thermal oxide, chemical vapor deposition (CVD), physical vapor deposition (PVD), atomic layer deposition (ALD), ozone oxidation, other suitable processes, combinations thereof, or the like.

A floating gate layer 130 is formed over the gate dielectric layer 120. The floating gate layer 130 may include polysilicon formed through, for example low pressure CVD (LPCVD) methods, CVD methods and PVD sputtering methods employing suitable silicon source materials. If desired, the floating gate layer 130 may be ion implanted to the desired conductive type. It is to be appreciated other gate electrode material such as metal, metal alloys, single crystalline silicon, or combinations thereof.

A pad layer 140 is formed over the floating gate layer 130, and a mask layer 150 is formed over the pad layer 140. The pad layer 140 may be formed of dielectric material, such as an oxide layer. The mask layer 150 can be formed of dielectric material, such as silicon nitride (SiN) or other suitable materials. In some embodiments, the thickness of the mask layer 150 is few hundred Angstroms, such as about 10 to about 100 Angstroms, and the thickness of the pad layer 140 is about 30 to about 300 Angstroms, and the present disclosure is not limited in this respect.

Figure 2:
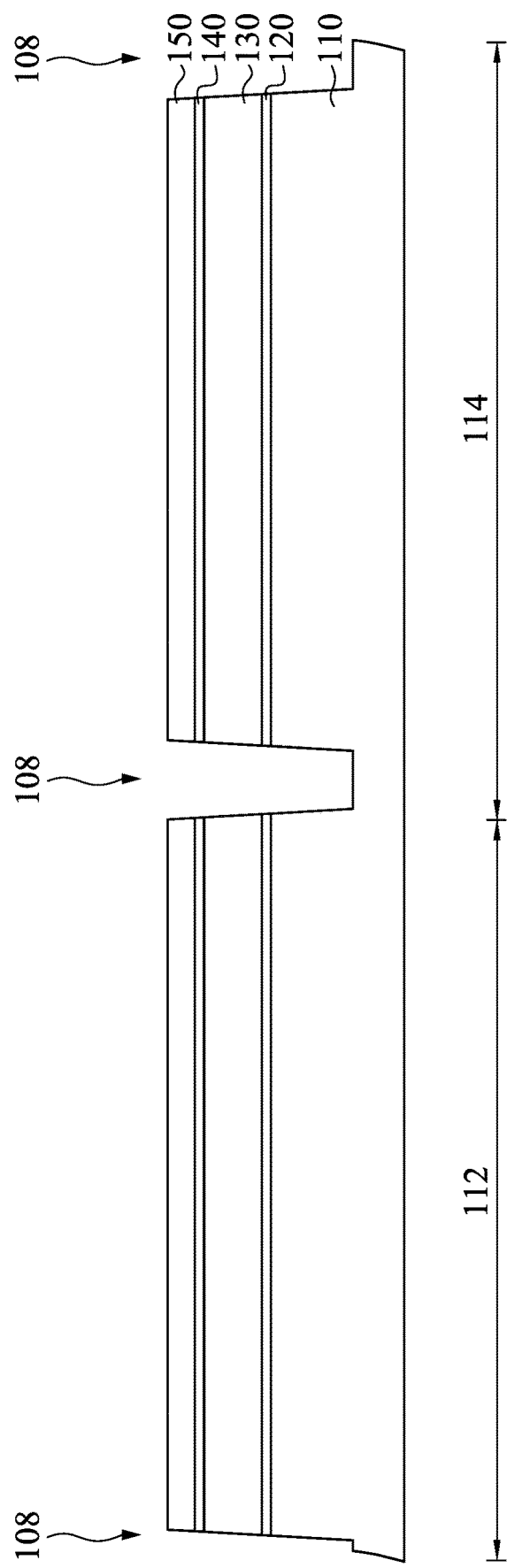

Reference is made to FIG. 2. The structure of FIG. 1 is patterned to form a plurality of trenches 108. The trenches 108 are formed by forming a mask over the mask layer 150 of FIG. 1, the mask covering some portions of the mask layer 150 while leaving other regions of the mask layer 150 exposed and performing a dry etch to remove the exposed portions of the mask layer 150 and the corresponding layers underneath (i.e., the pad layer 140, the floating gate layer 130, the gate dielectric layer 120, and the substrate 110).

Figure 3:
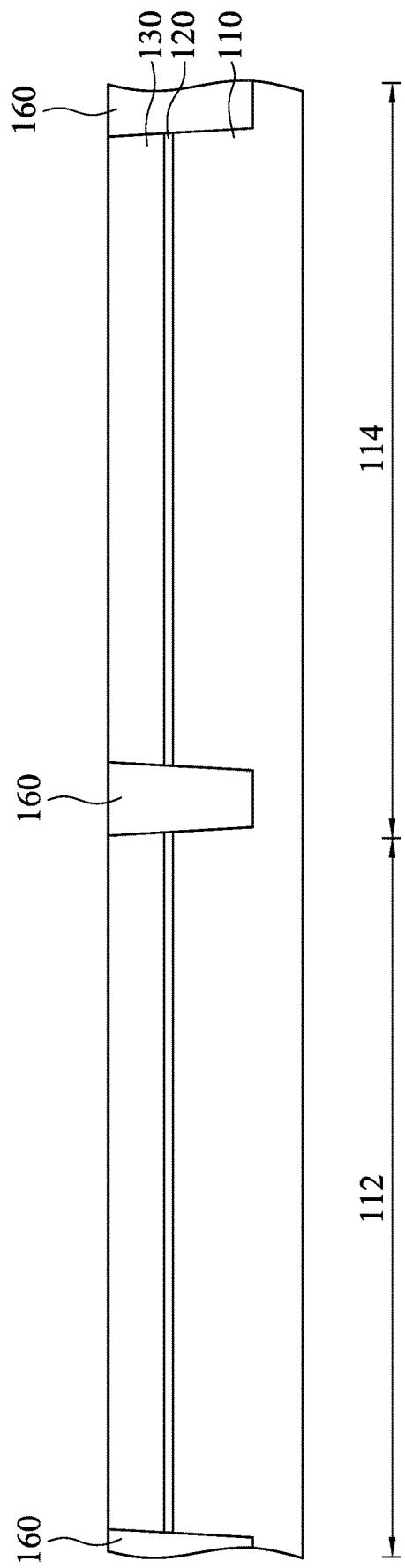

Reference is made to FIG. 3. A plurality of isolation features 160 are respectively formed in the trenches 108. In greater detail, dielectric material covers the structure of FIG. 2. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the top surfaces of the floating gate layer 130 to form a plurality of isolation features 160 in the trenches 108.

Figure 4:
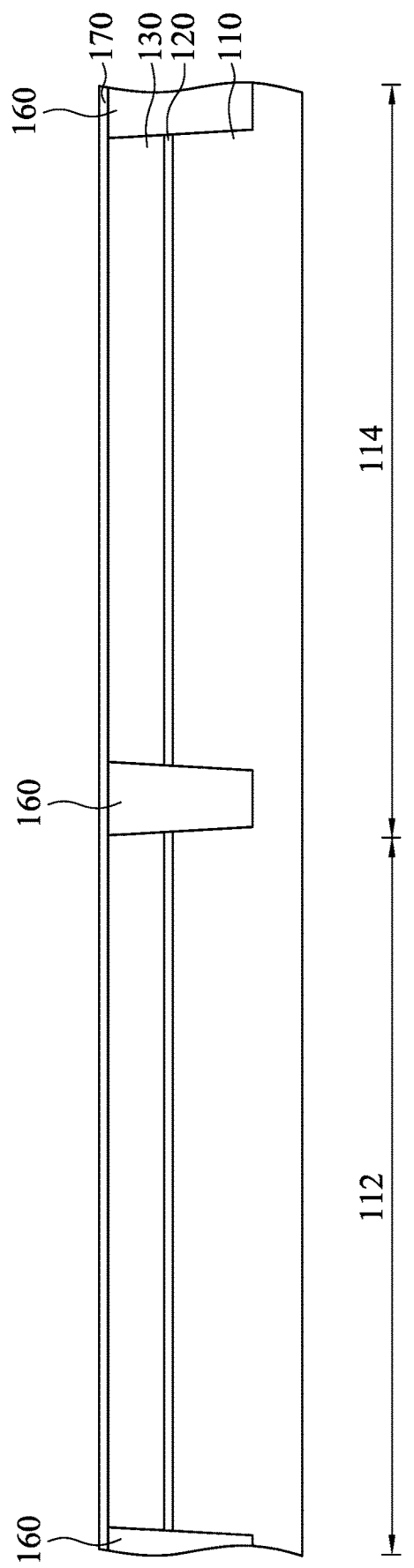

Reference is made to FIG. 4. Another gate dielectric layer 170 is formed over the structure of FIG. 3. In some embodiments, the gate dielectric layer 170 and the gate dielectric layer 120 may have the same or different materials. That is, the gate dielectric layer 170 may include, for example, a dielectric material such as silicon dioxide ($SiO_2$), silicon nitride ($Si_3N_4$), oxynitrides (SiON), high-k materials, other non-conductive materials, combinations thereof, or the like. The gate dielectric layer 170 may be formed using chemical vapor deposition (CVD), physical vapor deposition (PVD), atomic layer deposition (ALD), ozone oxidation, other suitable processes, or combinations thereof.

Figure 5:
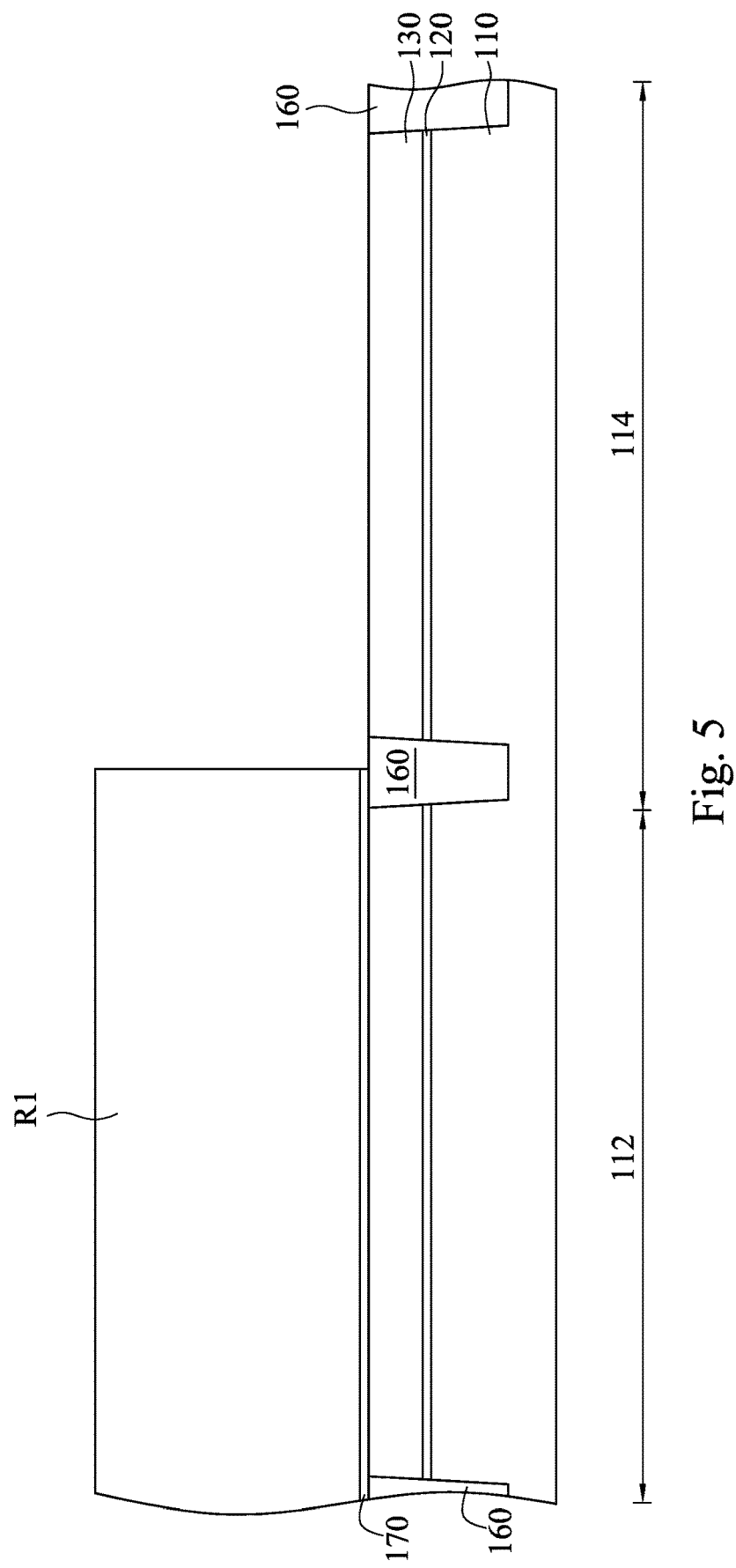

Reference is made to FIG. 5. The gate dielectric layer 170 is patterned. Specifically, a portion of the gate dielectric layer 170 over the logic region 114 is removed. In some embodiments, a resist (such as a photoresist) R1 is formed on the gate dielectric layer 170. The resist R1 is then patterned to expose the portion of the gate dielectric layer 170 over the logic region 114. The gate dielectric layer 170 is then patterned using the resist R1 as a mask, such that the portion of the gate dielectric layer 170 over the logic region 114 is removed, and a portion of the floating gate layer 130 over the logic region 114 is exposed.

Figure 6:
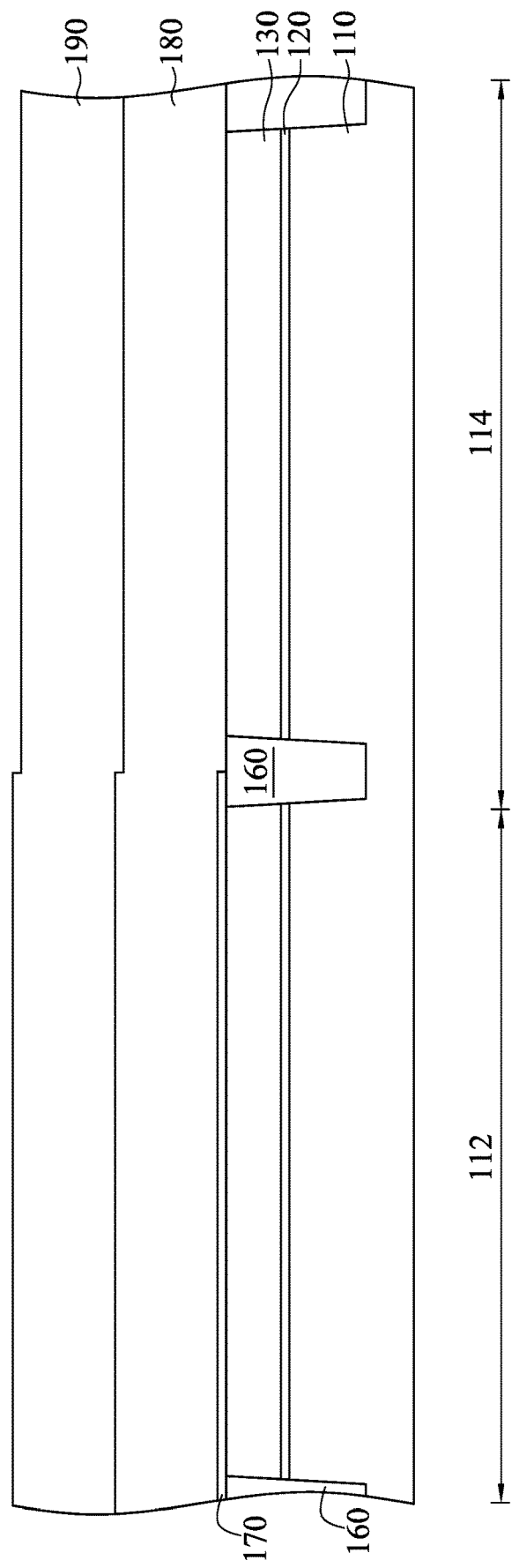

Reference is made to FIG. 6. The resist R1 in FIG. 5 is removed, and the removal method may be performed by solvent stripping or plasma ashing, for example. Then, a control gate layer 180 is conformally formed over the gate dielectric layer 170 and the portion of the floating gate layer 130 over the logic region 114. The control gate layer 180 may include polysilicon formed through, for example low pressure CVD (LPCVD) methods, CVD methods and PVD sputtering methods employing suitable silicon source materials. If desired, the control gate layer 180 may be ion implanted to the desired conductive type.

A hard mask layer 190 is conformally formed over the control gate layer 180. The hard mask layer 190 may include single layer or multiple layers. In some embodiments, the hard mask layer 190 includes $SiN/SiO_2/SiN$ stacked layers or other suitable materials. In some embodiments, the hard mask layer 190 may be formed using chemical vapor deposition (CVD), physical vapor deposition (PVD), atomic layer deposition (ALD), ozone oxidation, other suitable processes, or combinations thereof.

Figure 7:
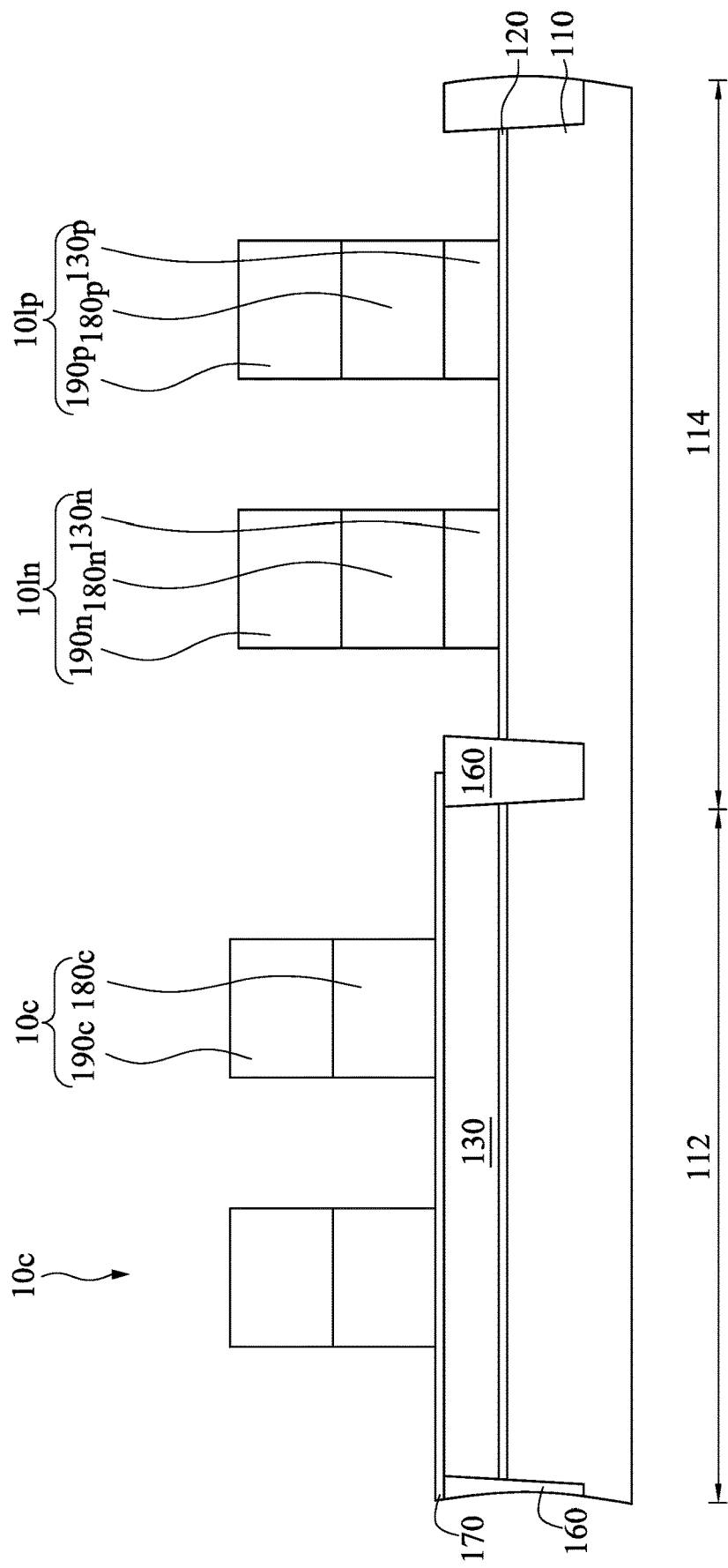

Reference is made to FIG. 7. The hard mask layer 190, the control gate layer 180, and portions of the floating gate layer 130 over the logic region 114 of FIG. 6 are patterned to form a plurality of gate stacks 10c over the cell region 112 of the substrate 110 and gate stacks 101n, 101p over the logic region 114 of the substrate 110. Two adjacent gate stacks 10c are formed between two adjacent isolation features 160. Specifically, at least one of the gate stacks 10c includes a control gate 180c and a hard mask 190c. The control gate 180c is formed over the gate dielectric layer 170. For example, the control gate layer 180 of FIG. 6 can be patterned to form the control gate 180c. The hard mask 190c is formed over the control gate 180c. For example, the hard mask layer 190 of FIG. 6 can be patterned to form the hard mask 190c. The gate stack 101n includes a first dummy gate 130n, a second dummy gate 180n, and a hard mask 190n. The first dummy gate 130n is formed over the gate dielectric layer 120. For example, the floating gate layer 130 over the logic region 114 of FIG. 6 can be patterned to form the first dummy gate 130n. The second dummy gate 180n is formed over the first dummy gate 130n. For example, the control gate layer 180 of FIG. 6 can be patterned to form the second dummy gate 180n. The hard mask 190n is formed over the second dummy gate 180n. For example, the hard mask layer 190 of FIG. 6 can be patterned to form the hard mask 190n. The gate stack 101p includes a first dummy gate 130p, a second dummy gate 180p, and a hard mask 190p. The first dummy gate 130p is formed over the gate dielectric layer 120. For example, the floating gate layer 130 over the logic region 114 of FIG. 6 can be patterned to form the first dummy gate 130p. The second dummy gate 180p is formed over the first dummy gate 130p. For example, the control gate layer 180 of FIG. 6 can be patterned to form the second dummy gate 180p. The hard mask 190p is formed over the second dummy gate 180p. For example, the hard mask layer 190 of FIG. 6 can be patterned to form the hard mask 190p. It is noted that because the portion of the gate dielectric layer 170 over the logic region 114 of the substrate 110 is removed in advance, the portion of the floating gate layer 130 over the logic region 114 is patterned while another portion of the floating gate layer 130 over the cell region 112 is not patterned in this process.

Figure 8:
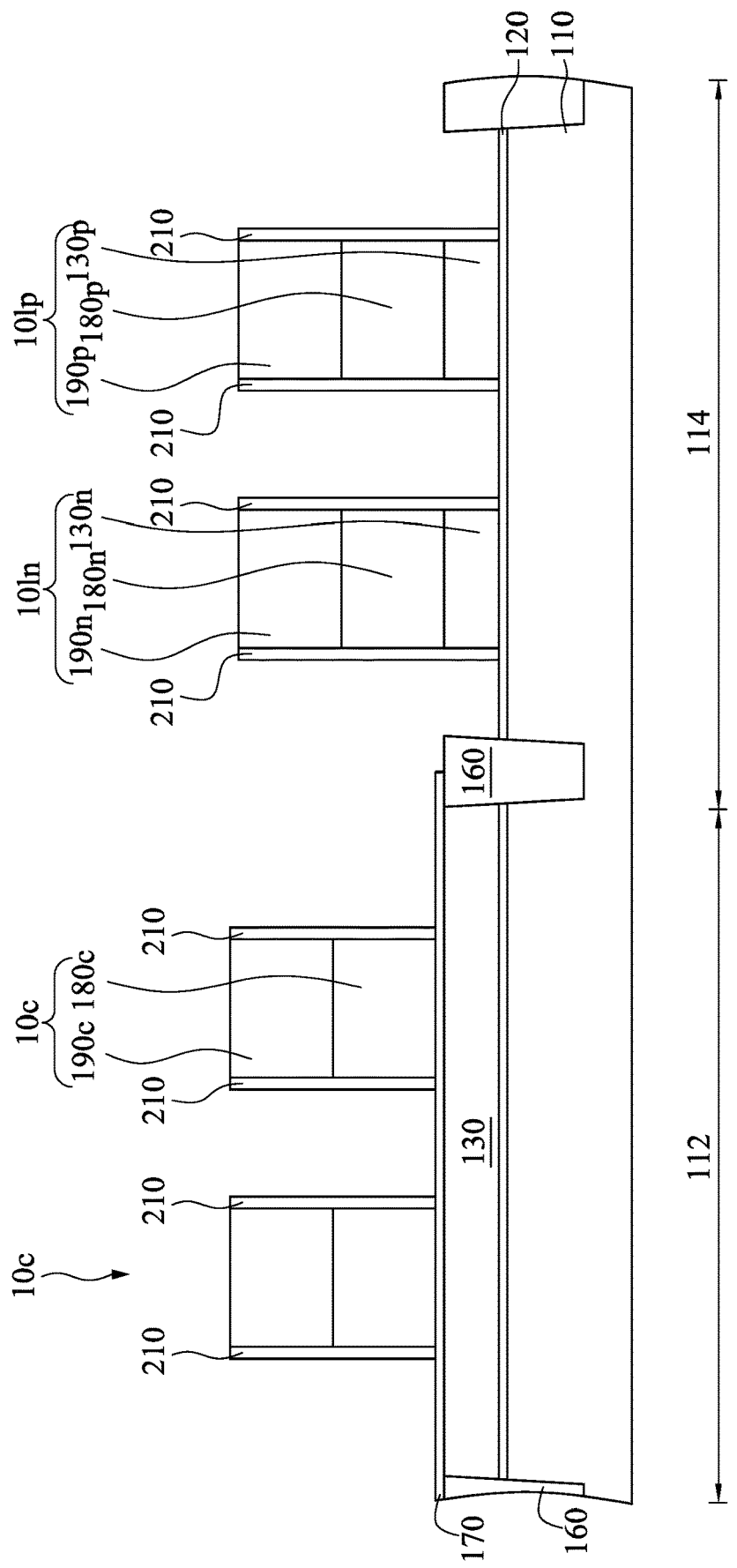

Reference is made to FIG. 8. First spacer structures 210 are formed on sidewalls of the gate stacks 10c, the gate stacks 101n and 101p. In some embodiments, the first spacer structures 210 include an inner silicon oxide layer, a middle silicon nitride layer, and an outer silicon oxide layer. In some embodiments, dielectric films may be conformally formed over the structure of FIG. 7, and etching process(es) is(are) performed to remove the horizontal portions of the dielectric films to form the first spacer structures 210. In some embodiments, the first spacer structures 210 over the cell region 112 may be referred to as control gate (CG) sidewall spacers 210.

Figure 9:
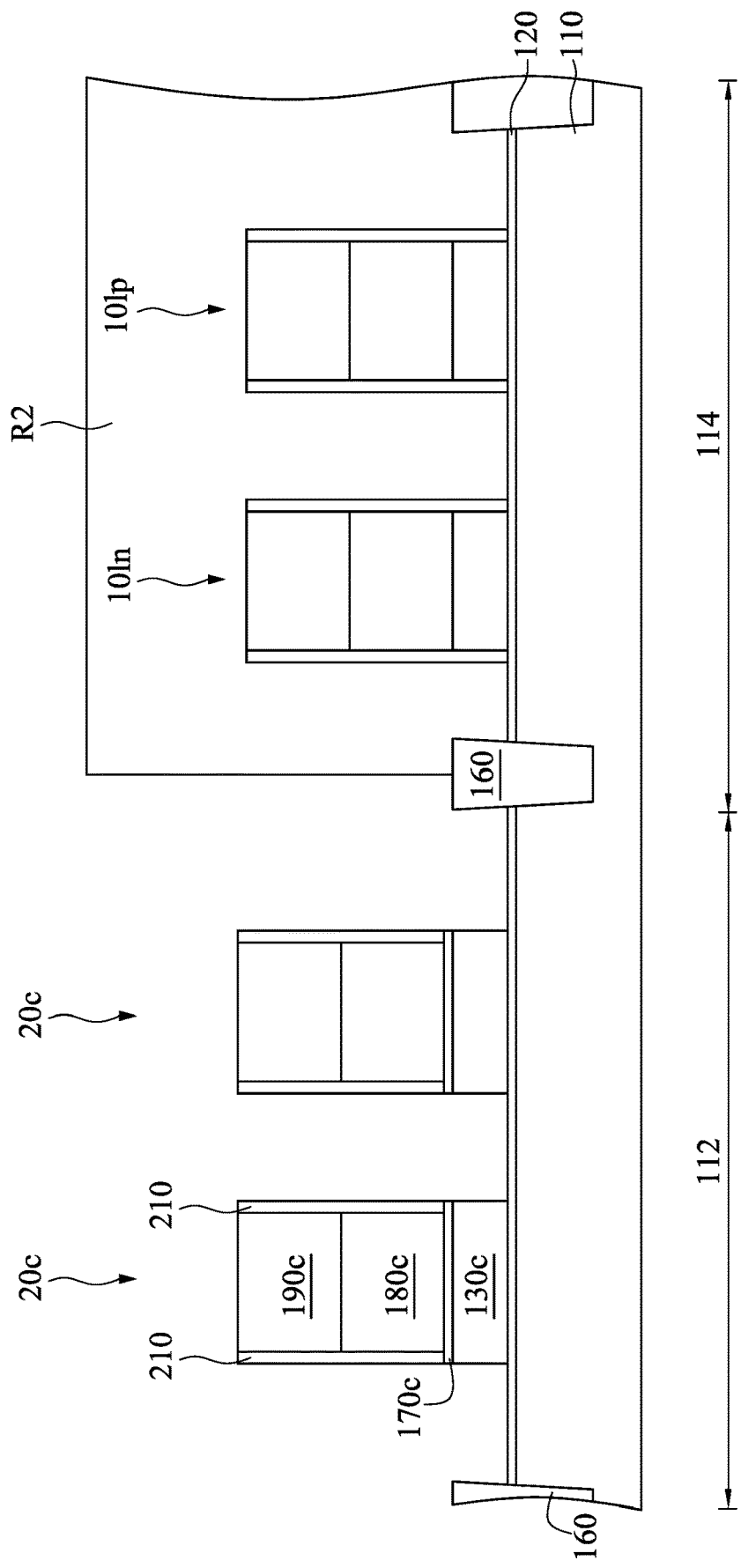

Reference is made to FIG. 9. The gate dielectric layer 170 and the floating gate layer 130 over the cell region 112 in FIG. 8 are patterned using the gate stacks 10c as masks. Specifically, a mask layer (such as a bottom anti-reflective coating (BARC)) R2 is formed to cover the structure of FIG. 8. The mask layer R2 is then patterned to expose the structure over the cell region 112. The gate dielectric layer 170 and the floating gate layer 130 are then patterned using the gate stacks 10c (see FIG. 8) as masks, such that the gate dielectric layer 170 is patterned to be gate dielectric layers 170c, the floating gate layer 130 is patterned to be floating gates 130c, and a portion of the gate dielectric layer 120 over the cell region 112 is exposed. After the patterning process, the control gate 180c, the hard mask 190c, the first spacer structures 210, the gate dielectric layer 170c, and the floating gate 130c form a gate stack 20c.

Figure 10:
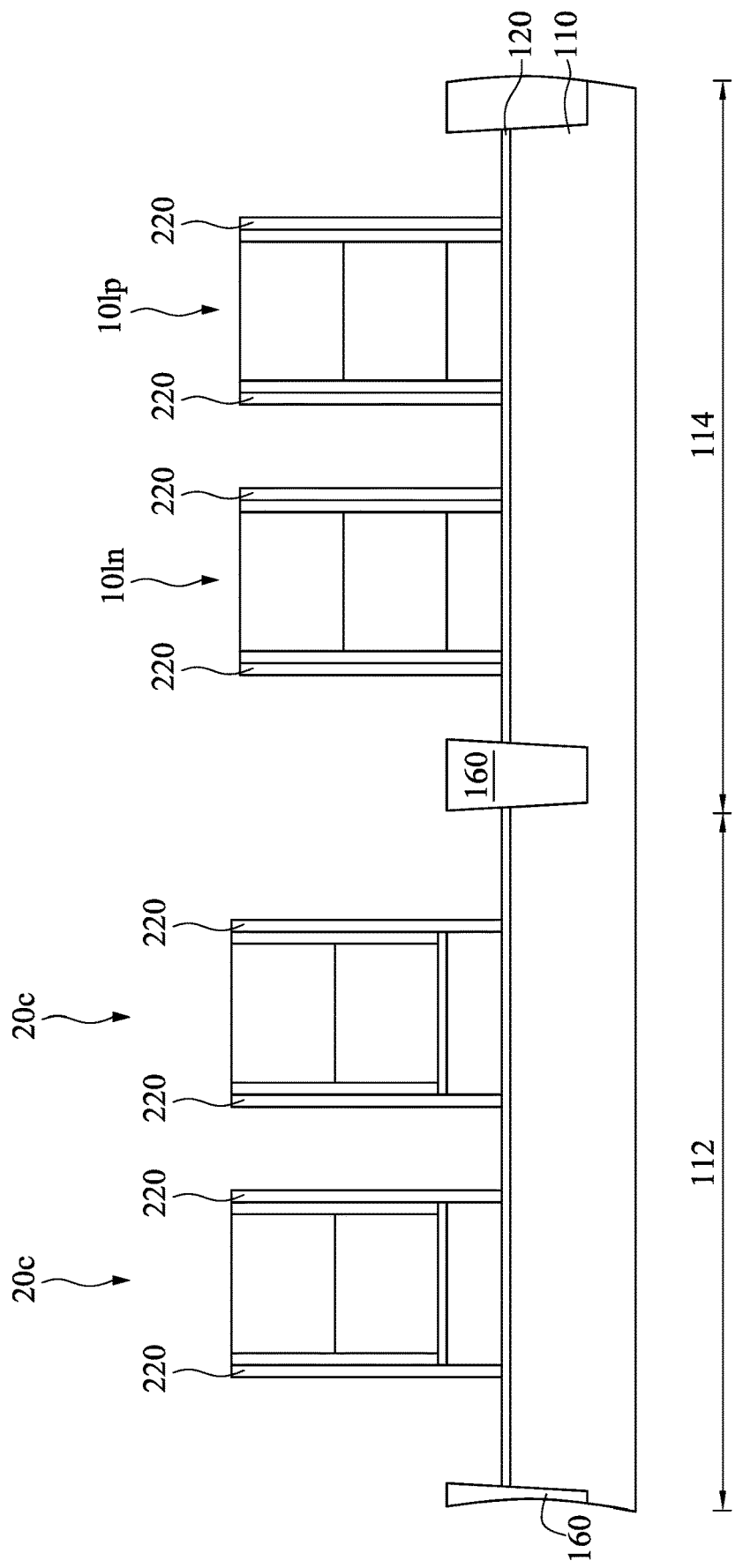

Reference is made to FIG. 10. The mask layer R2 in FIG. 9 is removed, and the removal method may be performed by dry etching, for example. Then, second spacer structures 220 are formed on sidewalls of the gate stacks 20c, the gate stacks 101n and 101p. In some embodiments, the second spacer structures 220 are high temperature oxide layer or other suitable dielectric layers. In some embodiments, a dielectric film may be conformally formed over the structure of FIG. 9 (after the mask layer R2 is removed), and an etching process is performed to remove the horizontal portions of the dielectric film to form the second spacer structures 220. In some embodiments, the second spacer structures 220 over the cell region 112 may be referred to as floating gate (FG) sidewall spacers 220.

Figure 11:
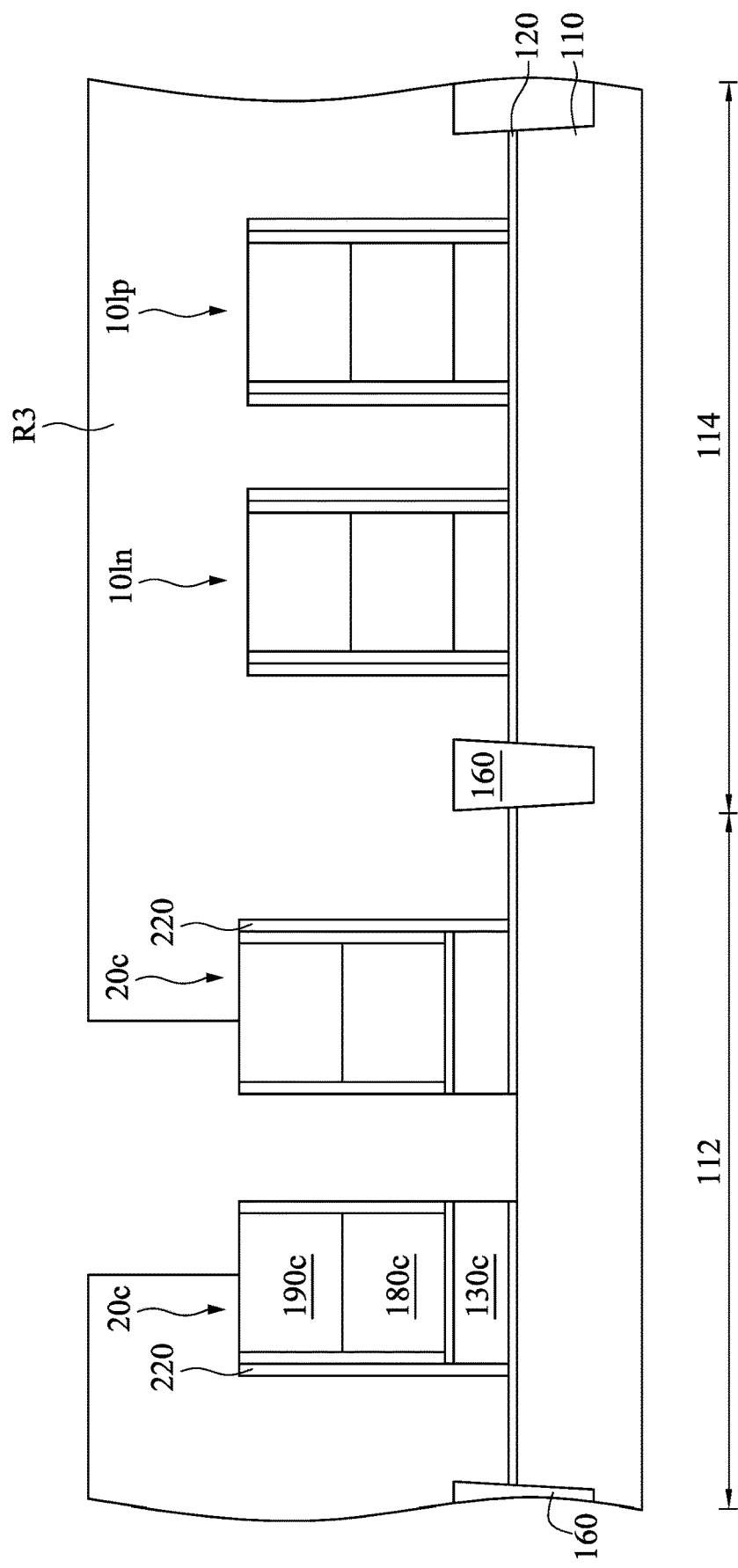

Reference is made to FIG. 11. The second spacer structures 220 between adjacent two gate stacks 20c are removed. For example, a mask layer (such as a BARC) R3 is formed to cover the structure of FIG. 10. The mask layer R3 is then patterned to expose the space between the gate stacks 20c. The exposed second spacer structures 220 are then removed. Then, a portion of the gate dielectric layer 120 exposed by the mask layer R3 is removed to expose the substrate 110.

Figure 12:
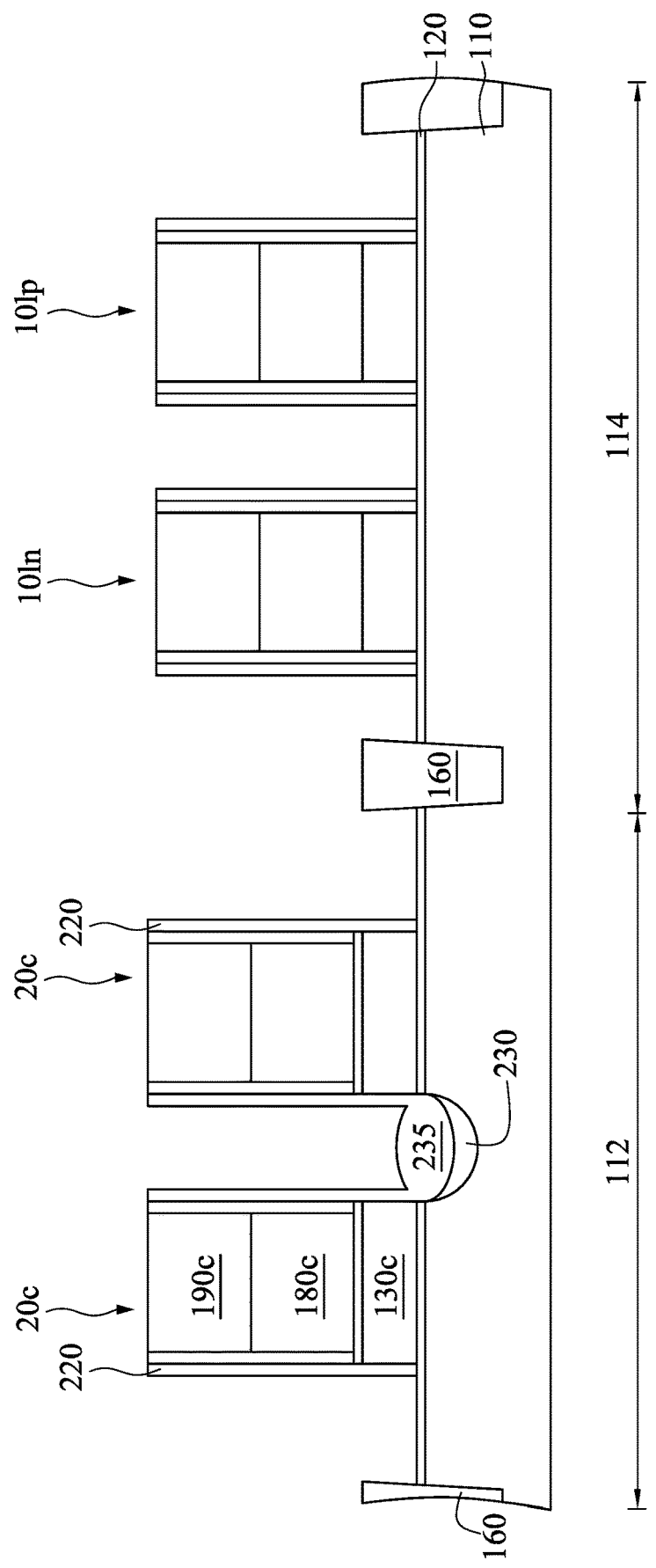

Reference is made to FIG. 12. The mask layer R3 in FIG. 11 is then removed, and the removal method may be performed by dry etching, for example. Source regions 230 are formed between two adjacent gate stacks 20c. For example, after the second spacer structures 220 are removed, ions are implanted into the areas to form the source regions 230. A common source (CS) dielectric layer 235 is formed over the source region 230. The CS dielectric layer 235 may be a dielectric isolation structure and may be formed by oxidizing the substrate 110, other suitable processes, combinations thereof, or the like.

Figure 13:
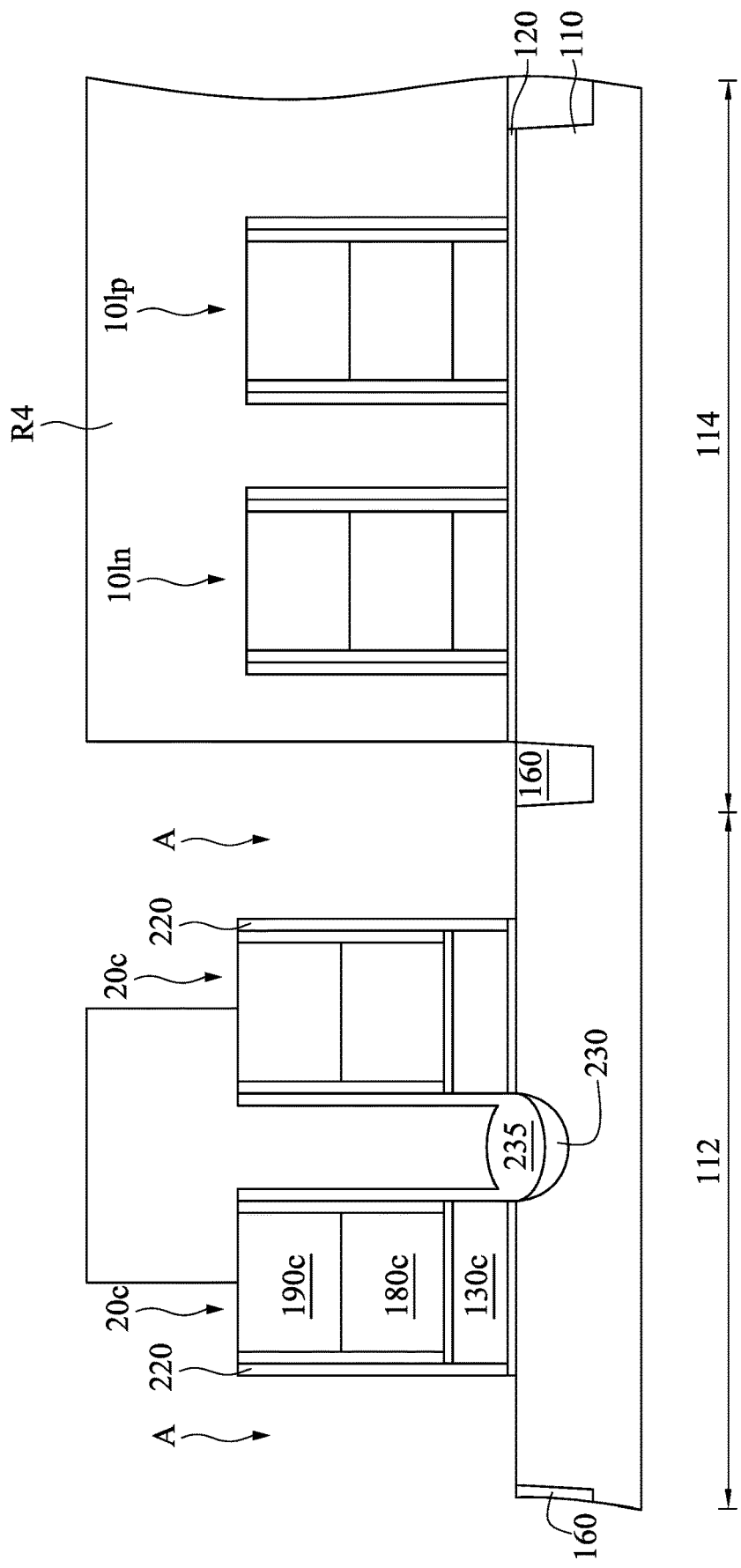

Reference is made to FIG. 13. Portions of the gate dielectric layer 120 over the cell region 112 are removed. For example, a mask layer (such as a BARC) R4 is formed to cover the structure of FIG. 12. The mask layer R4 is then patterned to expose the areas A. The exposed portions of the gate dielectric layer 120 are then removed. In this process, top portions of the isolation features 160 are also removed, such that top surfaces of the isolation features 160 are at a level close to the top surface of the gate dielectric layer 120.

Figure 14:
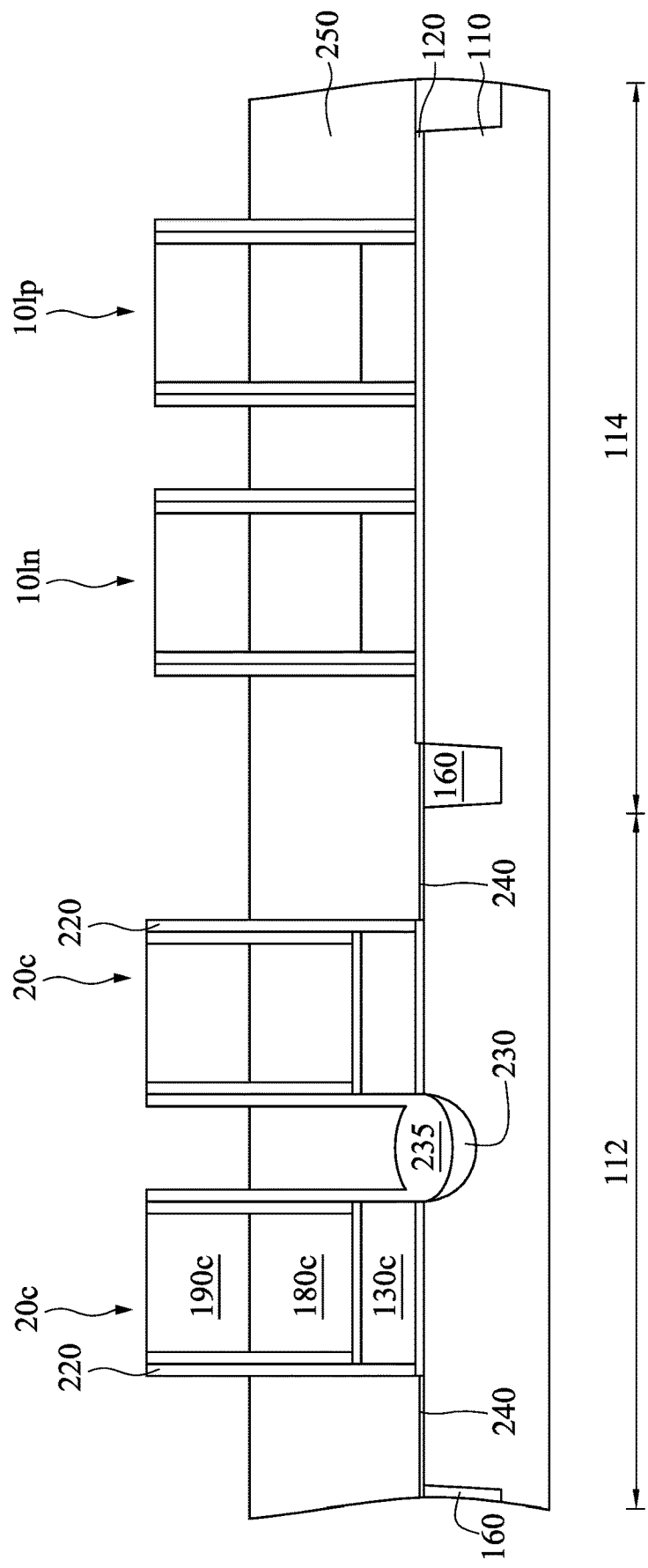

Reference is made to FIG. 14. A gate dielectric layer 240 is formed on the exposed portion of the substrate 110. The gate dielectric layer 240 may be a thermal oxide or other suitable material. The mask layer R4 in FIG. 13 is then removed, and the removal method may be performed by dry etching, for example. Then, a conductive layer 250 is formed on opposite sides of the gate stacks 20c, 101n, and 101p. For example, a blanket conductive layer is deposited over the substrate 110, and the blanket conductive layer is patterned or etched back to form the conductive layer 250. In some embodiments, the conductive layer 250 may include polysilicon formed through, for example low pressure CVD (LPCVD) methods, CVD methods and PVD sputtering methods employing suitable silicon source materials. If desired, the conductive layer 250 may be ion implanted to the desired conductive type.

Figure 15:
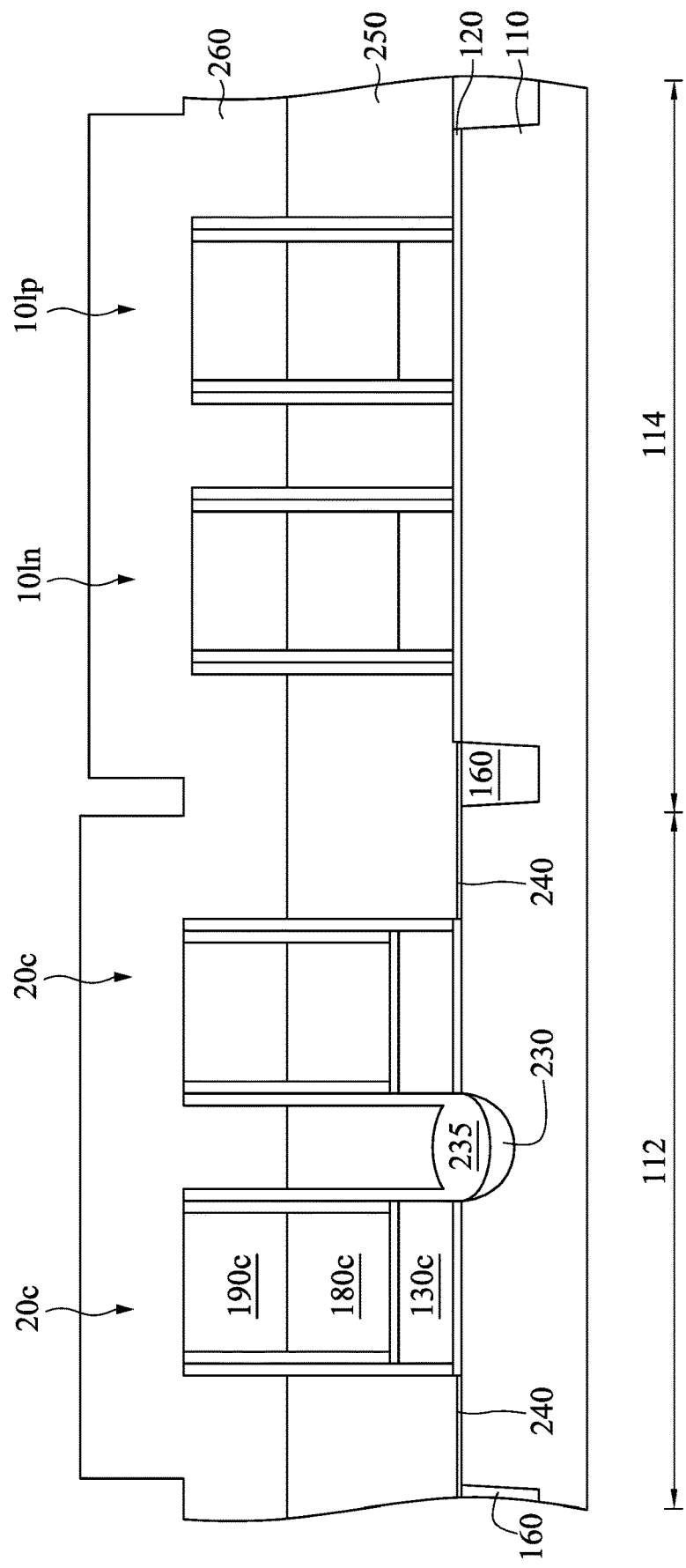

Reference is made to FIG. 15. Then, a hard mask layer 260 is formed over the conductive layer 250. That is, the hard mask layer 260 is conformally deposited over the structure of FIG. 14. In some embodiments, the hard mask layer 260 is made of a dielectric layer (e.g., SiN or other suitable materials).

Figure 16:
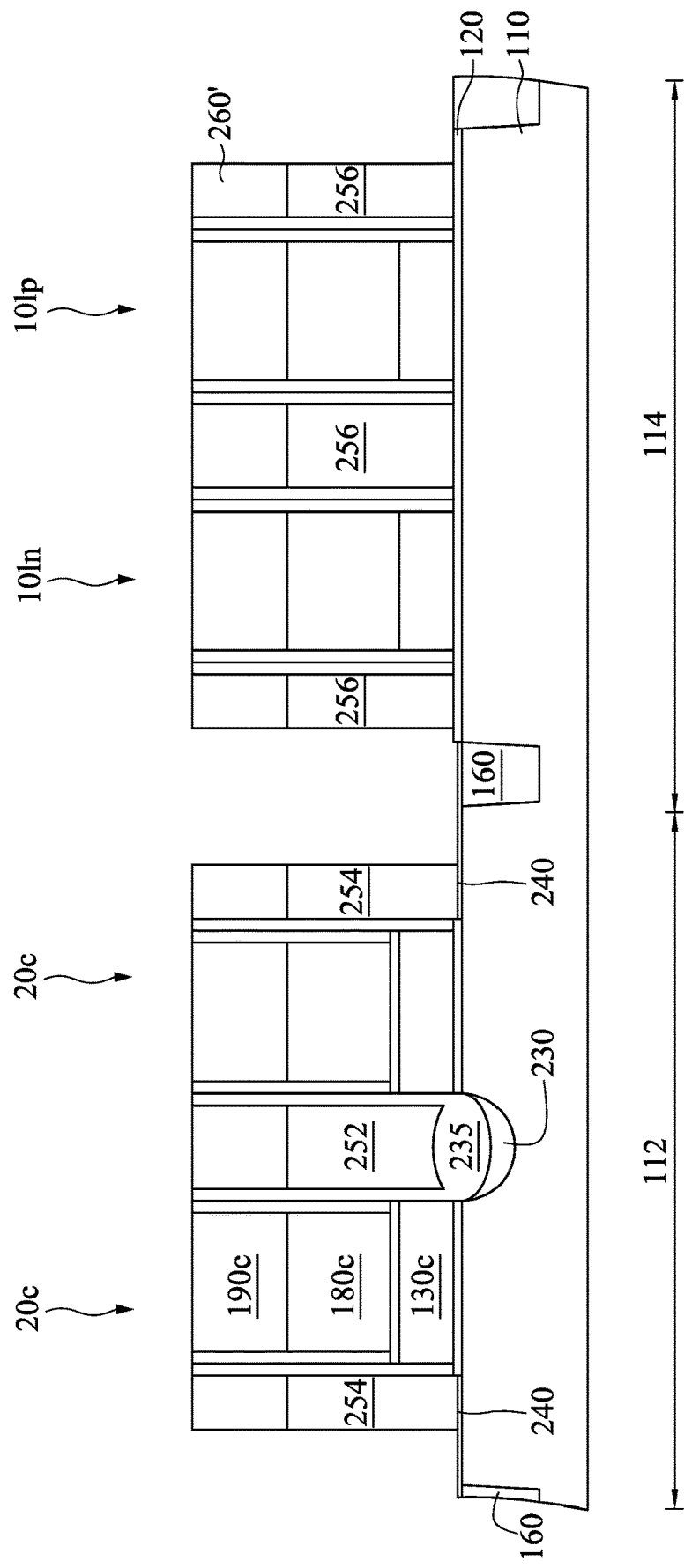

Reference is made to FIG. 16. The hard mask layer 260 is etched back until a top surface of the hard mask layer 260 is substantially level with top surfaces of the gate stacks 20c, 101n, and 101p. Then, a patterning process is performed on the hard mask layer 260 and the conductive layer 250 to form a plurality of erase gate 252, select gates (or word lines) 254, and dummy structures 256. The erase gate 252 is formed between the two gate stacks 20c, the gate stack 20c is disposed between the erase gate 252 and the select gate 254, and the dummy structures 256 are formed on sides of the gate stacks 101n and 101p. The patterned hard masks 260' are respectively formed on the erase gate 252, the select gates 254, and the dummy structures 256.

Figure 17:
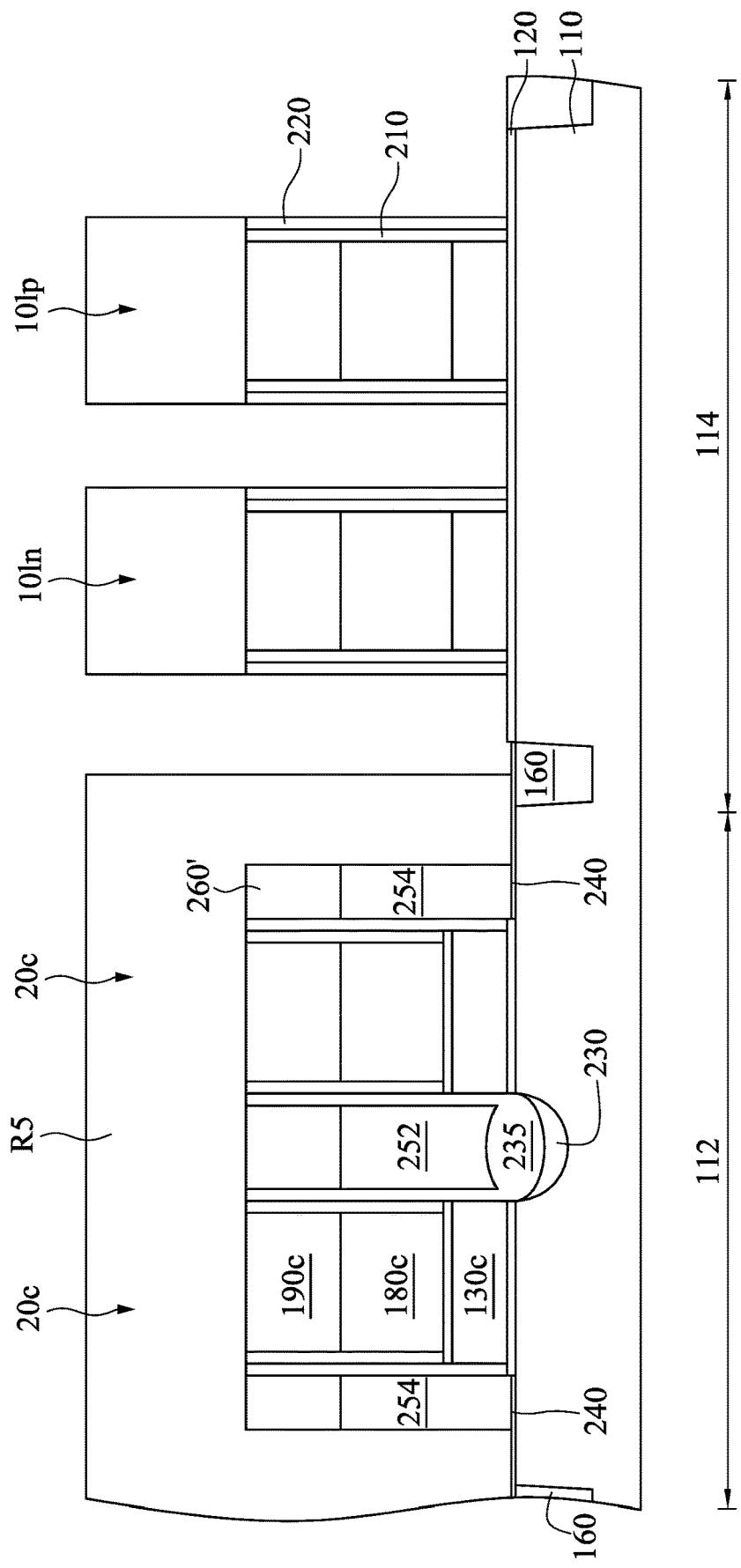

Reference is made to FIG. 17. The dummy structures 256 of FIG. 16 and the hard masks 260' formed thereon are removed. For example, another mask layer (such as a BARC) R5 is formed to cover the structure of FIG. 16. The mask layer R5 is then patterned to expose the dummy structures 256 and the corresponding hard masks 260'. The exposed dummy structures 256 and the hard masks 260' are then removed.

Figure 18:
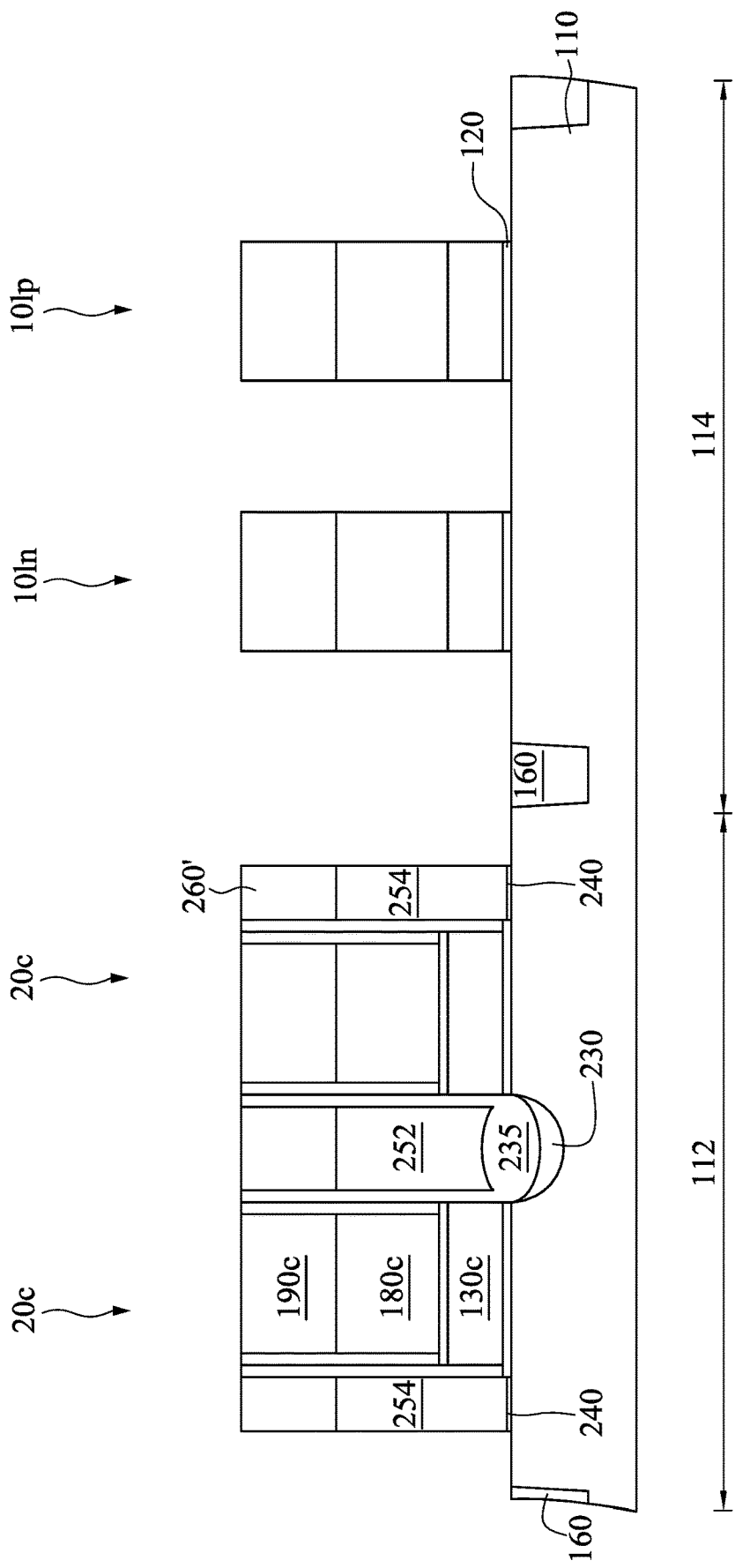

Reference is made to FIG. 18. The first spacer structures 210 and second spacer structures 220 (see FIG. 17) on sidewalls of the gate stacks 101n and 101p are removed. Further, portions of the gate dielectric layer 120 exposed by the gate stacks 101n and 101p and portions of the gate dielectric layer 240 exposed by the select gates 254 are removed. Also, the isolation features 160 are partially removed in this process.

Figure 19:
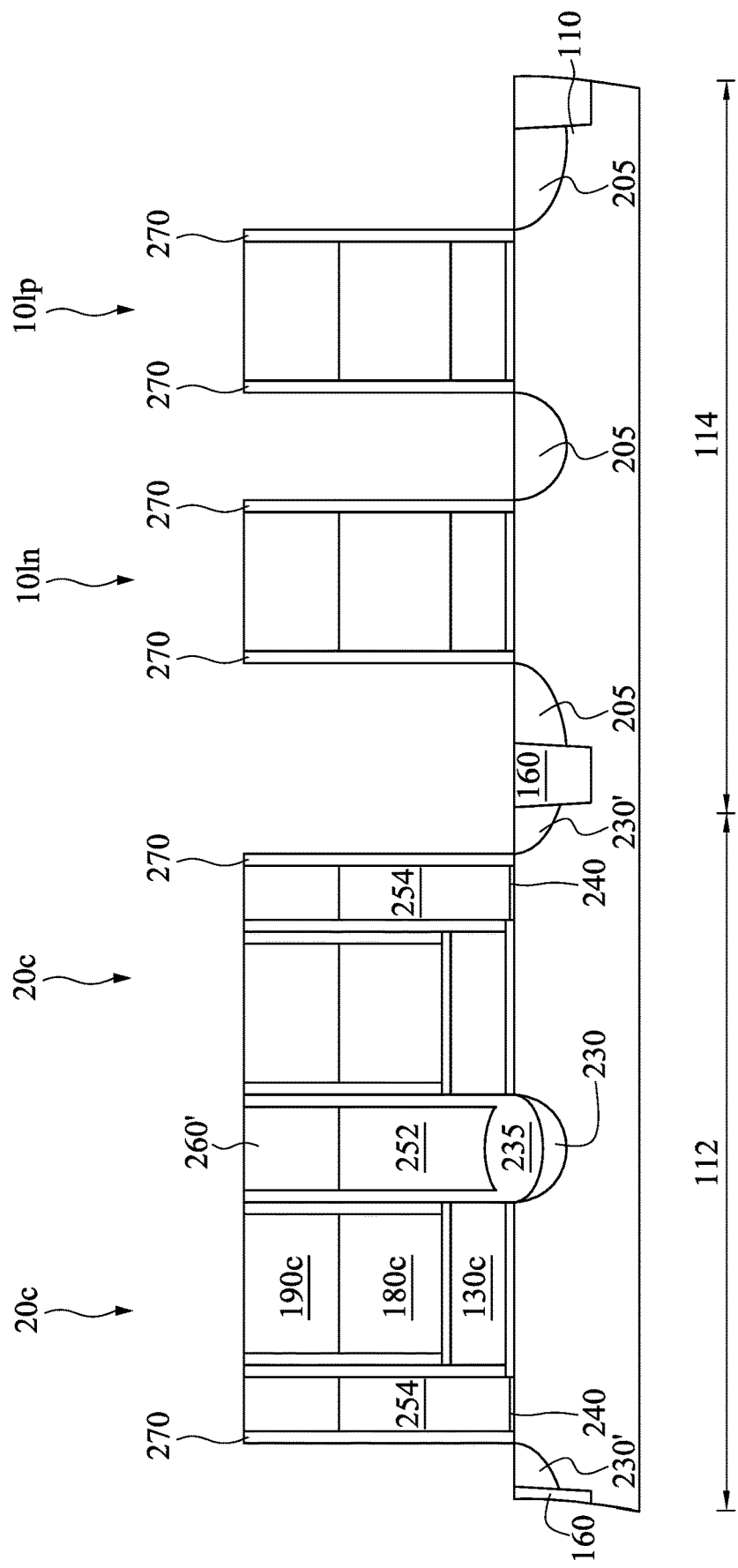

Reference is made to FIG. 19. Third spacer structures 270 are formed on sidewalls of the select gates 254, and the gate stacks 101n and 101p. In some embodiments, the third spacer structures 270 may include a dielectric material such as silicon dioxide ($SiO_2$), silicon nitride ($Si_3N_4$), oxynitrides (SiON), combinations thereof, or the like. In some embodiments, a dielectric film may be conformally formed over the structure of FIG. 18, and an etching process is performed to remove the horizontal portions of the dielectric film to form the third spacer structures 270. In some embodiments, the third spacer structures 270 may be referred to as main sidewall spacers 270. Subsequently, drain regions 230' are formed in the cell region 112 of the substrate 110 and adjacent to the gate stacks 20c, and source/drain regions 205 are formed in the logic region 114 of the substrate and adjacent to the gate stacks 101n and 101p. For example, after the third spacer structures 270 are formed, ions are implanted into the substrate 110 to form the drain regions 230' and the source/drain regions 205.

Figure 20:
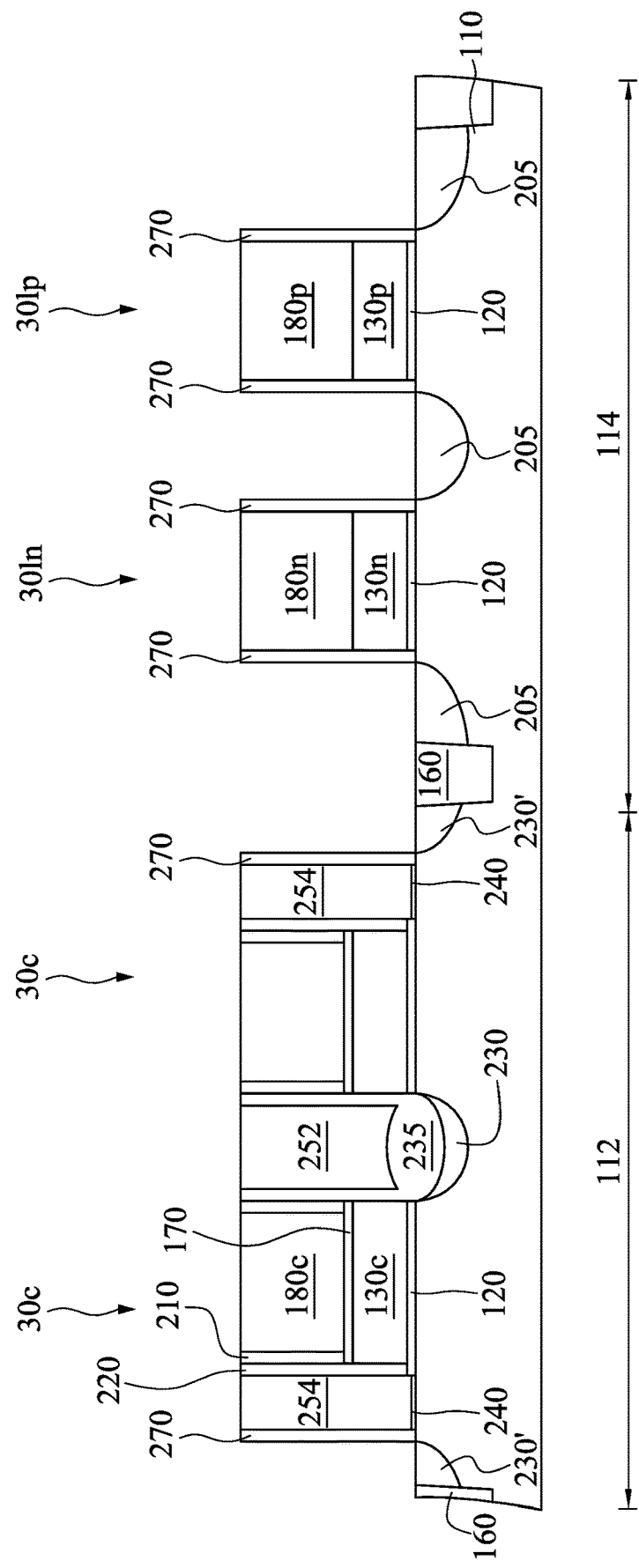

Reference is made to FIG. 20. The hard masks 190c, 190n, 190p, and 260' are removed, also, the top portions of the first, second, and third spacer structures 210, 220, and 270, and the top portions of the CS dielectric layer 235 are also removed. For example, an etch back process is performed on the structure of the FIG. 19 to remove the hard masks 190c, 190n, 190p, and 260' and the top portions of the first, second, and third spacer structures 210, 220, and 270, and the top portions of the CS dielectric layer 235. After the removal process, gate stacks 30c, 301n, and 301p are formed over the substrate 110. Specifically, the gate stack 30c includes the gate dielectric layers 120 and 170, the floating gate 130c, the control gate 180c, and the first and second spacer structures 210 and 220; the gate stack 301n includes the gate dielectric layer 120, the first dummy gate 130n, the second dummy gate 180n, and the third spacer structures 270; the gate stack 301p includes the gate dielectric layer 120, the first dummy gate 130p, the second dummy gate 180p, and the third spacer structures 270.

Figure 21:
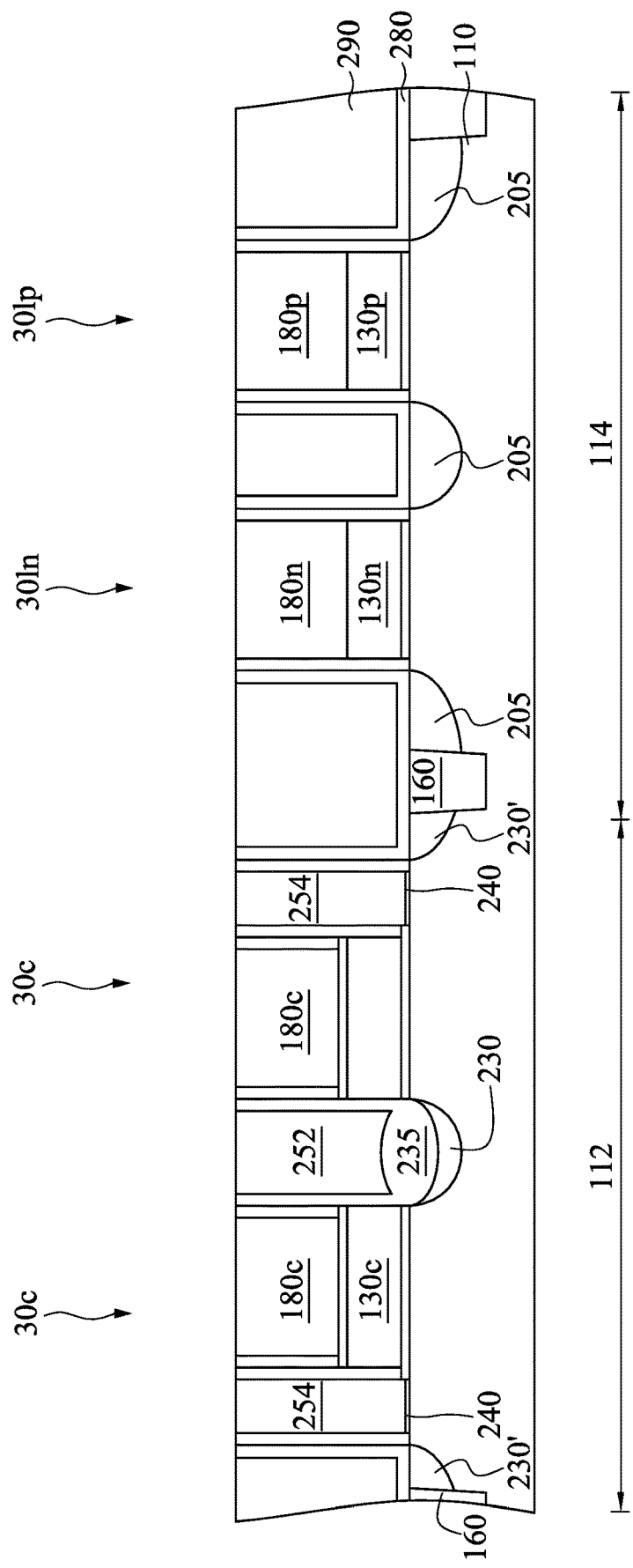

Reference is made to FIG. 21. A contact etching stop layer (CESL) 280 is conformally formed over the structure of FIG. 20, and an interlayer dielectric (ILD) 290 is formed over the etching stop layer 280. Then, a chemical mechanical polish (CMP) process is performed to level the top surface of the ILD 290 with the top surfaces of the gate stacks 30c, 301n, and 301p. In some embodiments, the CESL 280 is a stressed layer or layers. In some embodiments, the CESL 280 has a tensile stress and is formed of $Si_3N_4$. In some other embodiments, the CESL 280 includes materials such as oxynitrides. In yet some other embodiments, the CESL 280 may have a composite structure including a plurality of layers, such as a silicon nitride layer overlying a silicon oxide layer. The CESL 280 can be formed using plasma enhanced CVD (PECVD), however, other suitable methods, such as low pressure CVD (LPCVD), atomic layer deposition (ALD), and the like, can also be used. The ILD 290 may be formed by chemical vapor deposition (CVD), high-density plasma CVD, spin-on, sputtering, or other suitable methods. In some embodiments, the ILD 290 includes silicon oxide. In some other embodiments, the ILD 290 may include silicon oxy-nitride, silicon nitride, a low-k material, or the like.

Figure 22:
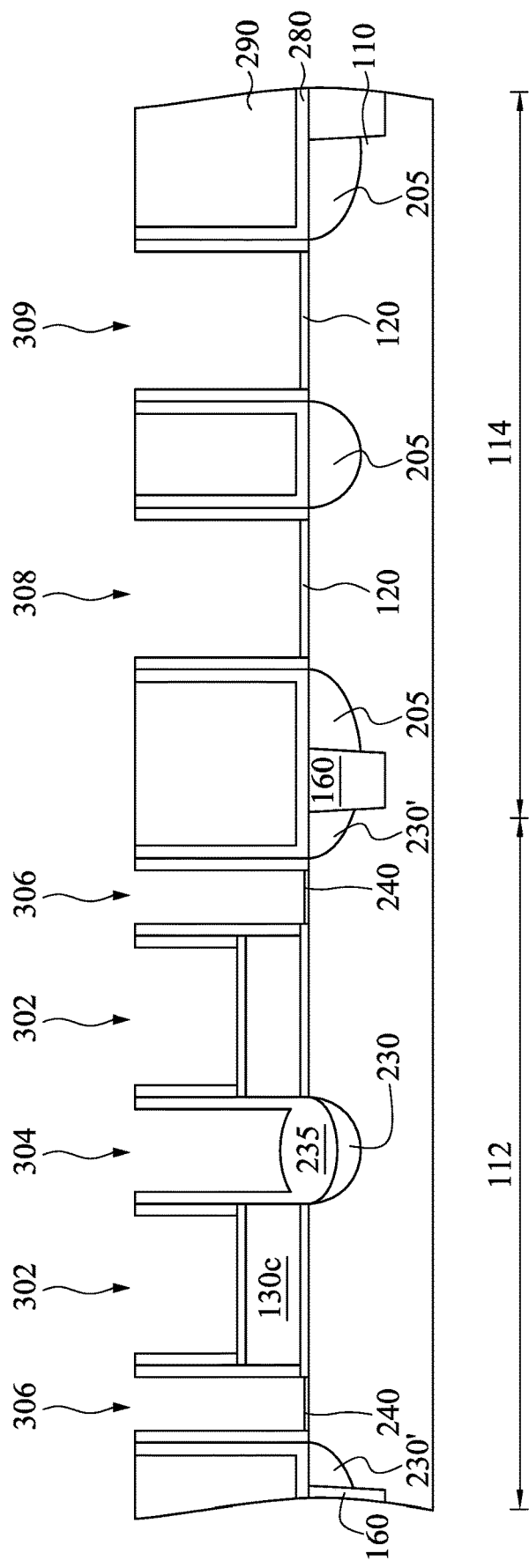

Reference is made to FIG. 22. A replacement gate (RPG) process scheme is employed. In a RPG process scheme, a dummy polysilicon gate (the control gates 180c, the erase gate 252, the select gates 254, and the gate stacks 301n, 301p in this case) is formed and is replaced later by a metal gate stack after high thermal budget processes are performed. In some embodiments, the control gates 180c (dummy control gate, see FIG. 21) are removed to form first openings 302, the erase gate 252 (dummy erase gate, see FIG. 21) is removed to form a second opening 304, the select gates 254 (dummy select gate, see FIG. 21) are removed to form third openings 306, the gate stack 301n (dummy gate, see FIG. 21) is removed to form a fourth opening 308, and the gate stack 301p (dummy gate, see FIG. 21) is removed to form a fifth opening 309. The control gates 180c, the erase gate 252, the select gates 254, and the gate stacks 301n, 301p may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 23:
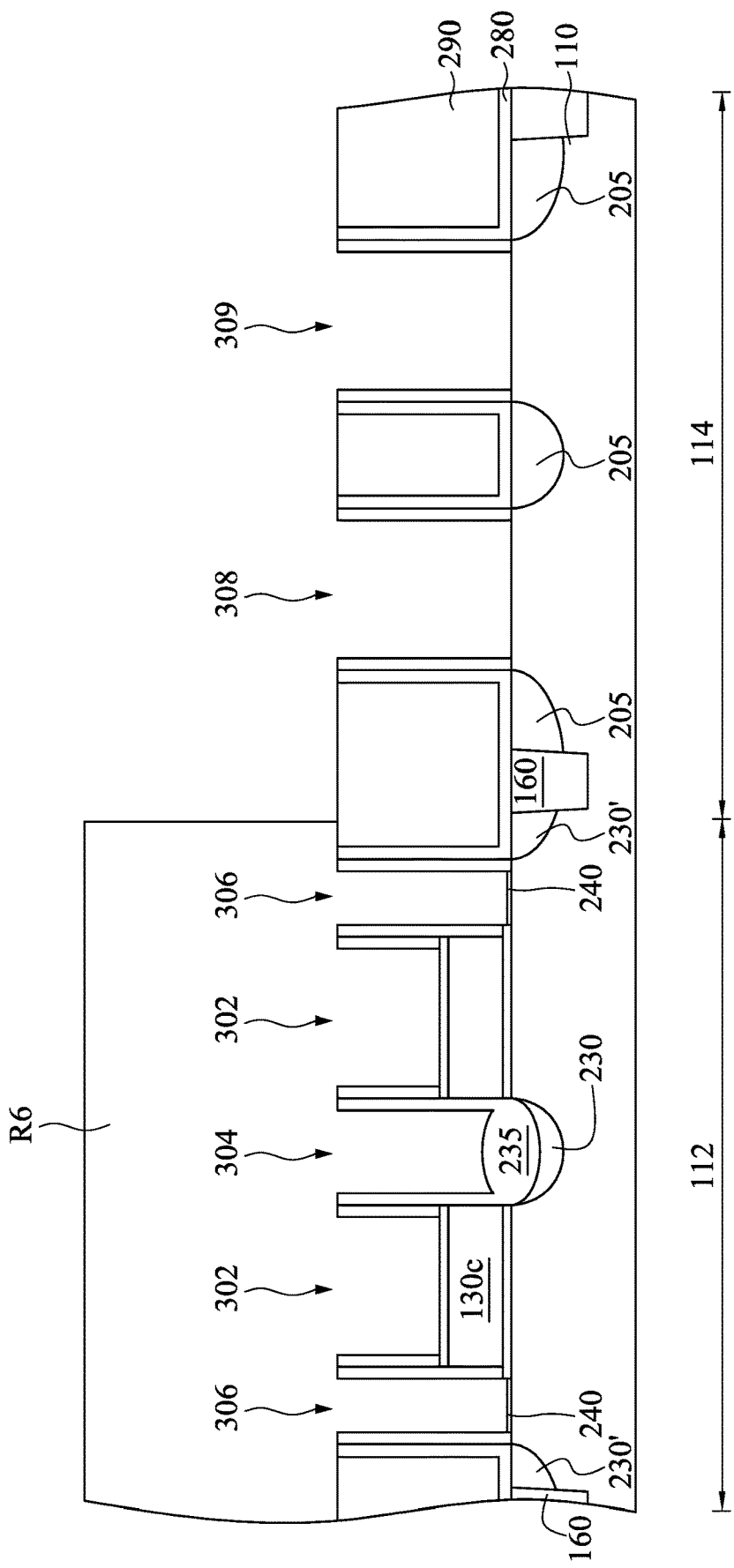

Reference is made to FIG. 23. The gate dielectric layers 120 respectively in the openings 308 and 309 are removed.

For example, another mask layer (such as a BARC) R6 is formed to cover the structure of FIG. 21. The mask layer R6 is then patterned to expose the openings 308 and 309. The gate dielectric layers 120 respectively in the openings 308 and 309 are then removed.

Figure 24:
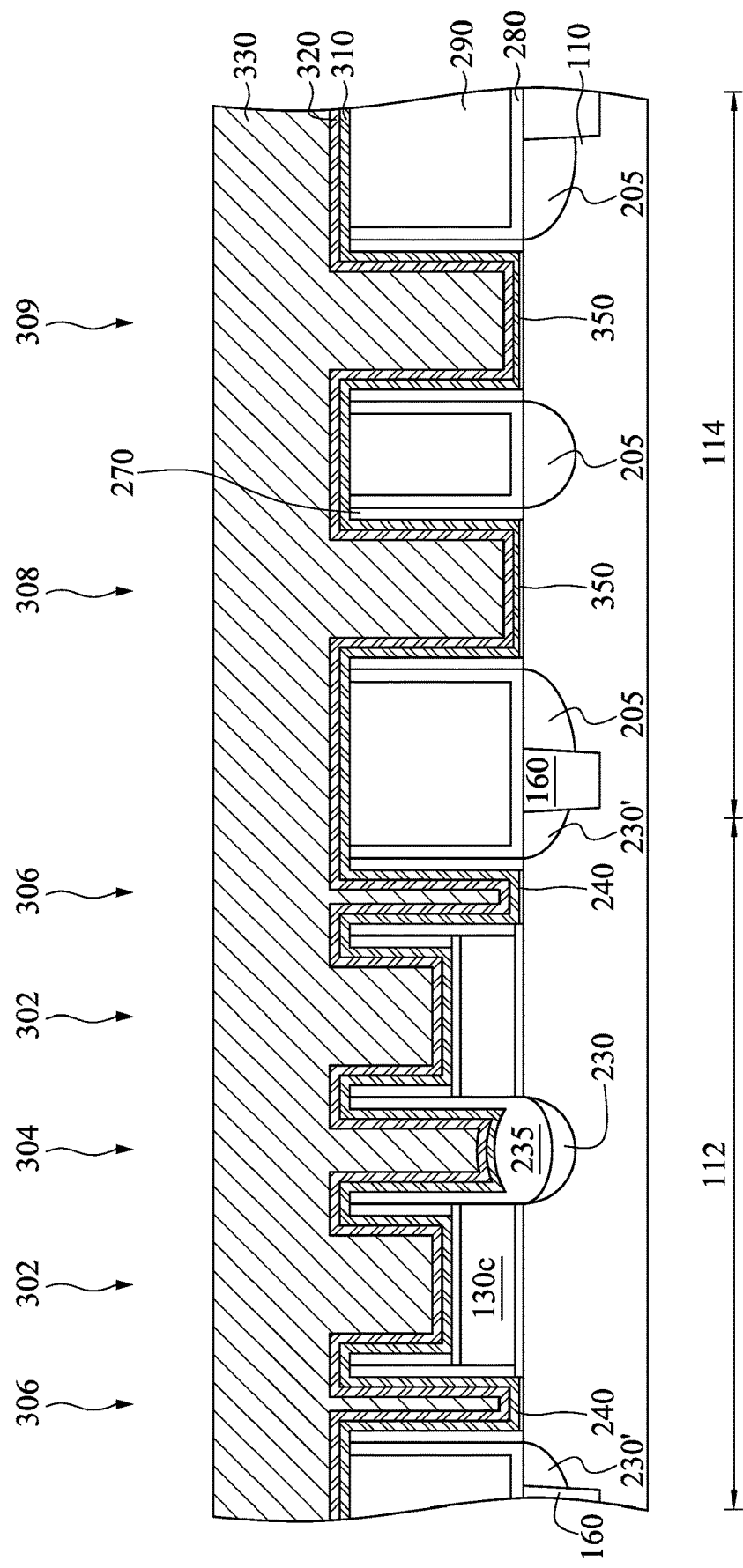

Reference is made to FIG. 24. The mask layer R6 in FIG. 23 is removed, and the removal method may be performed by dry etching, for example. Then, interlayer dielectrics 350 are respectively formed in the openings 308 and 309. In some embodiments, the interlayer dielectrics 350 are thermal oxide layers, such that they are formed on the substrate 110 but not on the third spacer structures 270. Then, a high dielectric constant (high-κ) dielectric layer 310 is conformally formed in the openings 302, 304, 306, 308, and 309 and over the ILD 290. In some embodiments, the high-κ dielectric layer 310 may have a dielectric constant (κ) higher than the dielectric constant of $SiO_2$, i.e. κ>3.9. The high-κ dielectric layer 310 may include doped $HfO_2$, lead zirconate titanate (PZT), LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The high-κ dielectric layer 310 is deposited by suitable techniques, such as thermal-ALD, PEALD, CVD, PVD, thermal oxidation, combinations thereof, or other suitable techniques. In some embodiments, the high-κ dielectric layer 310 is formed using $HfCl_4$, TDMA-Hf, or TEMA-HF as a precursor and using $O_3$, $H_2O$, or $O_2$ as oxidant.

A barrier layer 320 is conformally formed over the high-κ dielectric layer 310. The barrier layer 320 may include metals and their nitrides (e.g. TiN, TaN, $W_2N$, TiSiN, TaSiN) or other materials such as Pt, Au, W, or combinations thereof. The barrier layer 320 may be deposited by PVD, CVD, Metal-organic chemical vapor deposition (MOCVD) and ALD.

A P-type work function metal layer 330 is formed on the barrier layer 320 and fills the openings 302, 304, 306, 308, and 309. In some embodiments, the P-type work function metal layer 330 may include a single layer or multi layers. In various embodiments, the P-type work function metal layer 330 may include a work function that is greater than about 4.8 eV. The P-type work function metal layer 330 may include Ti, TiAl, TiAlN, TaC, TaCN, TaSiN, Mn, Zr, TiN, TaN, Ru, Mo, WN, Co, Al, or any suitable materials. The P-type work function metal layer 330 may be formed by ALD, PVD, CVD, or other suitable process.

Figure 25:
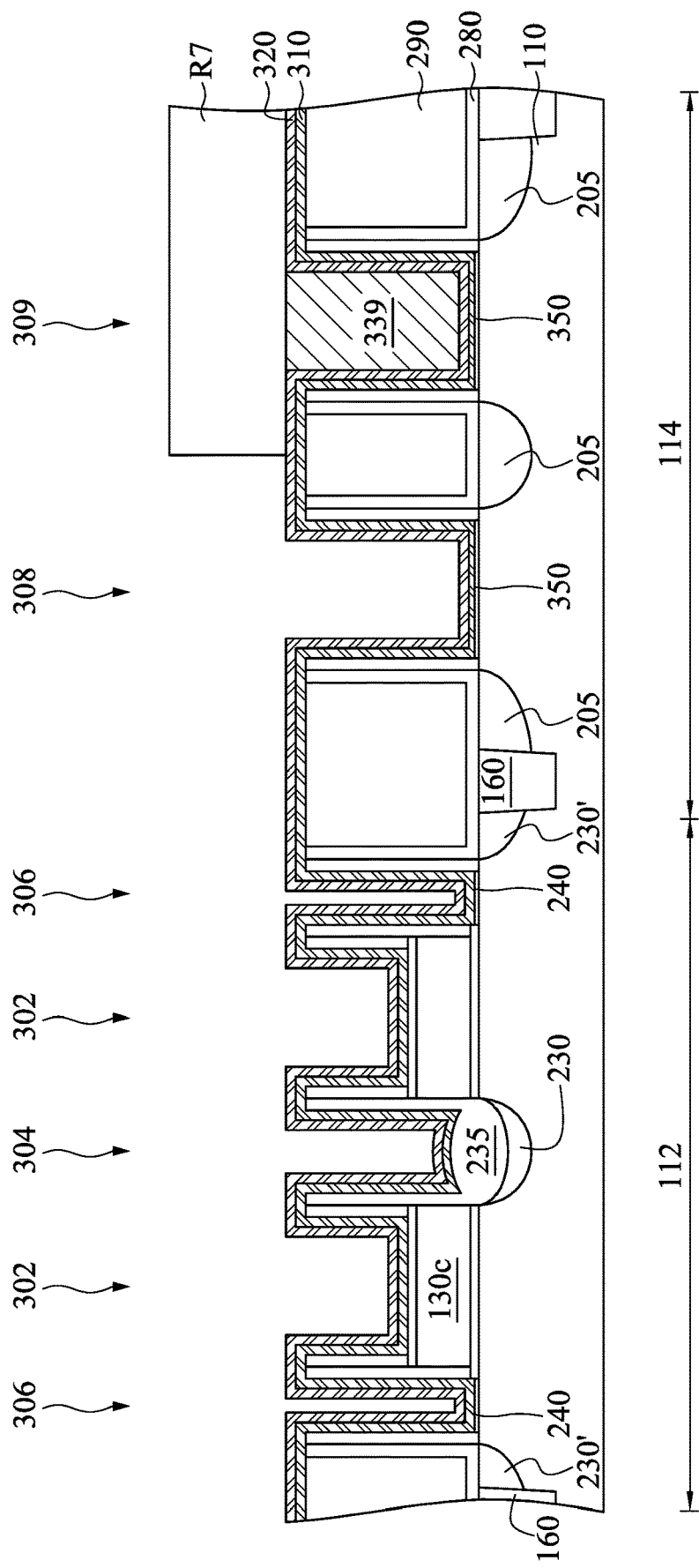

Reference is made to FIG. 25. Portions of the P-type work function metal layer 330 in the openings 302, 304, 306, and 308 are removed. For example, a planarization process (such as a CMP process) may be performed on the P-type work function metal layer 330 until a top surface of the P-type work function metal layer 330 is level with a top surface of the barrier layer 320. Then, another mask layer (such as a BARC) R7 is formed to cover the planarized structure. The mask layer R7 is then patterned to expose the openings 302, 304, 306, and 308. The portions of the P-type work function metal layer 330 in the openings 302, 304, 306, and 308 are then removed, and the portion of the P-type work function metal layer 330 in the opening 309 is referred to as the P-type work function metal layer 339.

Figure 26:
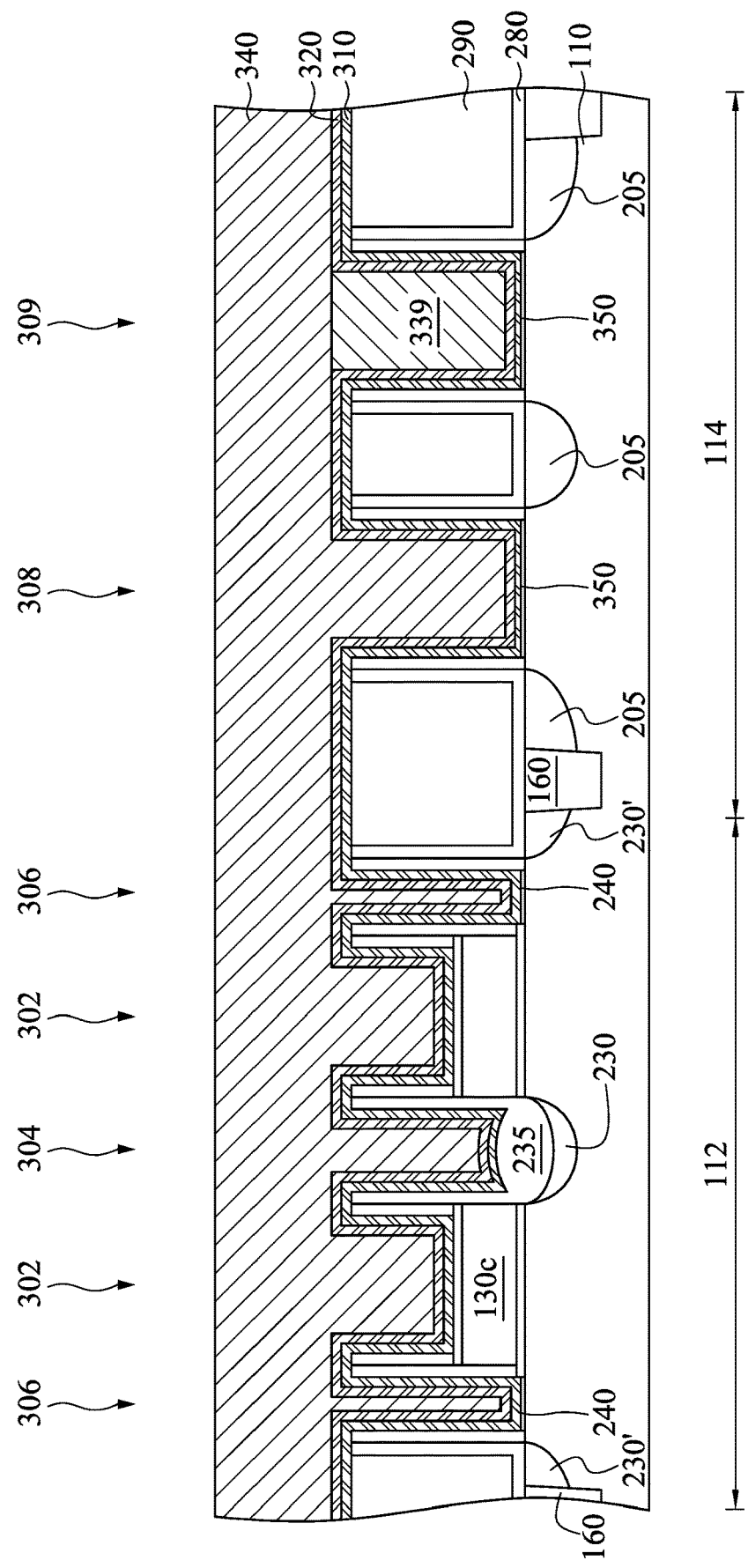

Reference is made to FIG. 26. The mask layer R7 in FIG. 25 is removed, and the removal method may be performed by dry etching, for example. Then, an N-type work function metal layer 340 is formed on the barrier layer 320 and the P-type work function metal layer 339 and fills the openings 302, 304, 306, and 308. The N-type work function metal layer 340 may include various metals that have a work function that is less than about 4.33 eV. In some embodiment, the N-type work function metal layer 340 may include Ta. Alternatively, some other examples of N-metals may include (but are not limited to) Zn, Ti, Nb, Al, Ag, Mn, Zr, Hf, and La. The N-type work function metal layer 340 may be formed by various deposition techniques such as physical vapor deposition (PVD or sputtering), CVD, ALD, plating, or other suitable technique.

Figure 27A:
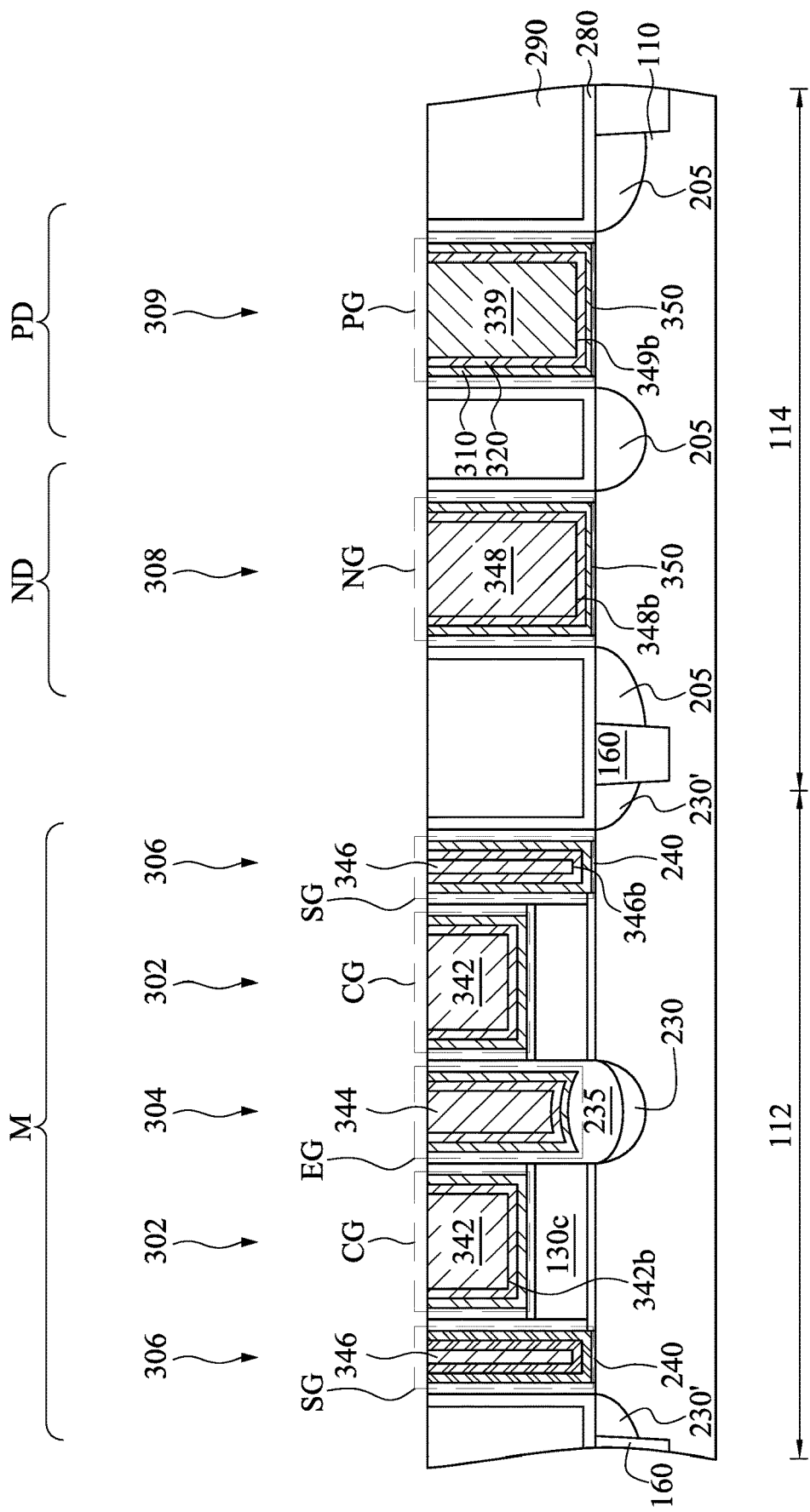
Figure 27B:
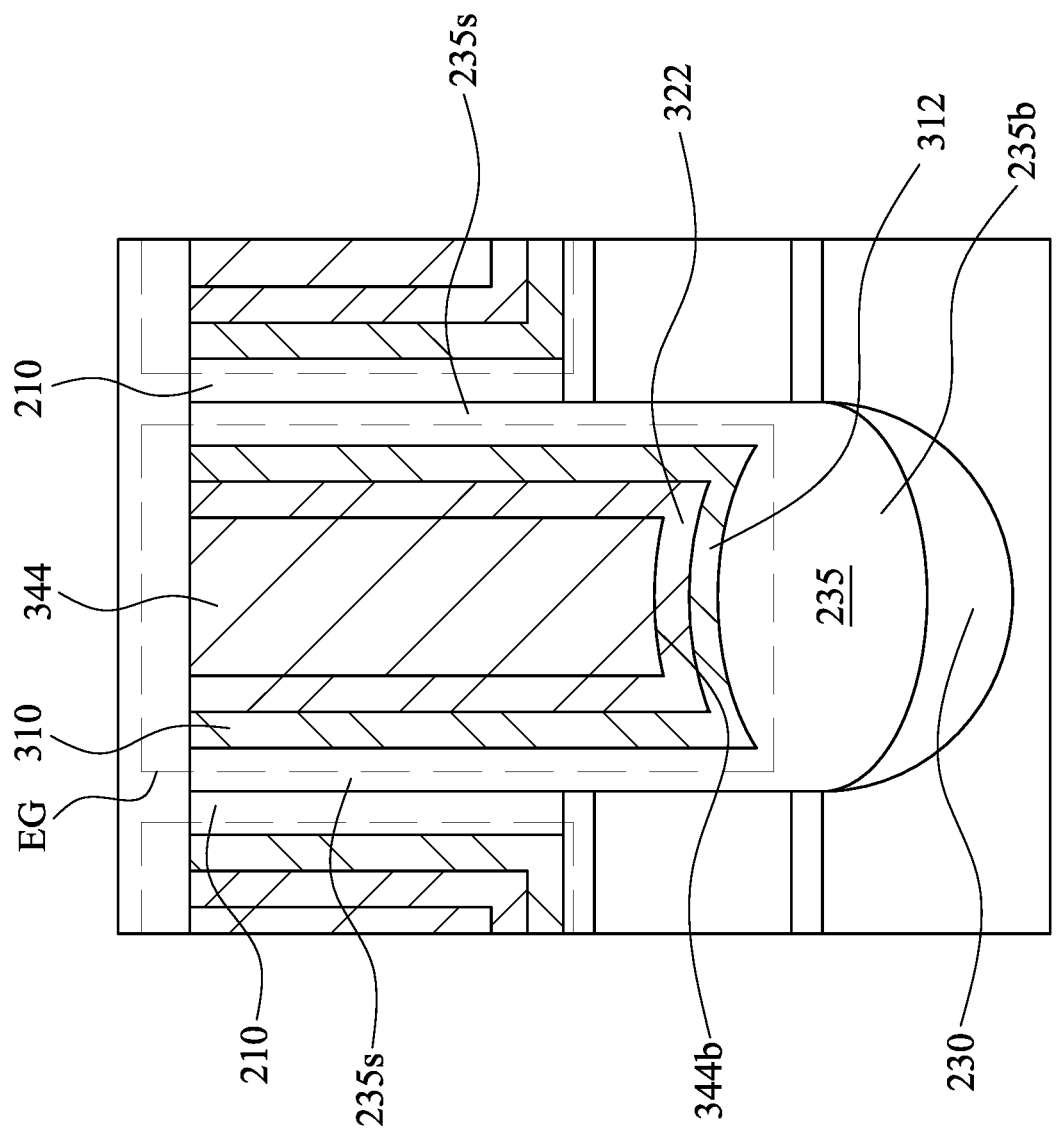
FIG. 27B is an enlarged view of an area around an erase gate in FIG. 27A.

Reference is made to FIGS. 27A, and 27B, where FIG. 27B is an enlarged view of an area around the erase gate EG in FIG. 27A. Another planarization process (such as a CMP process) may be performed on the N-type work function metal layer 340 until a top surface of the N-type work function metal layer 340 is level with a top surface of the ILD 290. In this process, portions of the high-κ dielectric layer 310, the barrier layer 320, and the P-type work function metal layer 339 are also removed, such that a top surface of the high-κ dielectric layer 310, a top surface of the barrier layer 320, and a top surface of the P-type work function metal layer 339 are level with the top surface of the N-type work function metal layer 340 and the top surface of the ILD 290. The remaining portions of the N-type work function metal layer 340 in the openings 302 are referred to as N-type work function metal layers 342, the remaining portion of the N-type work function metal layer 340 in the opening 304 is referred to as an N-type work function metal layer 344, the remaining portions of the N-type work function metal layer 340 in the openings 306 are referred to as N-type work function metal layer 346, and the remaining portion of the N-type work function metal layer 340 in the opening 308 is referred to as an N-type work function metal layer 348.

In FIG. 27A, the high-κ dielectric layer 310, the barrier layer 320, and the N-type work function metal layer 342 in the opening 302 form a control gate stack CG, the high-κ dielectric layer 310, the barrier layer 320, and the N-type work function metal layer 344 in the opening 304 form an erase gate stack EG, the high-κ dielectric layer 310, the barrier layer 320, and the N-type work function metal layer 346 in the opening 306 form a select gate stack SG, the high-κ dielectric layer 310, the barrier layer 320, and the N-type work function metal layer 348 in the opening 308 form an N-type gate stack NG, and the high-κ dielectric layer 310, the barrier layer 320, and the P-type work function metal layer 339 in the opening 309 form a P-type gate stack PG. That is, all of the control gate stack CG, the erase gate stack EG, the select gate stack SG, the N-type gate stack NG, and the P-type gate stack PG are metal gate stacks.

In FIG. 27B, the erase gate stack EG is in contact with the CS dielectric layer 235. The CS dielectric layer 235 includes sidewall portions 235s and a bottom portion 235b. The sidewall portions 235s are respectively in contact with the first spacer structures 210, and the bottom portion 235b is in contact with the source region 230. The high-κ dielectric layer 310 of the erase gate stack EG is in contact with both the sidewall portions 235s and the bottom portion 235b of the CS dielectric layer 235. A portion 312 of the high-κ dielectric layer 310 in contact with the bottom portion of the CS dielectric layer 235 is curved (upwardly), and a portion 322 of the barrier layer 320 in contact with the portion 312 of the high-κ dielectric layer 310 is also curved (upwardly). The N-type work function metal layer 344 has a curved bottom surface 344b. In contrast, in FIG. 27A, the N-type work function metal layer 342 has a flat bottom surface 342b, the N-type work function metal layer 346 has a flat bottom surface 346b, N-type work function metal layer 348 has a flat bottom surface 348*b*, and the P-type work function metal layer 339 has a flat bottom surface 339*b*.

Two control gates CG, one erase gate SG, two select gate SG, one source region 230, and two drain regions 230' form a memory cells M, which is formed over the cell region 112 of the substrate 110. Furthermore, the N-type gate stack NG and two source/drain regions 205 adjacent the N-type gate stack NG form an N-type device ND (e.g., an N-type transistor), and the P-type gate stack PG and two source/drain regions 205 adjacent the P-type gate stack PG form a P-type device PD (e.g., a P-type transistor). The N-type device ND and the P-type device PD are formed over the logic region 114 of the substrate 110.

It noted that although in this embodiment, the P-type gate (e.g., the P-type gate stack PG in this case) is formed before the N-type gates (e.g., the control gate CG, the erase gate EG, the select gate SG, and the N-type gate stack NG in this case), the N-type gate(s) may be formed before the P-type gate(s) in other embodiments.

According to some embodiments, since the erase gate of the memory cell is a metal gate stack, the capacitive coupling from the erase gate to the floating gate is increased. As such, the programming speed of the memory cell may be increased by using potentials at both the erase gate and the control gate. That is, the read and write operations of the memory cell is faster. For example, the programming speed may be reduced by about an order (e.g., from about 100 ms to about 20 ms). Moreover, since the control gate of the memory cell may be a metal gate stack, the capacitive coupling from the control gate to the floating gate is also increased, such that the control gate coupling ratio is improved. Furthermore, the replacement of the erase gate (also the control gate and/or the select gate) can be performed with the replacement of the gates of the transistors in the logic region, so the manufacturing time is not increased. The CMP process also align the heights of the control gate, the erase gate, the select gate, the N-type gate stack, and the P-type gate stack, such that the manufacturing complexity in the following processes is reduced. Also, since the high-κ dielectric layer is formed in the replacement process, which is referred to as a high-κ last process, the thermal budget problem is improved, and the electrical performance of the memory device can be improved.

Figure 28:
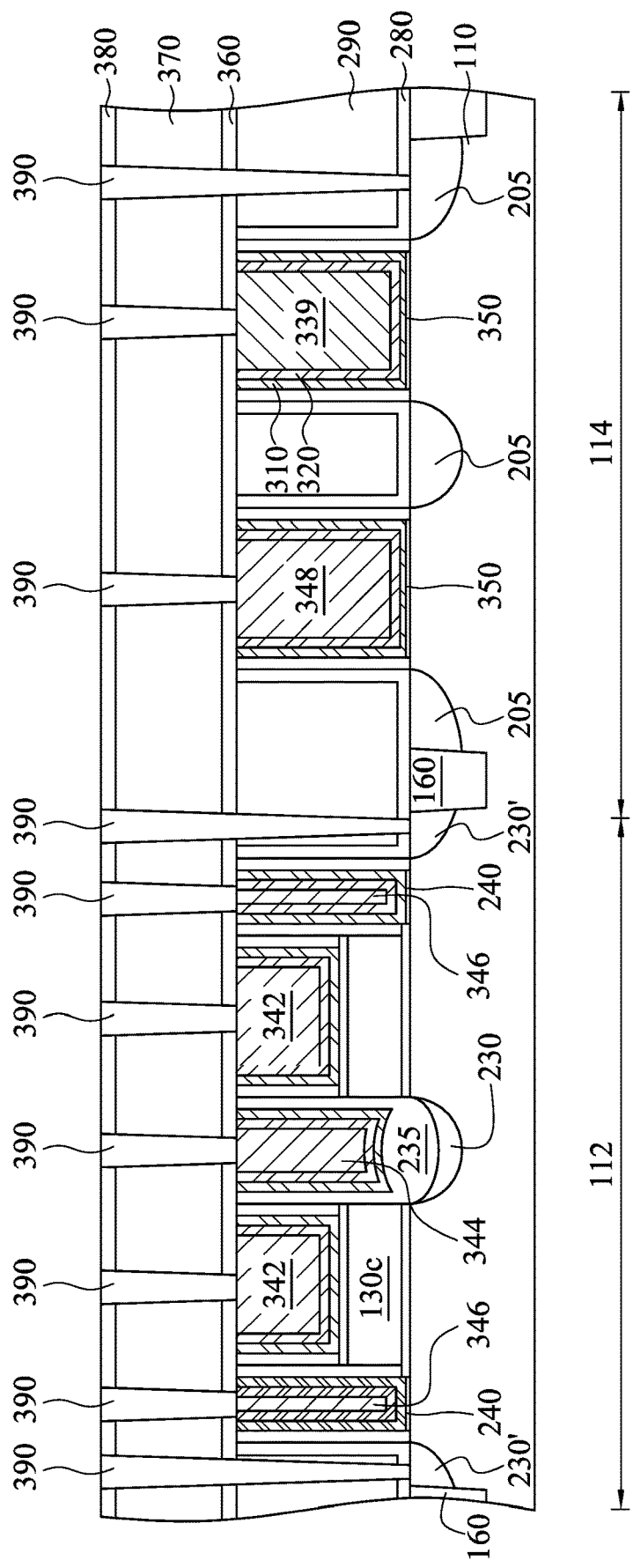

Reference is made to FIGS. 27A and 28. An etch stop layer (ESL) 360 is formed on the structure of FIG. 27A. In some embodiments, the etch stop layers provide a mechanism to stop an etching process when forming vias and/or contacts. The ESL 360 is formed of a dielectric material having a different etch selectivity from adjacent layers, e.g., the underlying ILD 290. In some embodiments, the ESL 360 may be formed of SiNx, SiCN, SiO$_2$, CN, AlOxNy, combinations thereof, or the like, deposited by CVD or PECVD techniques. Another ILD 370 is formed on the ESL 360. Since the formation of the ILD 370 is similar to that of the ILD 290 mentioned above, and thus a description thereof is omitted. Another ESL 380 is formed on the ILD 370. Since the formation of the ESL 380 is similar to that of the ESL 360 mentioned above, and thus a description thereof is omitted.

Then, a plurality of contacts 390 are formed in the ILD 370 and the ESLs 360 and 380. For example, a plurality of openings are formed in the ILD 370 and the ESLs 360 and 380 in advance. Then, a conductive material fills the openings, and a planarization process to remove the excess conductive material. As such, the contacts 390 are respectively formed in the openings. The contacts 390 are respectively connected to the drain regions 230', the select gates SG, the control gates CG, the erase gates EG, the N-type gate NG, the P-type gate PG, and the source/drain regions 205. It is noted that the configurations/locations of the contacts 390 in FIG. 28 are as an example, and should not limit the present disclosure.

Figure 29A:
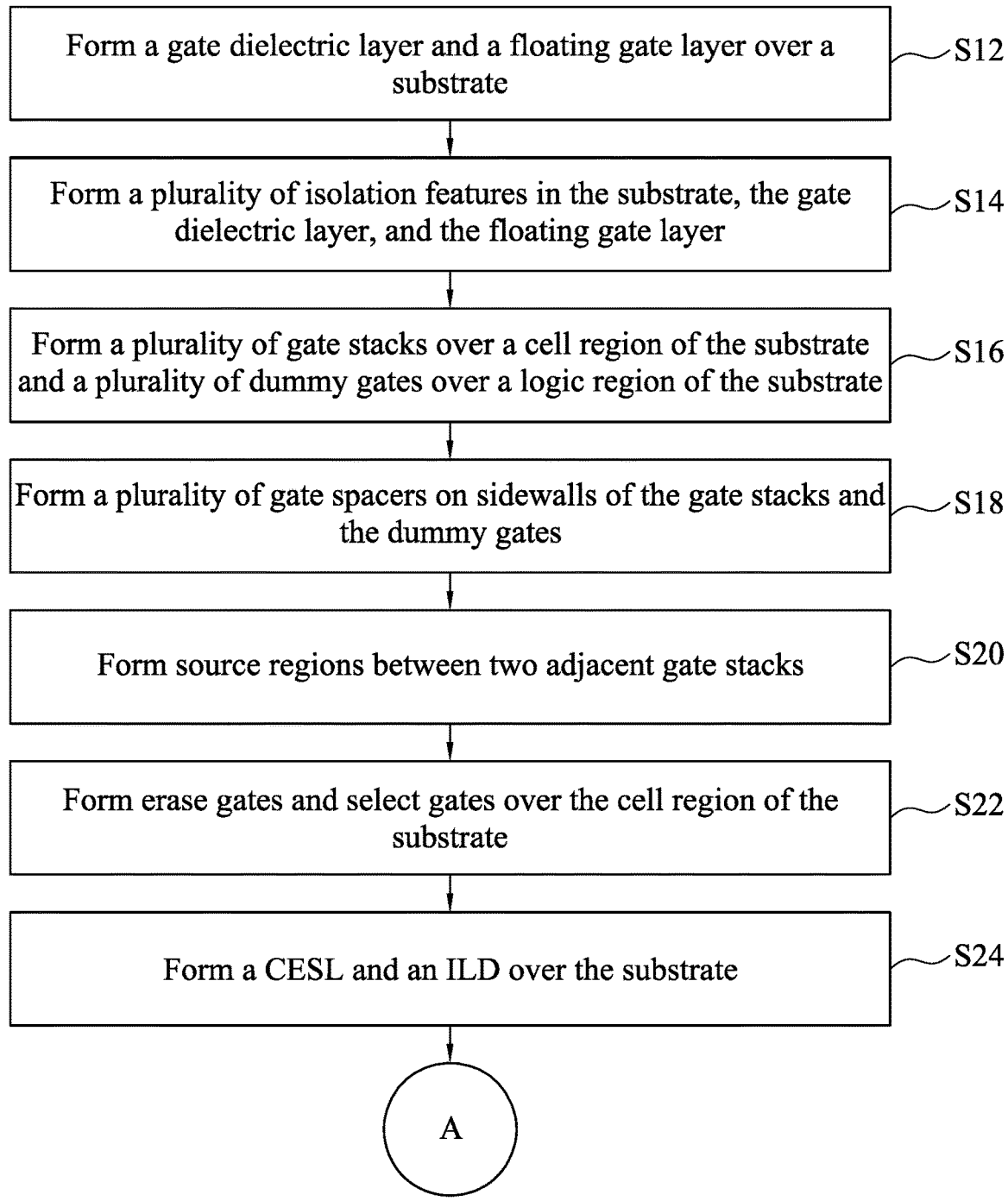
FIGS. 29A and 29B illustrate a method of forming a memory device in accordance with some embodiments.
Figure 29B:
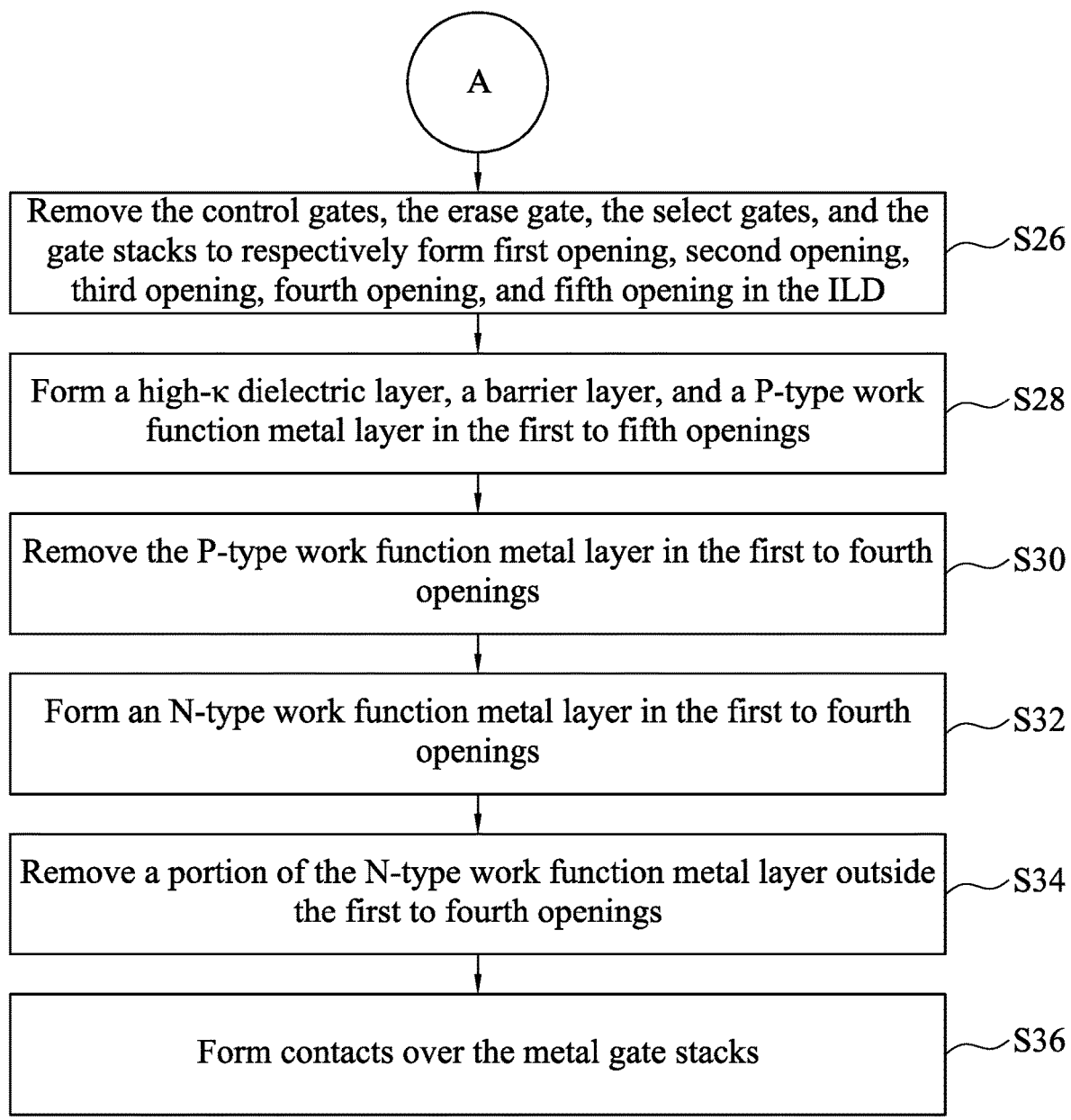

FIGS. 29A and 29B illustrate a method M1 of forming a memory device in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a gate dielectric layer and a floating gate layer are formed over a substrate. FIG. 1 illustrates a cross-sectional view of some embodiments corresponding to act in block S12. At block S14, a plurality of isolation features are formed in the substrate, the gate dielectric layer, and the floating gate layer. FIGS. 2 and 3 illustrate cross-sectional views of some embodiments corresponding to act in block S14. At block S16, a plurality of gate stacks are formed over a cell region of the substrate, and a plurality of dummy gates are formed over a logic region of the substrate. FIGS. 4-7 illustrate cross-sectional views of some embodiments corresponding to act in block S16. At block S18, a plurality of gate spacers are formed on sidewalls of the gate stacks and the dummy gates. FIGS. 8-10 illustrate cross-sectional views of some embodiments corresponding to act in block S18. At block S20, source regions are formed between two adjacent gate stacks. FIGS. 11-12 illustrate cross-sectional views of some embodiments corresponding to act in block S20. At block S22, erase gates and select gates are formed over the cell region of the substrate. FIGS. 13-20 illustrate cross-sectional views of some embodiments corresponding to act in block S22. At block S24, a CESL and an ILD are formed over the substrate. FIG. 21 illustrates cross-sectional views of some embodiments corresponding to act in block S24. At block S26, the control gates, the erase gate, the select gates, and the gate stacks are removed to respectively form first opening, second opening, third opening, fourth opening, and fifth opening in the ILD. FIG. 22 illustrates cross-sectional views of some embodiments corresponding to act in block S26. At block S28, a high-κ dielectric layer, a barrier layer, and a P-type work function metal layer are formed in the first to fifth openings. FIG. 24 illustrates cross-sectional views of some embodiments corresponding to act in block S28. At block S30, the P-type work function metal layer in the first to fourth openings are removed. FIG. 25 illustrates cross-sectional views of some embodiments corresponding to act in block S30. At block S32, an N-type work function metal layer is formed in the first to fourth openings. FIG. 26 illustrates cross-sectional views of some embodiments corresponding to act in block S32. At block S34, a portion of the N-type work function metal layer outside the first to fourth openings are removed. FIG. 27A illustrates cross-sectional views of some embodiments corresponding to act in block S34. At block S36, contacts are formed over the metal gate stacks. FIG. 28 illustrates cross-sectional views of some embodiments corresponding to act in block S36.

Figure 30:
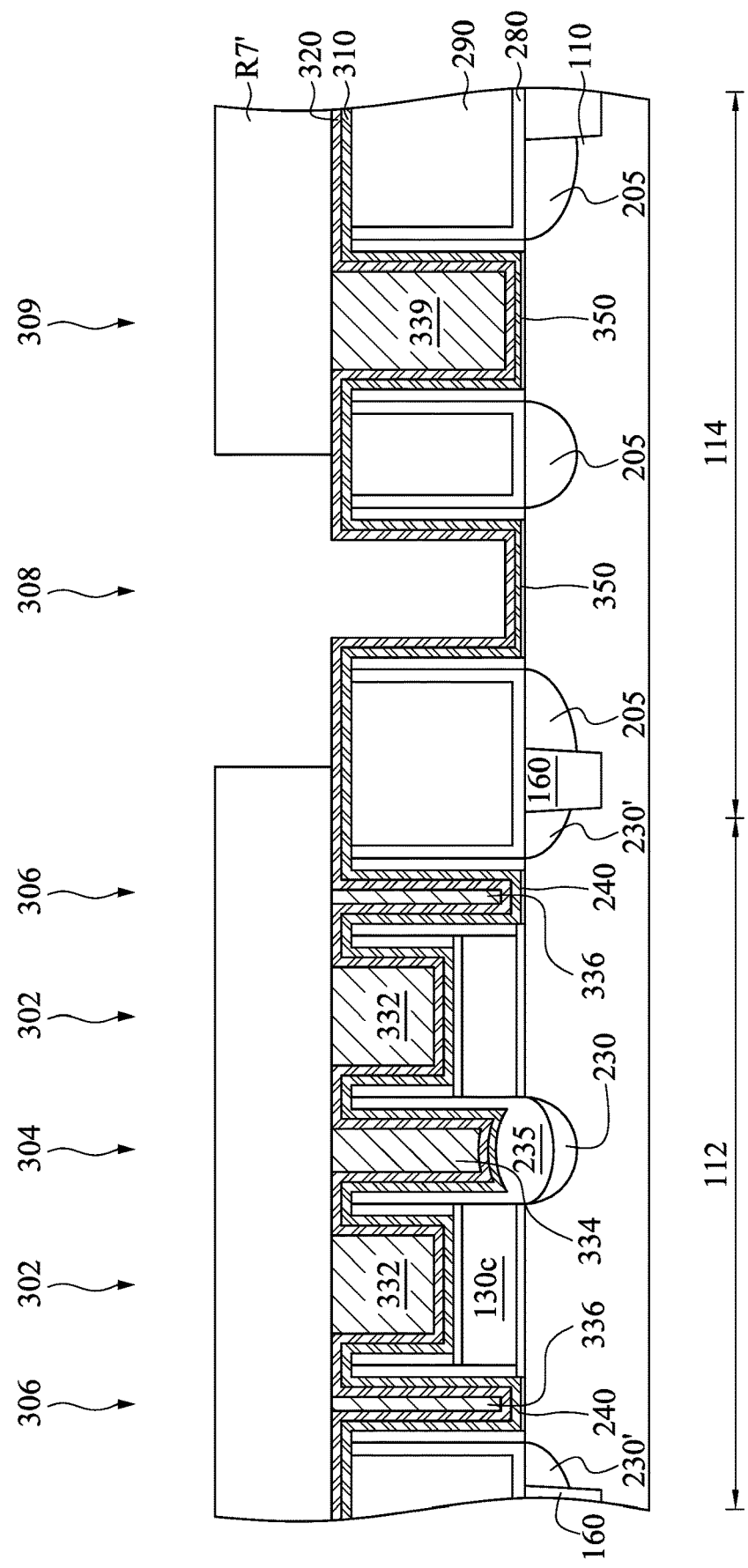
FIGS. 30 to 33 illustrate a method for manufacturing a memory device in different stages in accordance with some embodiments.

FIGS. 30 to 33 illustrate a method for manufacturing a memory device in different stages in accordance with some embodiments. The manufacturing processes of FIGS. 1 to 24 are performed in advance. Since the relevant manufacturing details are similar to FIGS. 1 to 24, and, therefore, a description in this regard will not be repeated hereinafter. Reference is made to FIG. 30. A portion of the P-type work function metal layer 330 in the opening 308 is removed. For example, a planarization process (such as a CMP process) may be performed on the P-type work function metal layer 330 until a top surface of the P-type work function metal layer 330 is level with a top surface of the barrier layer 320. Then, another mask layer (such as a BARC) R7' is formed to cover the planarized structure. The mask layer R7' is then patterned to expose the opening 308. The portion of the P-type work function metal layer 330 in the opening 308 is then removed. The portion of the P-type work function metal layer 330 in the opening 302 is referred to as the P-type work function metal layer 332, the portion of the P-type work function metal layer 330 in the opening 304 is referred to as the P-type work function metal layer 334, the portion of the P-type work function metal layer 330 in the opening 306 is referred to as the P-type work function metal layer 336, and the portion of the P-type work function metal layer 330 in the opening 309 is referred to as the P-type work function metal layer 339.

Figure 31:
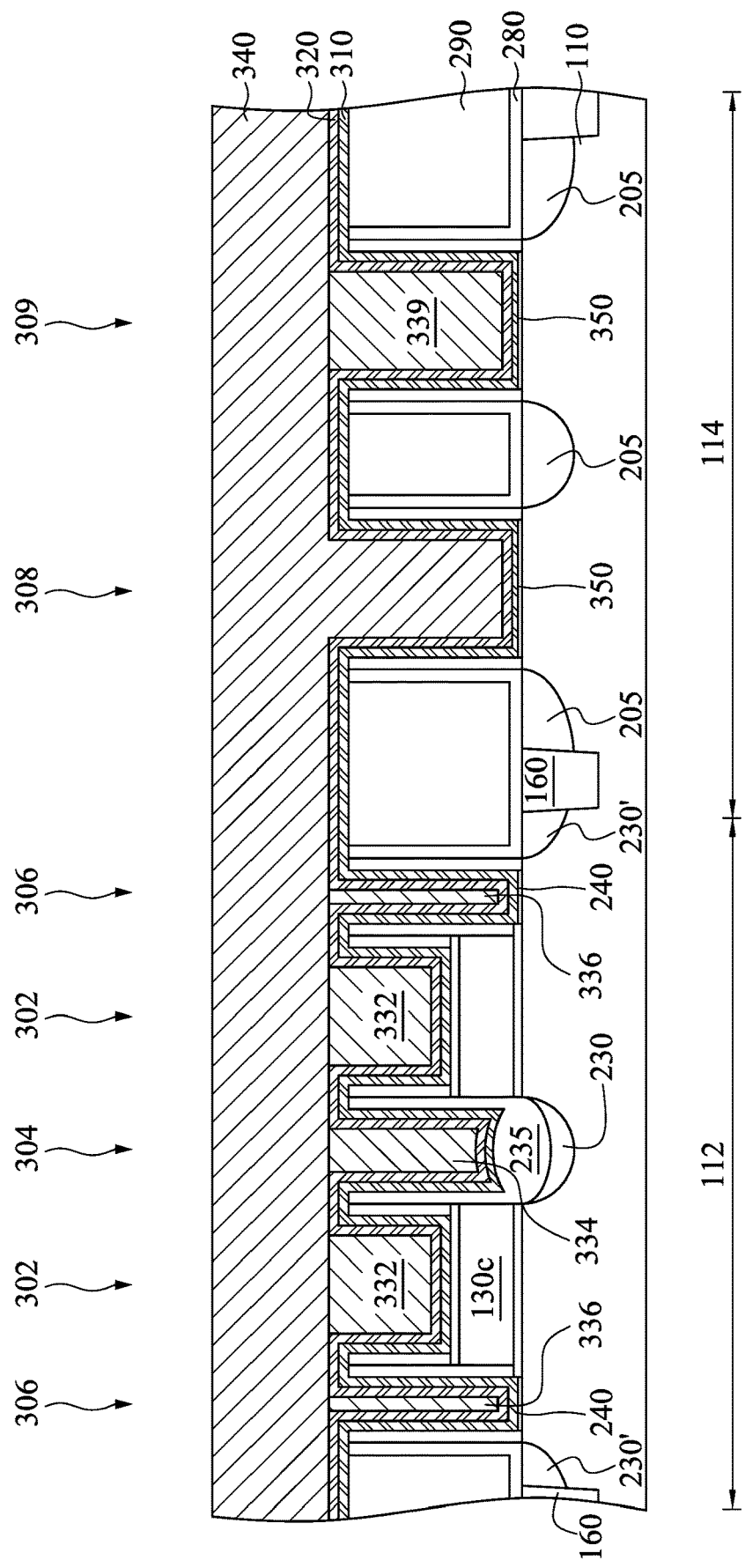

Reference is made to FIG. 31. The mask layer R7' in FIG. 30 is removed, and the removal method may be performed by dry etching, for example. Then, an N-type work function metal layer 340 is formed on the barrier layer 320 and the P-type work function metal layers 332, 334, 336, and 339 and fills the opening 308.

Figure 32:
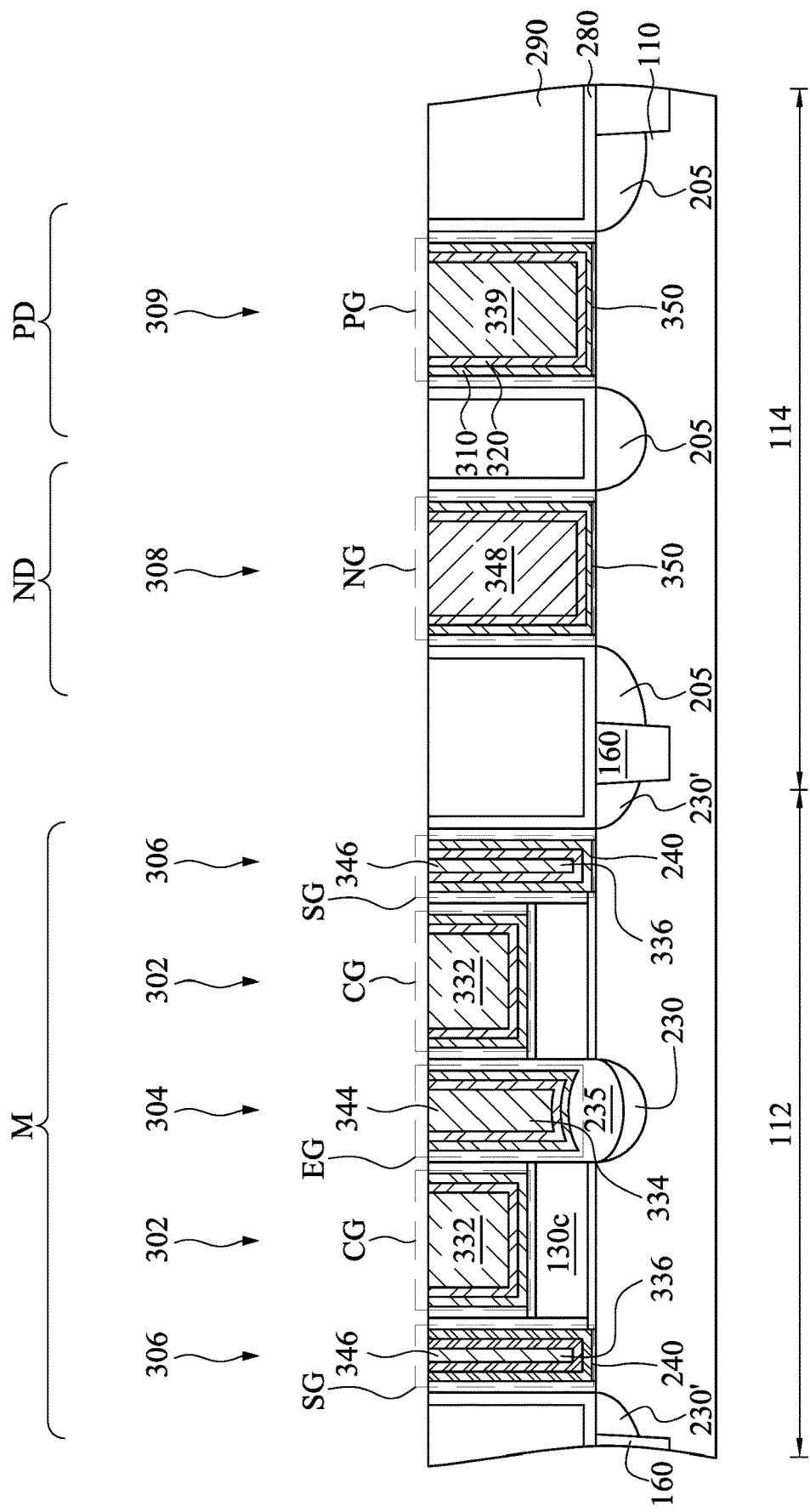

Reference is made to FIG. 32. Another planarization process (such as a CMP process) may be performed on the N-type work function metal layer 340 until a top surface of the N-type work function metal layer 340 is level with a top surface of the ILD 290. In this process, portions of the high-κ dielectric layer 310, the barrier layer 320, and the P-type work function metal layer 339 are also removed, such that a top surface of the high-κ dielectric layer 310, a top surface of the barrier layer 320, and a top surface of the P-type work function metal layer 339 are level with the top surface of the N-type work function metal layer 340 and the top surface of the ILD 290. The remaining portion of the N-type work function metal layer 340 in the opening 308 is referred to as an N-type work function metal layer 348.

In FIG. 32, the high-κ dielectric layer 310, the barrier layer 320, and the P-type work function metal layer 332 in the opening 302 form a control gate stack CG, the high-κ dielectric layer 310, the barrier layer 320, and the P-type work function metal layer 334 in the opening 304 form an erase gate stack EG, the high-κ dielectric layer 310, the barrier layer 320, and the P-type work function metal layer 336 in the opening 306 form a select gate stack SG, the high-κ dielectric layer 310, the barrier layer 320, and the N-type work function metal layer 348 in the opening 308 form an N-type gate stack NG, and the high-κ dielectric layer 310, the barrier layer 320, and the N-type work function metal layer 339 in the opening 309 form a P-type gate stack PG.

Two control gates CG, one erase gate SG, two select gate SG, one source region 230, and two drain regions 230' form a memory cells M, which is formed over the cell region 112 of the substrate 110. Furthermore, the N-type gate stack NG and two source/drain regions 205 adjacent the N-type gate stack NG form an N-type device ND (e.g., an N-type transistor), and the P-type gate stack PG and two source/drain regions 205 adjacent the P-type gate stack PG form a P-type device PD (e.g., a P-type transistor). The N-type device ND and the P-type device PD are formed over the logic region 114 of the substrate 110.

It noted that although in this embodiment, the P-type gate (e.g., the P-type gate stack PG in this case) is formed before the N-type gates (e.g., the control gate CG, the erase gate EG, the select gate SG, and the N-type gate stack NG in this case), the N-type gate(s) may be formed before the P-type gate(s) in other embodiments.

Figure 33:
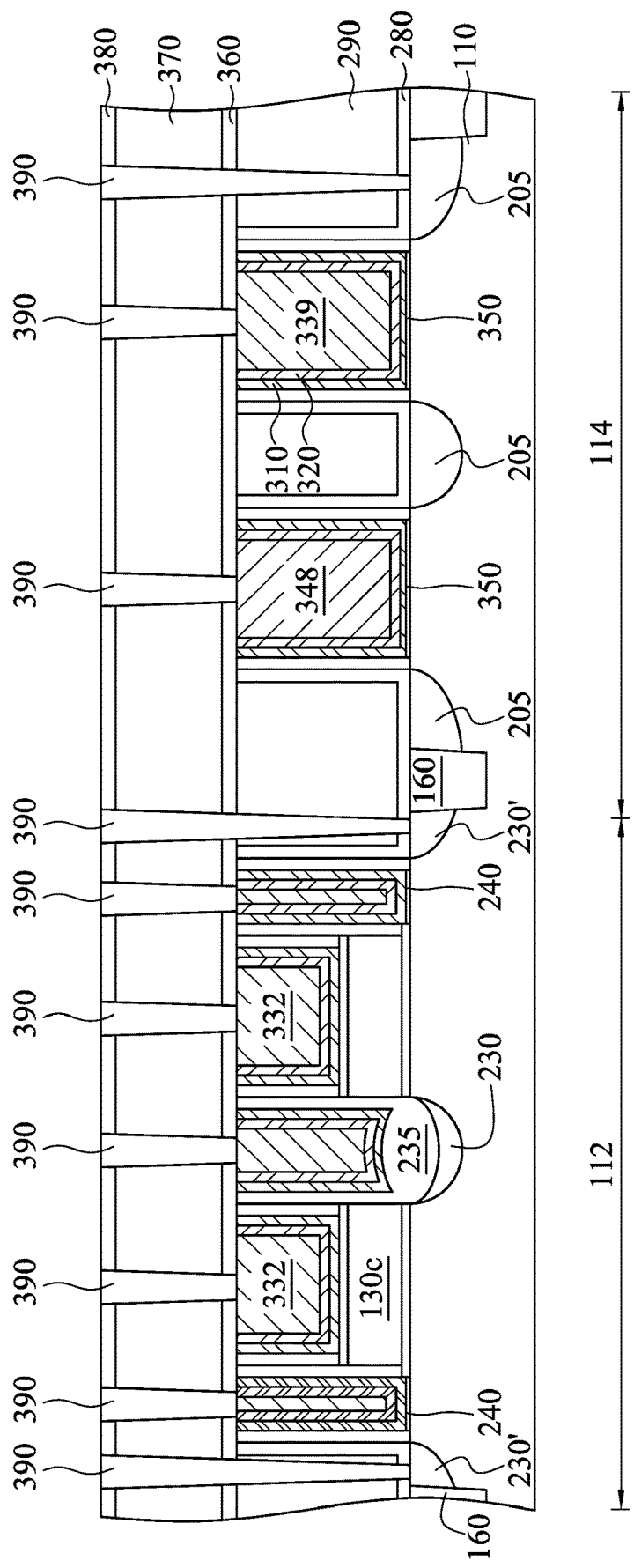

Reference is made to FIGS. 32 and 33. An ESL 360, an ILD 370, and another ESL 380 are formed on the structure of FIG. 32. Then, a plurality of contacts 390 are formed in the ILD 370 and the ELSs 360 and 380. It is noted that the configurations/locations of the contacts 390 in FIG. 33 are as an example, and should not limit the present disclosure.

Figure 34A:
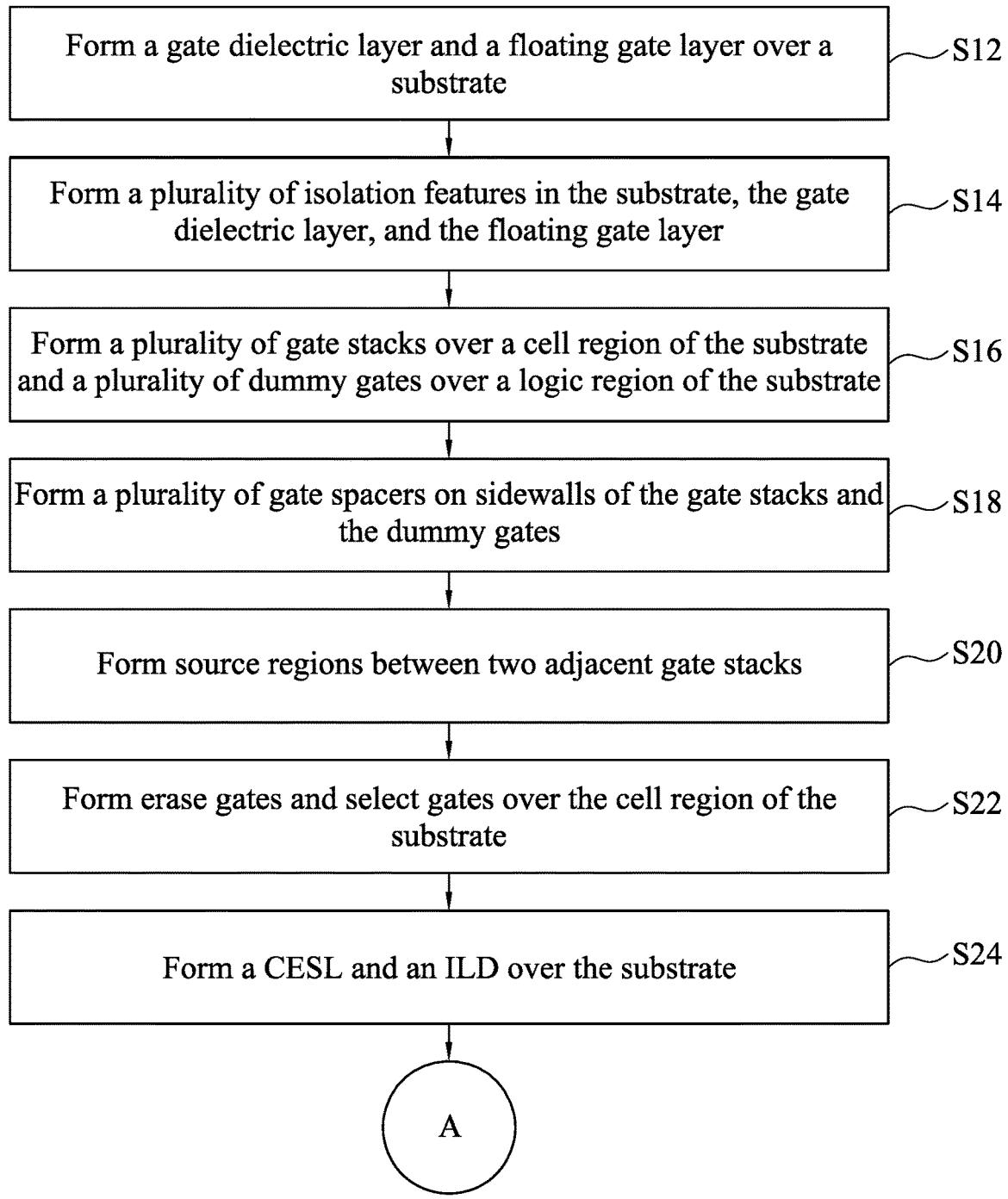
FIGS. 34A and 34B illustrate a method of forming a memory device in accordance with some embodiments.
Figure 34B:
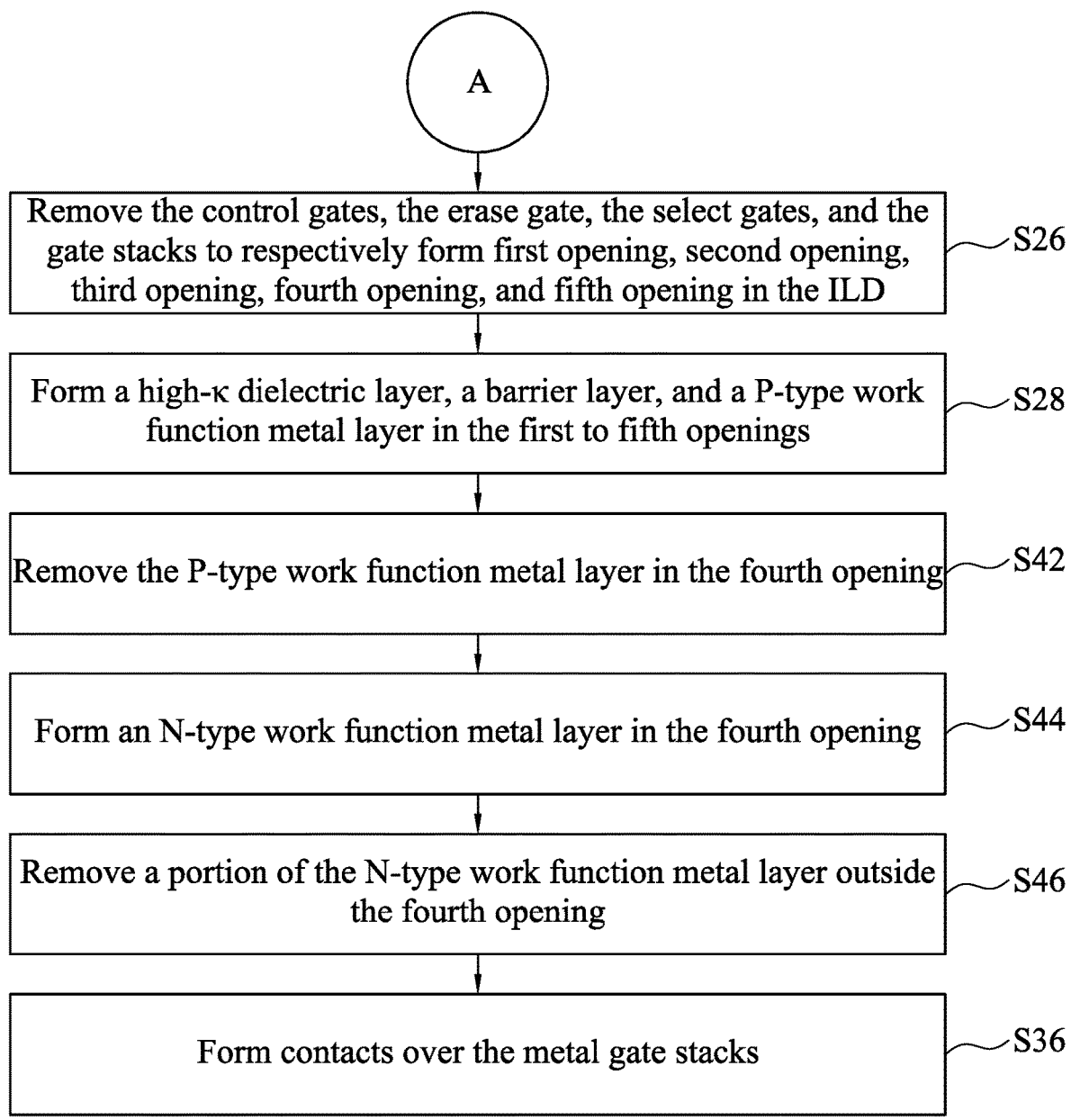

FIGS. 34A and 34B illustrate a method M2 of forming a memory device in accordance with some embodiments. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S42, the P-type work function metal layer in the fourth opening is removed. FIG. 30 illustrates cross-sectional views of some embodiments corresponding to act in block S42. At block S44, an N-type work function metal layer is formed in the fourth opening. FIG. 31 illustrates cross-sectional views of some embodiments corresponding to act in block S44. At block S46, a portion of the N-type work function metal layer outside the fourth opening is removed. FIG. 32 illustrates cross-sectional views of some embodiments corresponding to act in block S46. At block S36, contacts are formed over the gate stacks. FIG. 33 illustrates cross-sectional views of some embodiments corresponding to act in block S36.

Figure 35:
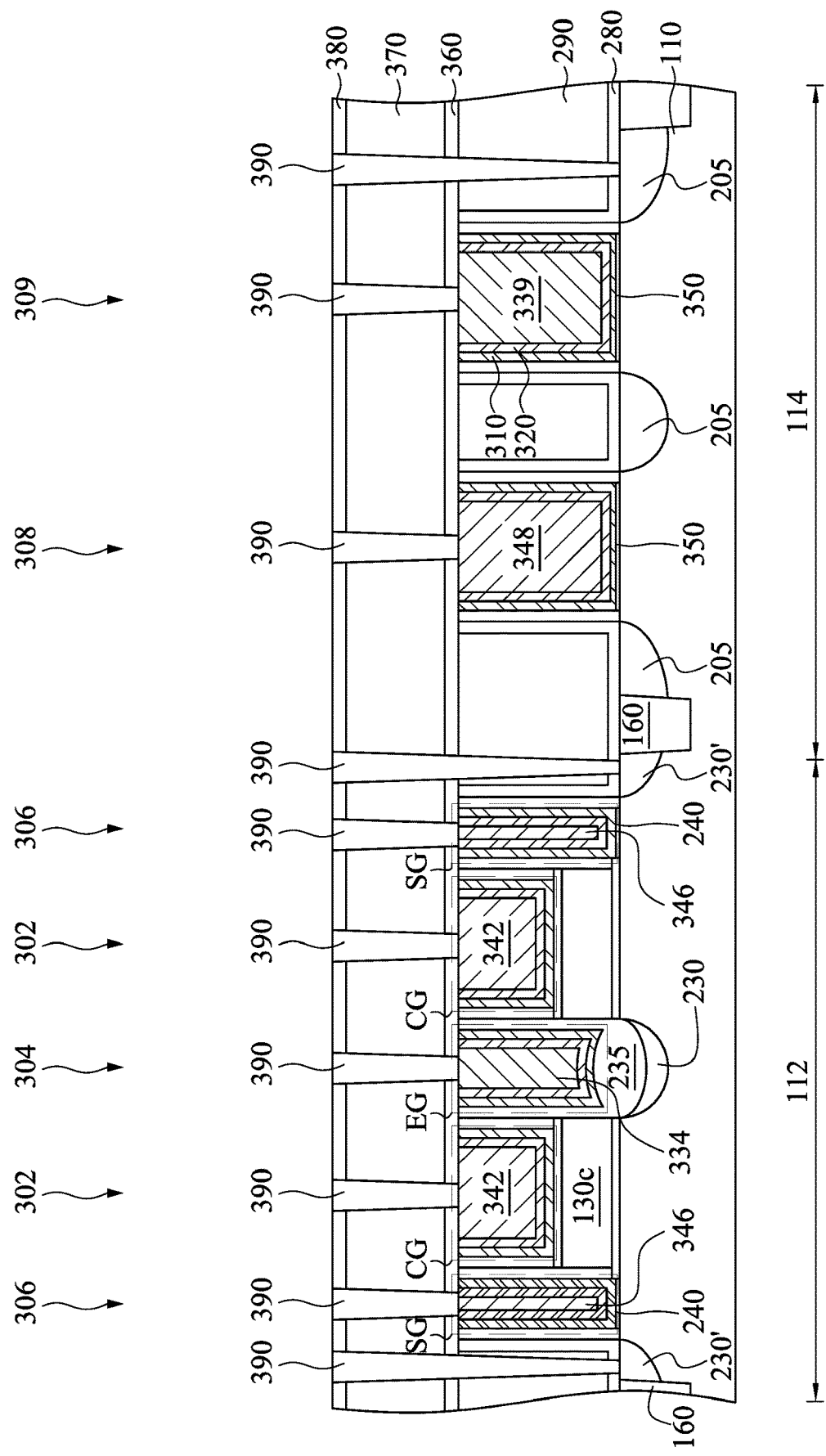
FIG. 35 illustrates a memory device in accordance with some embodiments.

FIG. 35 illustrates a memory device in accordance with some embodiments. In FIG. 35, the high-κ dielectric layer 310, the barrier layer 320, and the N-type work function metal layer 342 in the opening 302 form a control gate stack CG; the high-κ dielectric layer 310, the barrier layer 320, and the P-type work function metal layer 334 in the opening 304 form an erase gate stack EG; the high-κ dielectric layer 310, the barrier layer 320, and the N-type work function metal layer 346 in the opening 306 form a select gate stack SG. Other relevant structural and process details of the IC in FIG. 35 are similar to or the same as the IC in FIG. 28, and, therefore, a description in this regard will not be repeated hereinafter.

Figure 36A:
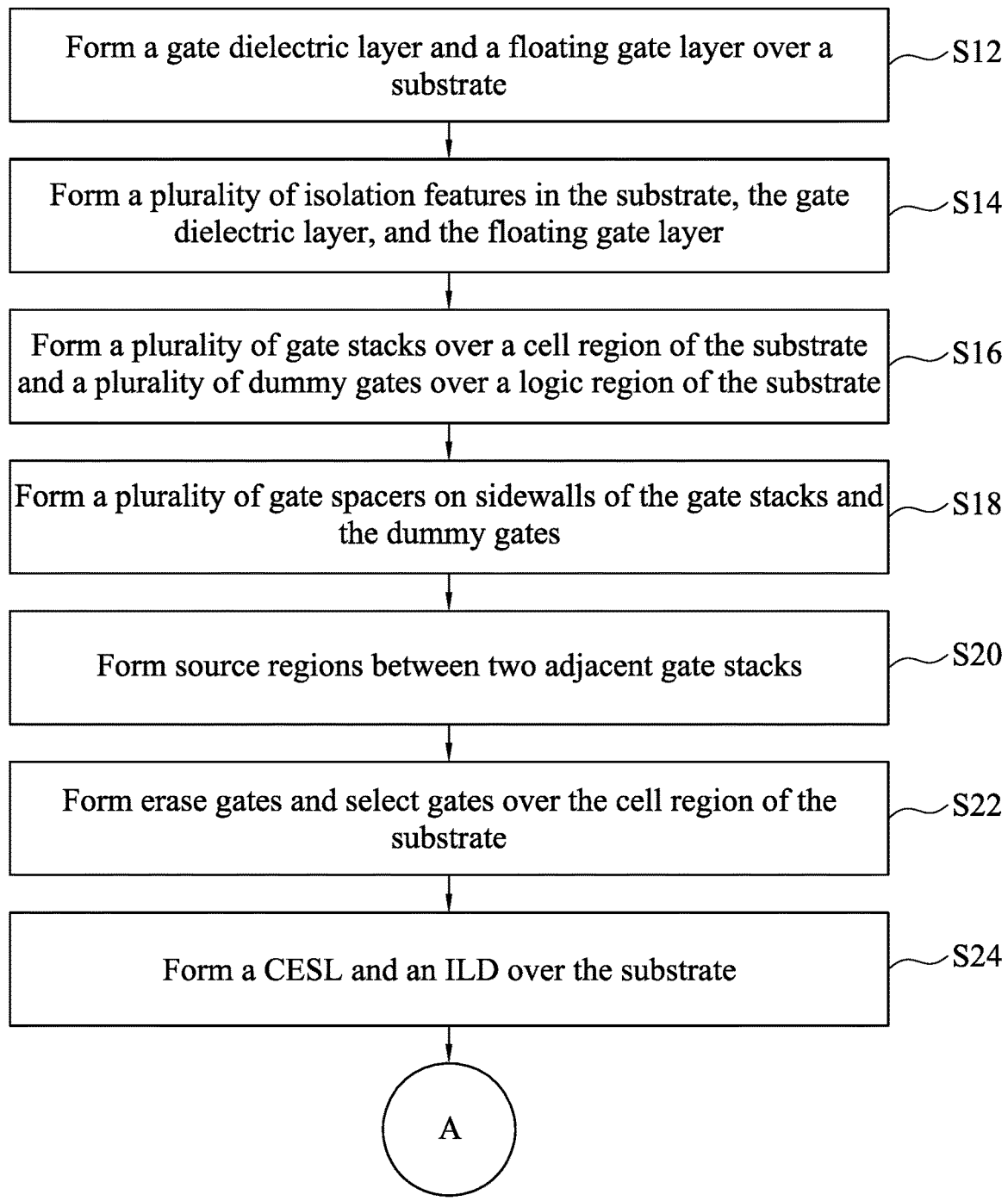
FIGS. 36A and 36B illustrate a method of forming a memory device in accordance with some embodiments.
Figure 36B:
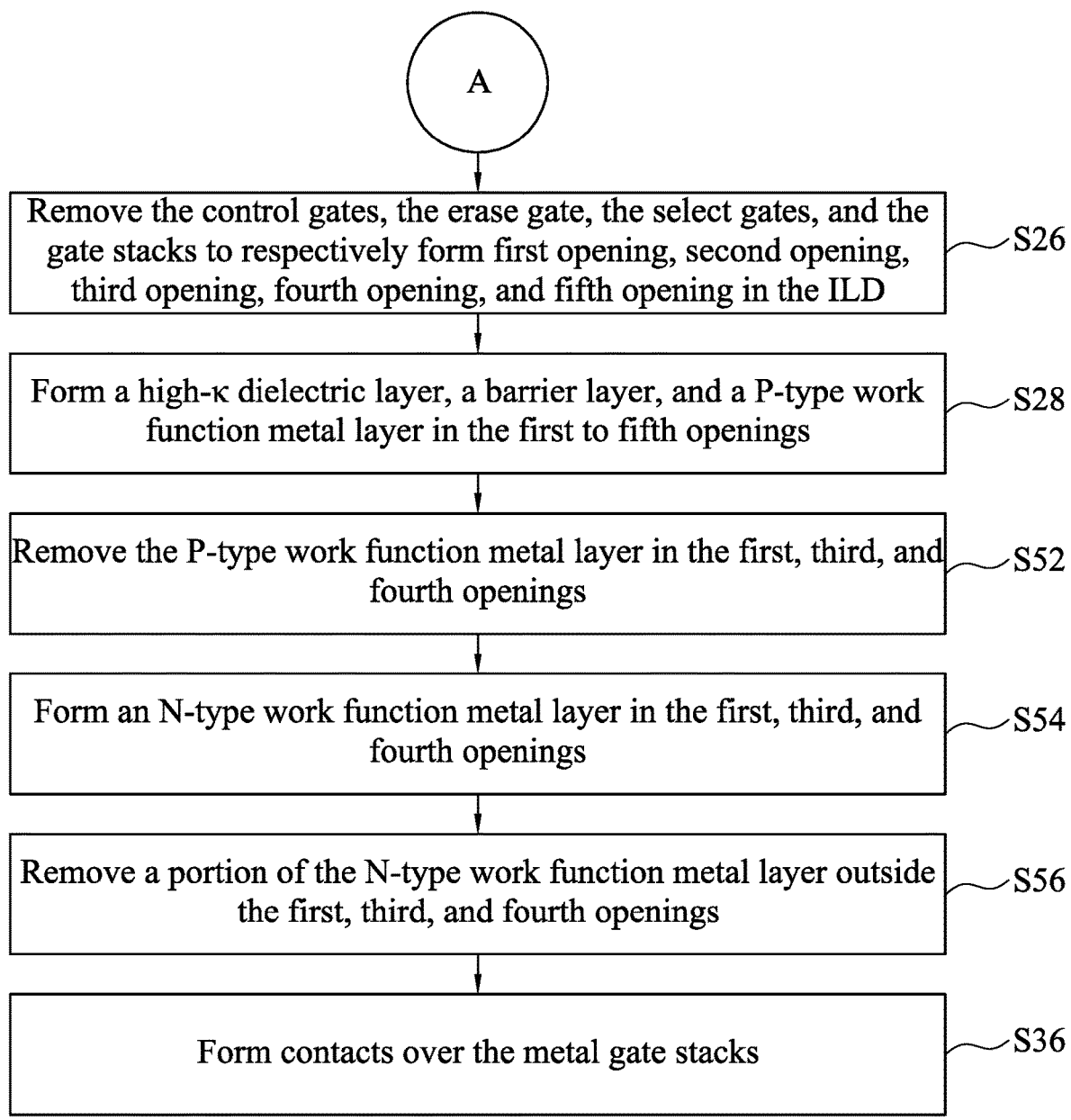

FIGS. 36A and 36B illustrate a method M3 of forming a memory device in accordance with some embodiments. Although the method M3 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S52, the P-type work function metal layer in the first, third, and fourth openings are removed. At block S54, an N-type work function metal layer is formed in the first, third, and fourth openings. At block S56, a portion of the N-type work function metal layer outside the first, third, and fourth openings are removed. At block S36, contacts are formed over the gate stacks. FIG. 35 illustrates cross-sectional views of some embodiments corresponding to act in block S36.

Figure 37:
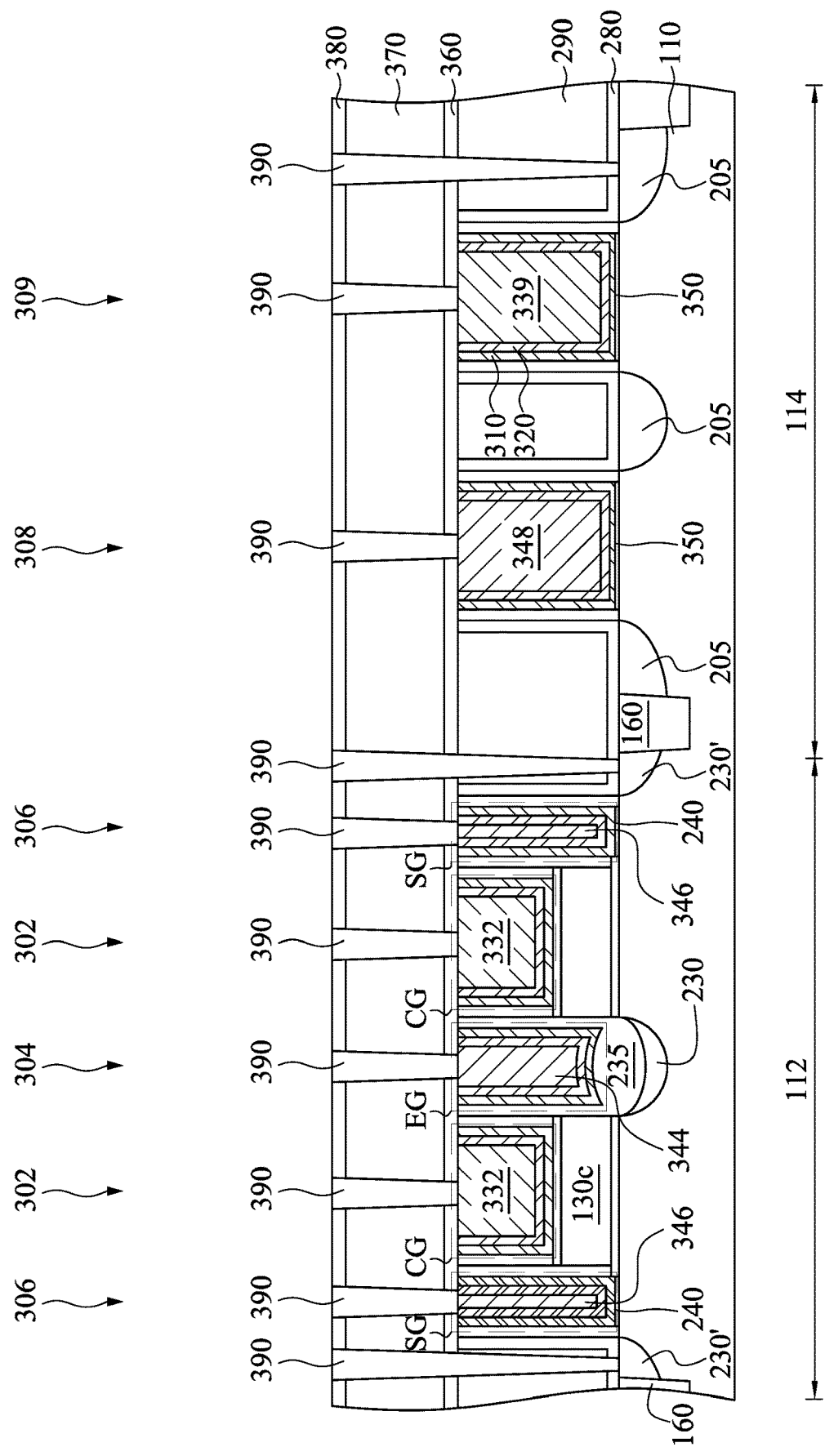
FIG. 37 illustrates a memory device in accordance with some embodiments.

In FIG. 37, the high-κ dielectric layer 310, the barrier layer 320, and the P-type work function metal layer 332 in the opening 302 form a control gate stack CG; the high-κ dielectric layer 310, the barrier layer 320, and the N-type work function metal layer 344 in the opening 304 form an erase gate stack EG; the high-κ dielectric layer 310, the barrier layer 320, and the N-type work function metal layer 346 in the opening 306 form a select gate stack SG. Other relevant structural and process details of the IC in FIG. 37 are similar to or the same as the IC in FIG. 28, and, therefore, a description in this regard will not be repeated hereinafter.

Figure 38A:
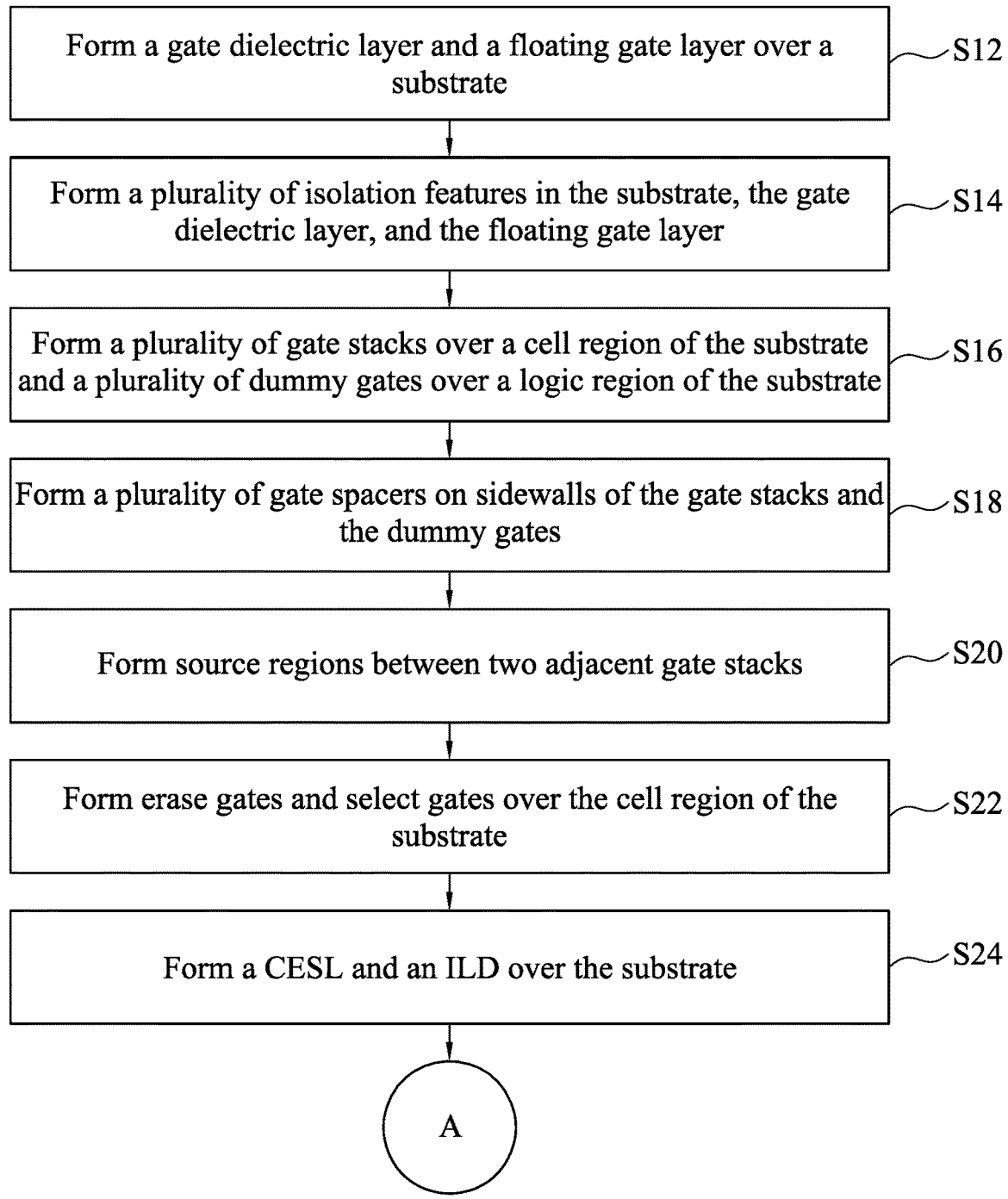
FIGS. 38A and 38B illustrate a method of forming a memory device in accordance with some embodiments.
Figure 38B:
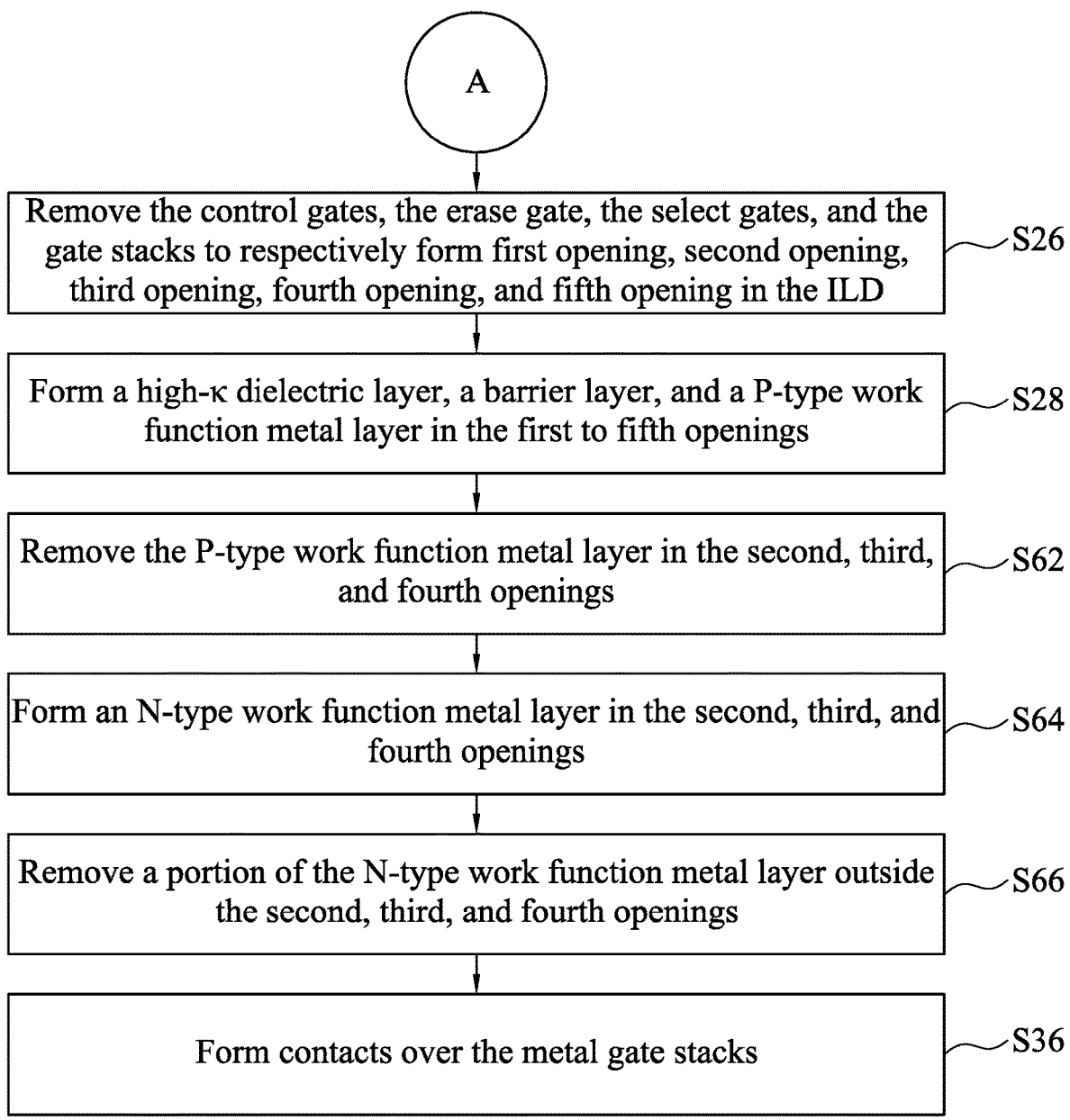

FIGS. 38A and 38B illustrate a method M4 of forming a memory device in accordance with some embodiments. Although the method M4 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S62, the P-type work function metal layer in the second, third, and fourth openings are removed. At block S64, an N-type work function metal layer is formed in the second, third, and fourth openings. At block S66, a portion of the N-type work function metal layer outside the second, third, and fourth openings are removed. At block S36, contacts are formed over the gate stacks. FIG. 37 illustrates cross-sectional views of some embodiments corresponding to act in block S36.

Figure 39:
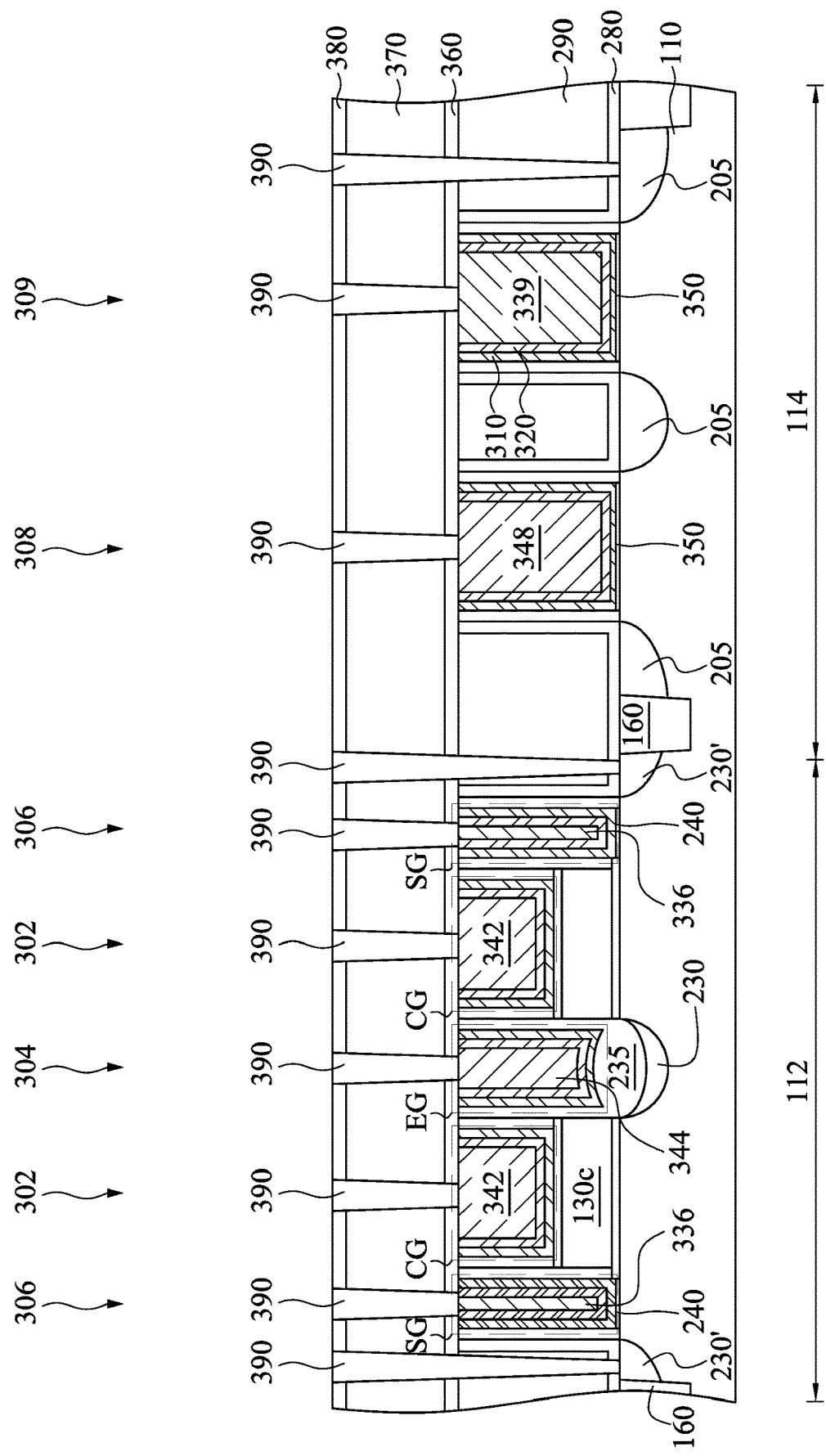
FIG. 39 illustrates a memory device in accordance with some embodiments.

In FIG. 39, the high-κ dielectric layer 310, the barrier layer 320, and the N-type work function metal layer 342 in the opening 302 form a control gate stack CG; the high-κ dielectric layer 310, the barrier layer 320, and the N-type work function metal layer 344 in the opening 304 form an erase gate stack EG; the high-κ dielectric layer 310, the barrier layer 320, and the P-type work function metal layer 336 in the opening 306 form a select gate stack SG. Other relevant structural and process details of the IC in FIG. 39 are similar to or the same as the IC in FIG. 28, and, therefore, a description in this regard will not be repeated hereinafter.

Figure 40A:
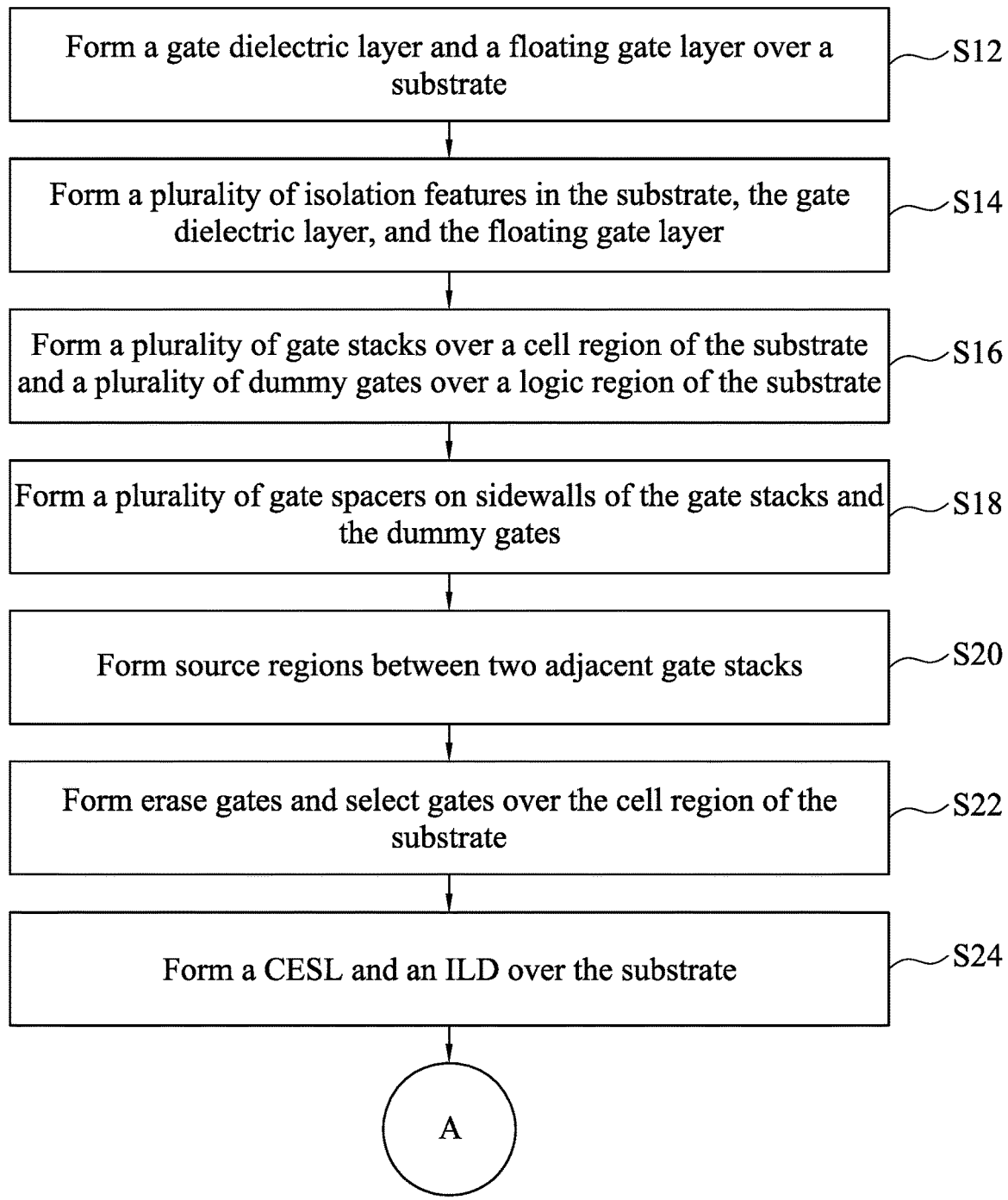
FIGS. 40A and 40B illustrate a method of forming a memory device in accordance with some embodiments.
Figure 40B:
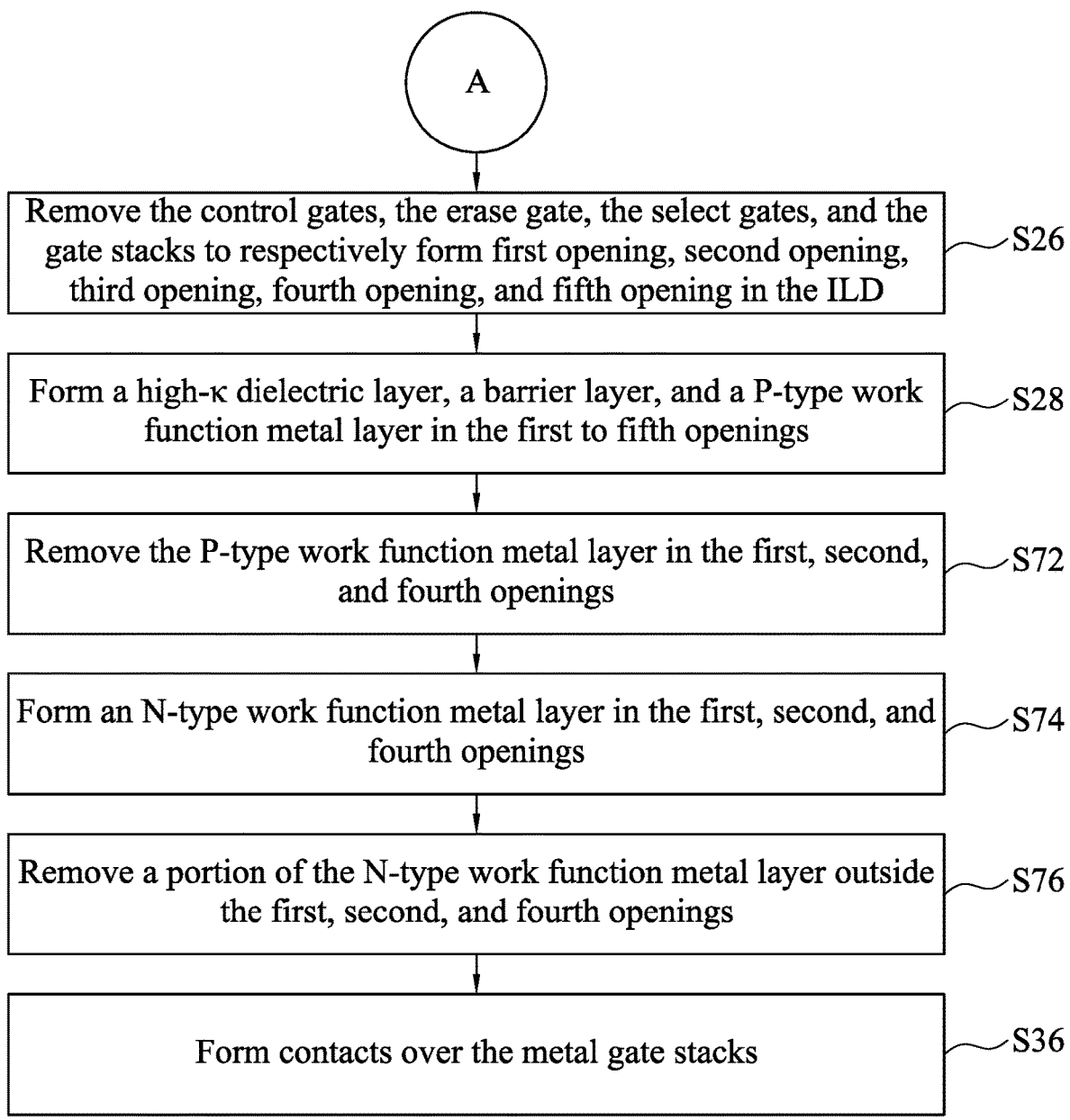

FIGS. 40A and 40B illustrate a method M5 of forming a memory device in accordance with some embodiments. Although the method M5 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S72, the P-type work function metal layer in the first, second, and fourth openings are removed. At block S74, an N-type work function metal layer is formed in the first, second, and fourth openings. At block S76, a portion of the N-type work function metal layer outside the first, second, and fourth openings are removed. At block S36, contacts are formed over the gate stacks. FIG. 39 illustrates cross-sectional views of some embodiments corresponding to act in block S36.

Figure 41:
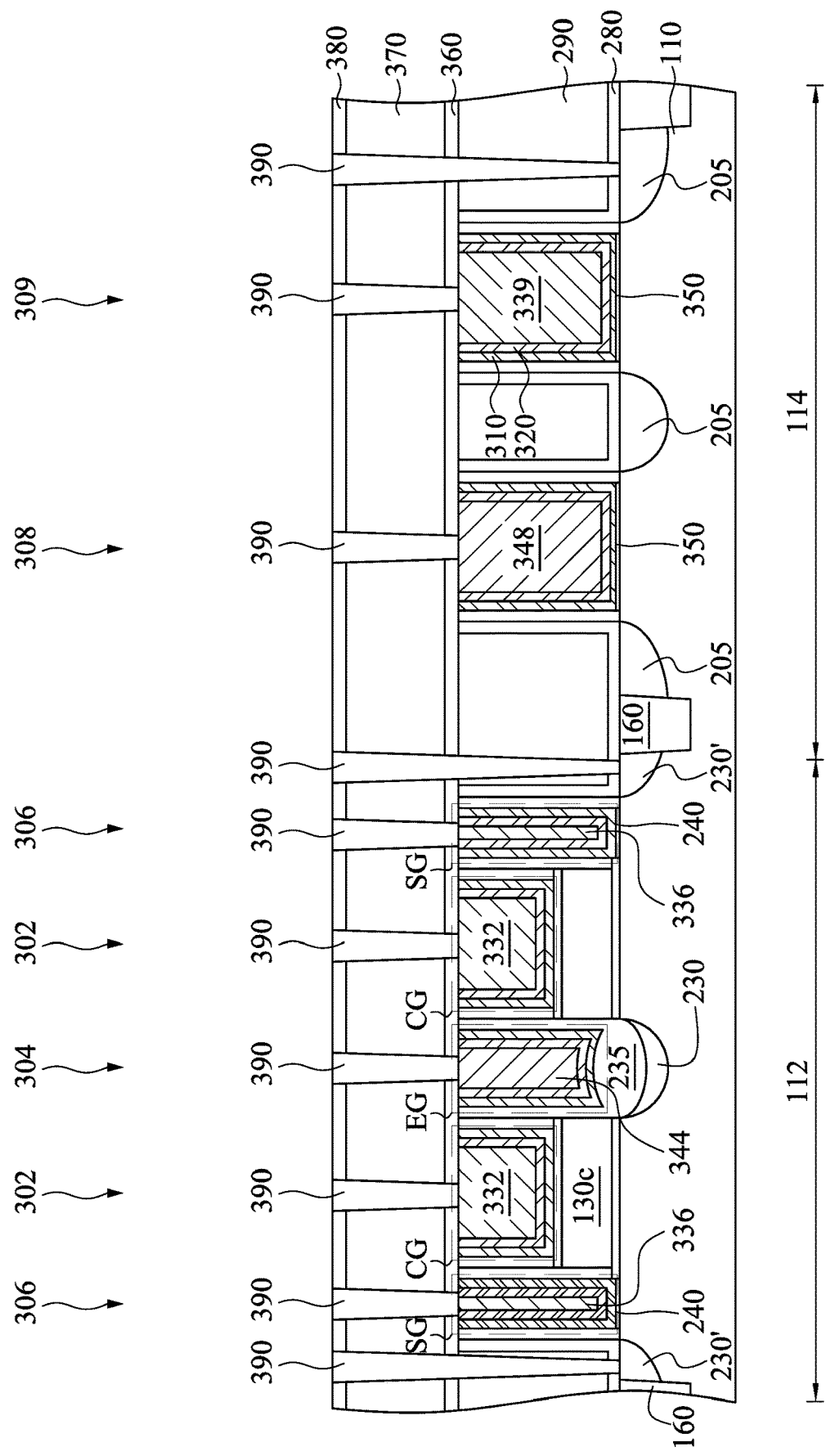
FIG. 41 illustrates a memory device in accordance with some embodiments.

In FIG. 41, the high-κ dielectric layer 310, the barrier layer 320, and the P-type work function metal layer 332 in the opening 302 form a control gate stack CG; the high-κ dielectric layer 310, the barrier layer 320, and the N-type work function metal layer 344 in the opening 304 form an erase gate stack EG; the high-κ dielectric layer 310, the barrier layer 320, and the P-type work function metal layer 336 in the opening 306 form a select gate stack SG. Other relevant structural and process details of the IC in FIG. 41 are similar to or the same as the IC in FIG. 28, and, therefore, a description in this regard will not be repeated hereinafter.

Figure 42A:
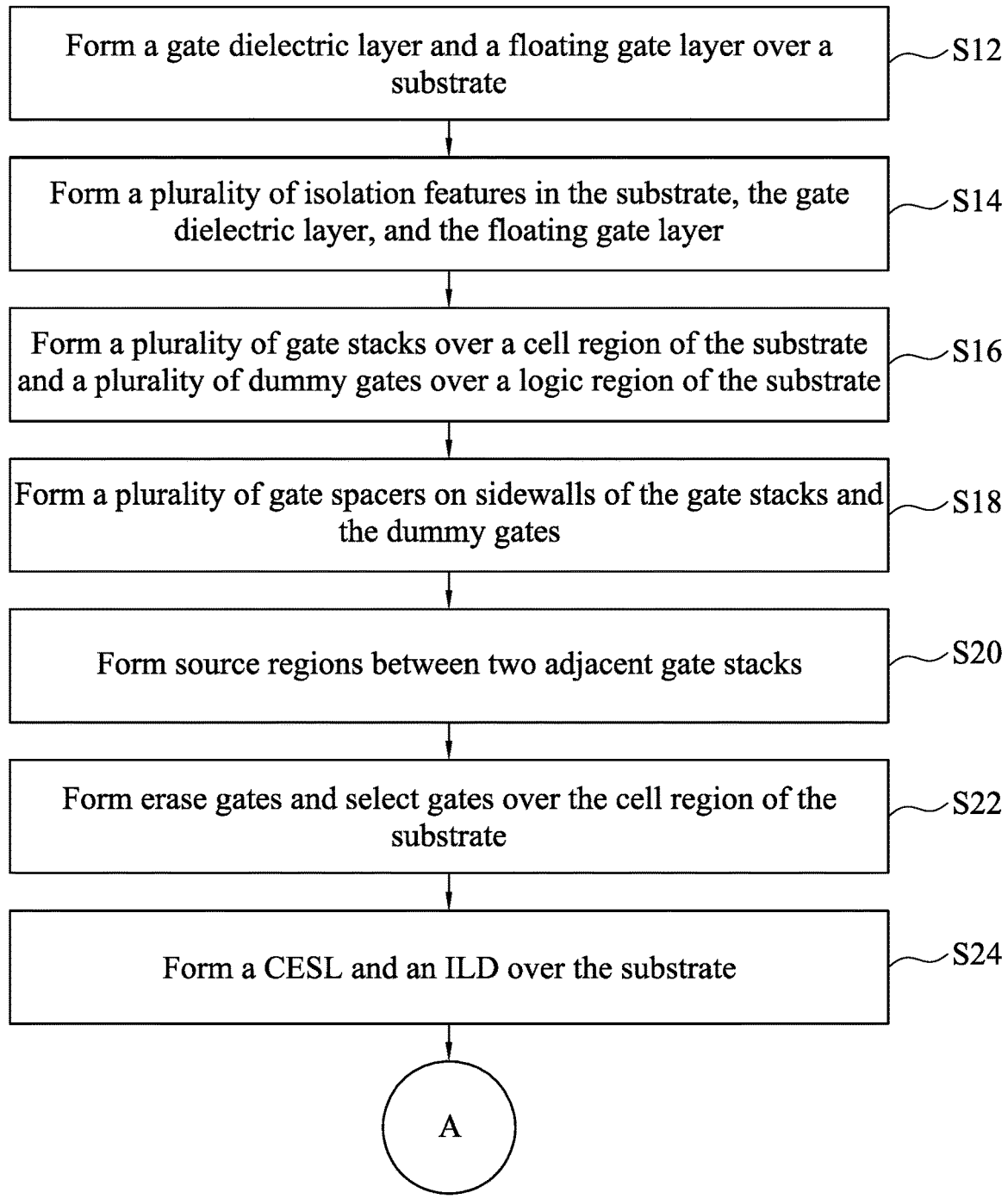
FIGS. 42A and 42B illustrate a method of forming a memory device in accordance with some embodiments.
Figure 42B:
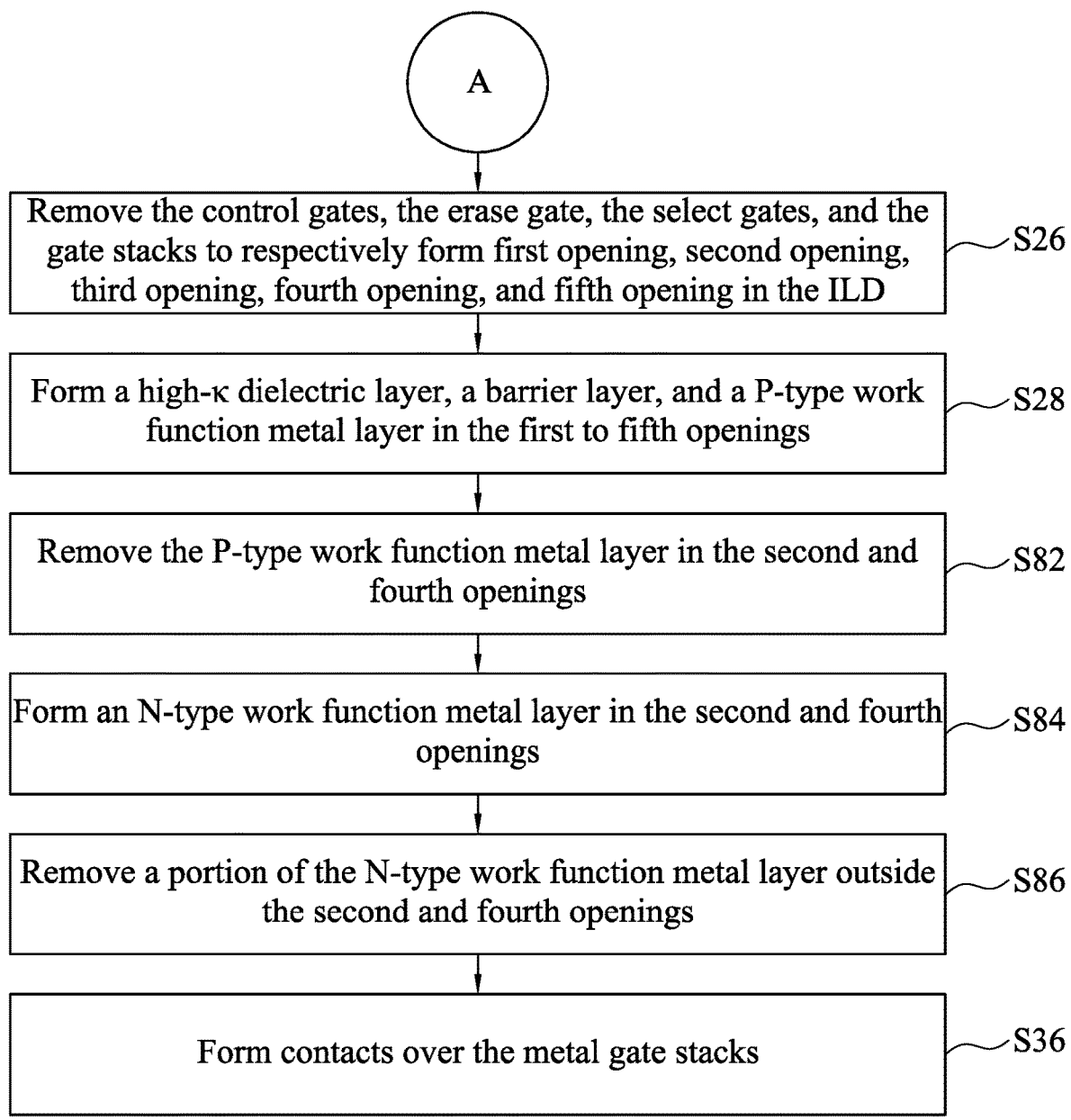

FIGS. 42A and 42B illustrate a method M6 of forming a memory device in accordance with some embodiments. Although the method M6 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S82, the P-type work function metal layer in the second and fourth openings is removed. At block S84, an N-type work function metal layer is formed in the second and fourth openings. At block S86, a portion of the N-type work function metal layer outside the second and fourth openings is removed. At block S36, contacts are formed over the gate stacks. FIG. 41 illustrates cross-sectional views of some embodiments corresponding to act in block S36.

Figure 43:
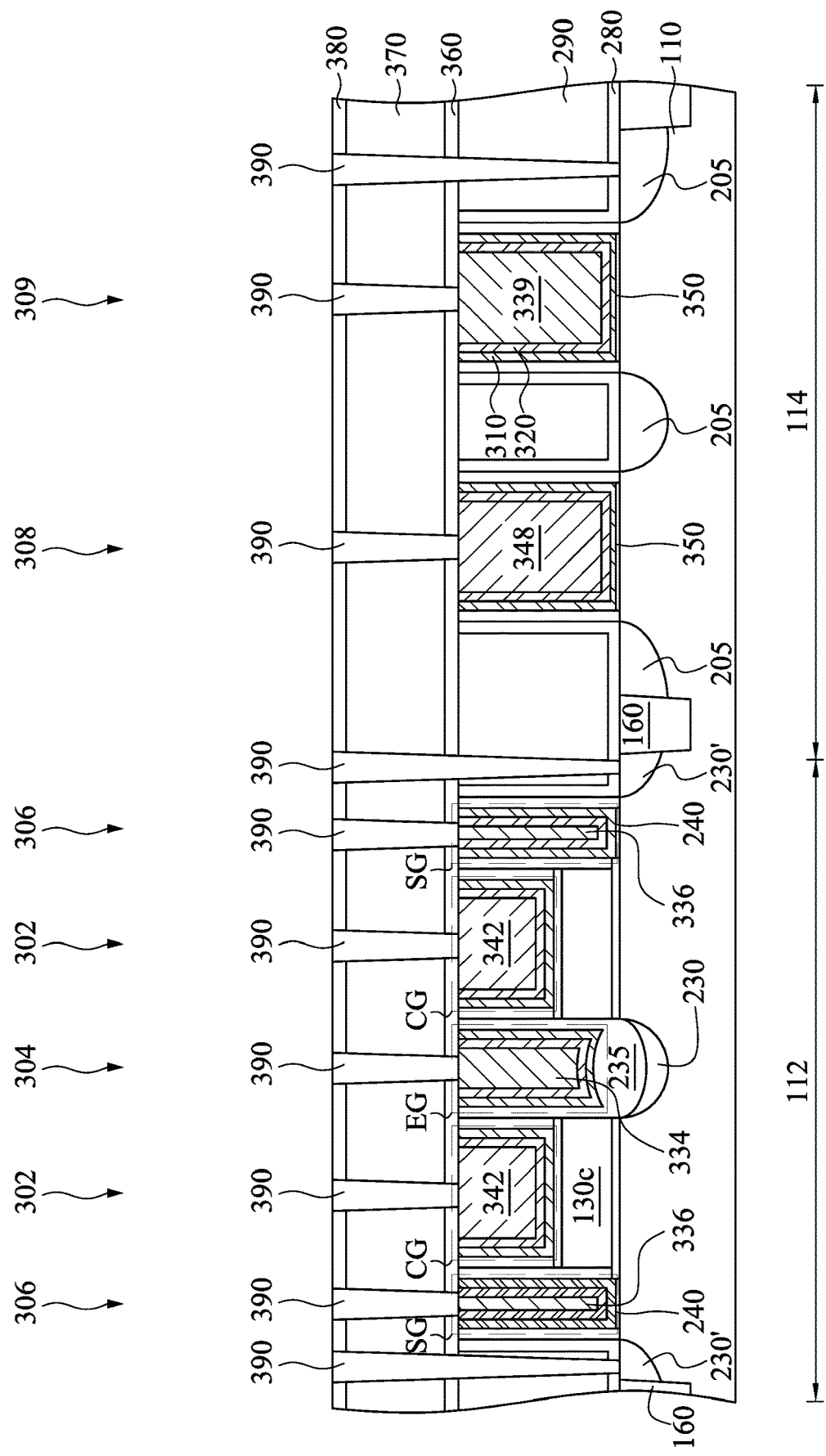
FIG. 43 illustrates a memory device in accordance with some embodiments.

In FIG. 43, the high-κ dielectric layer 310, the barrier layer 320, and the N-type work function metal layer 342 in the opening 302 form a control gate stack CG; the high-κ dielectric layer 310, the barrier layer 320, and the P-type work function metal layer 334 in the opening 304 form an erase gate stack EG; the high-κ dielectric layer 310, the barrier layer 320, and the P-type work function metal layer 336 in the opening 306 form a select gate stack SG. Other relevant structural and process details of the IC in FIG. 43 are similar to or the same as the IC in FIG. 28, and, therefore, a description in this regard will not be repeated hereinafter.

Figure 44A:
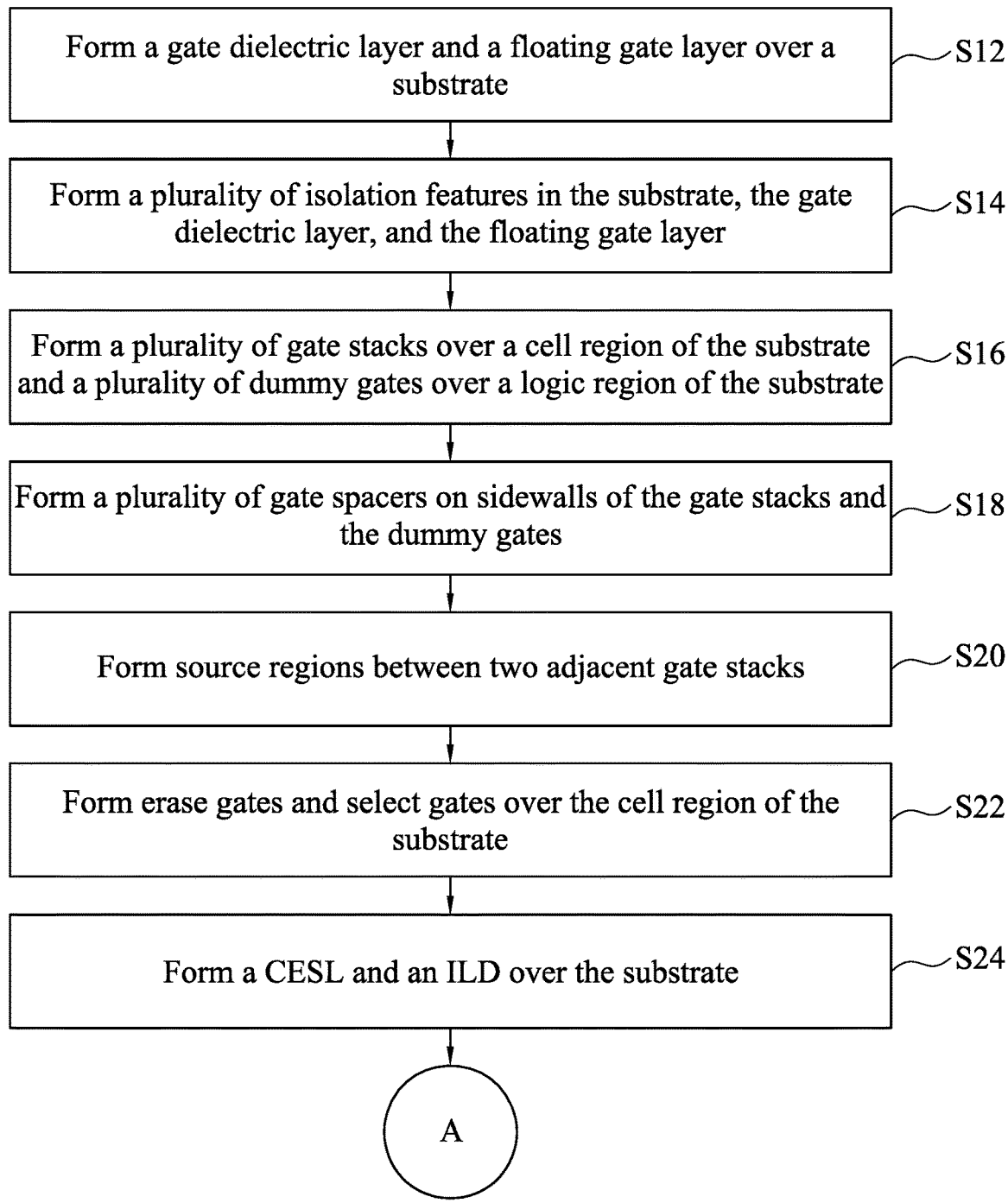
FIGS. 44A and 44B illustrate a method of forming a memory device in accordance with some embodiments.
Figure 44B:
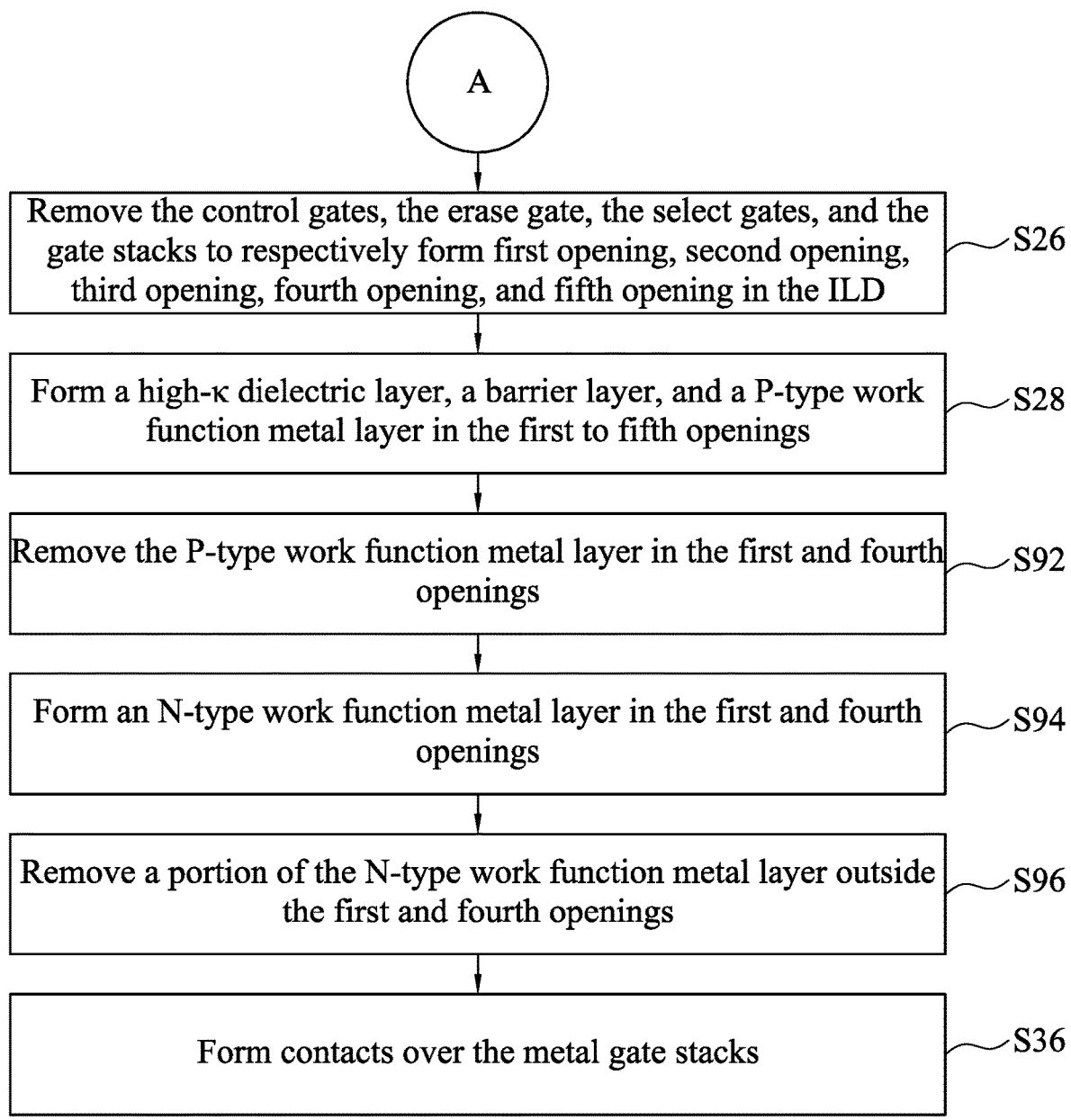

FIGS. 44A and 44B illustrate a method M7 of forming a memory device in accordance with some embodiments. Although the method M7 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S92, the P-type work function metal layer in the first and fourth openings is removed. At block S94, an N-type work function metal layer is formed in the first and fourth openings. At block S96, a portion of the N-type work function metal layer outside the first and fourth openings is removed. At block S36, contacts are formed over the gate stacks. FIG. 43 illustrates cross-sectional views of some embodiments corresponding to act in block S36.

Figure 45:
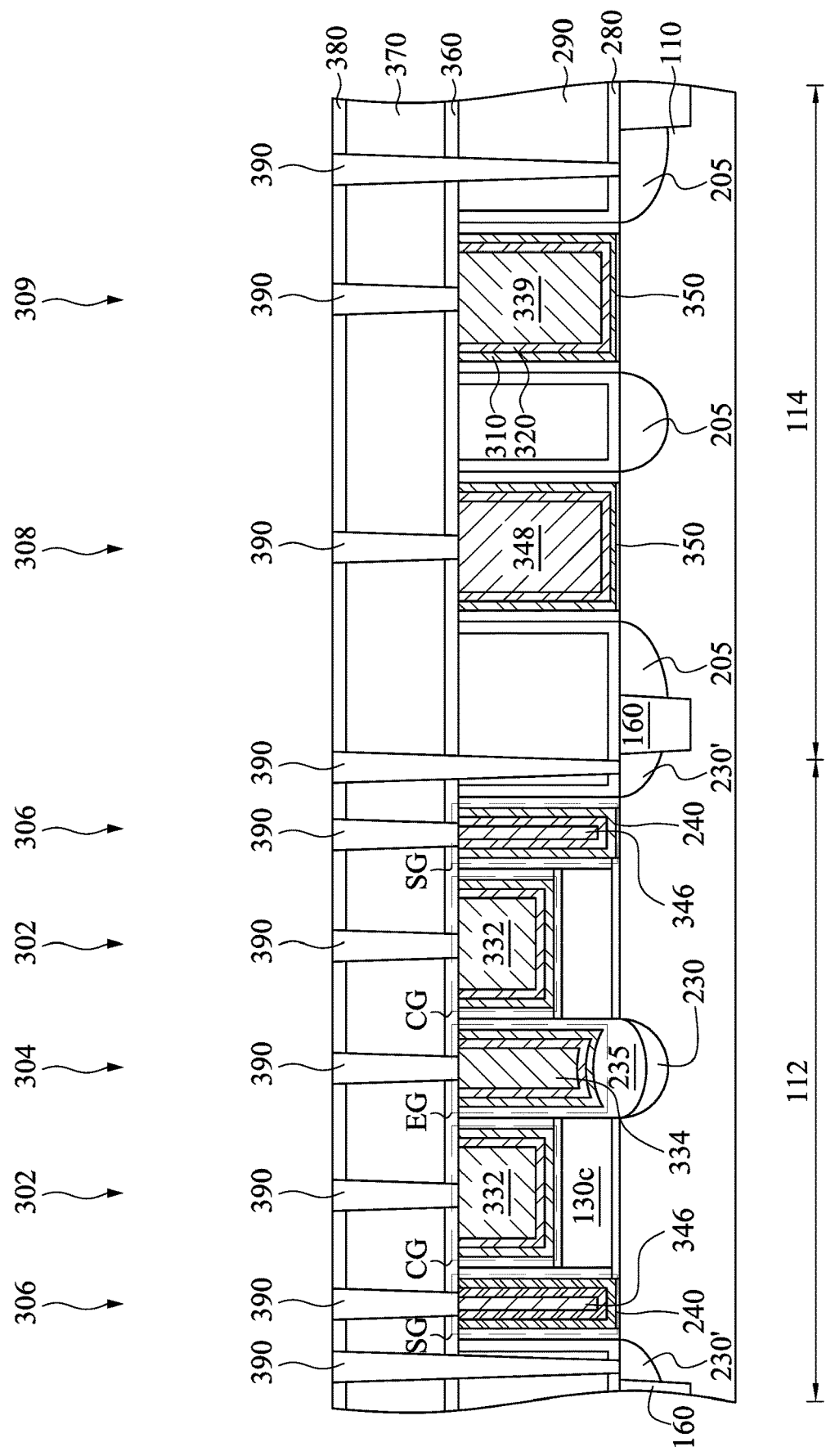
FIG. 45 illustrates a memory device in accordance with some embodiments.

In FIG. 45, the high-κ dielectric layer 310, the barrier layer 320, and the P-type work function metal layer 332 in the opening 302 form a control gate stack CG; the high-κ dielectric layer 310, the barrier layer 320, and the P-type work function metal layer 334 in the opening 304 form an erase gate stack EG; the high-κ dielectric layer 310, the barrier layer 320, and the P-type work function metal layer 346 in the opening 306 form a select gate stack SG. Other relevant structural and process details of the IC in FIG. 45 are similar to or the same as the IC in FIG. 28, and, therefore, a description in this regard will not be repeated hereinafter.

Figure 46A:
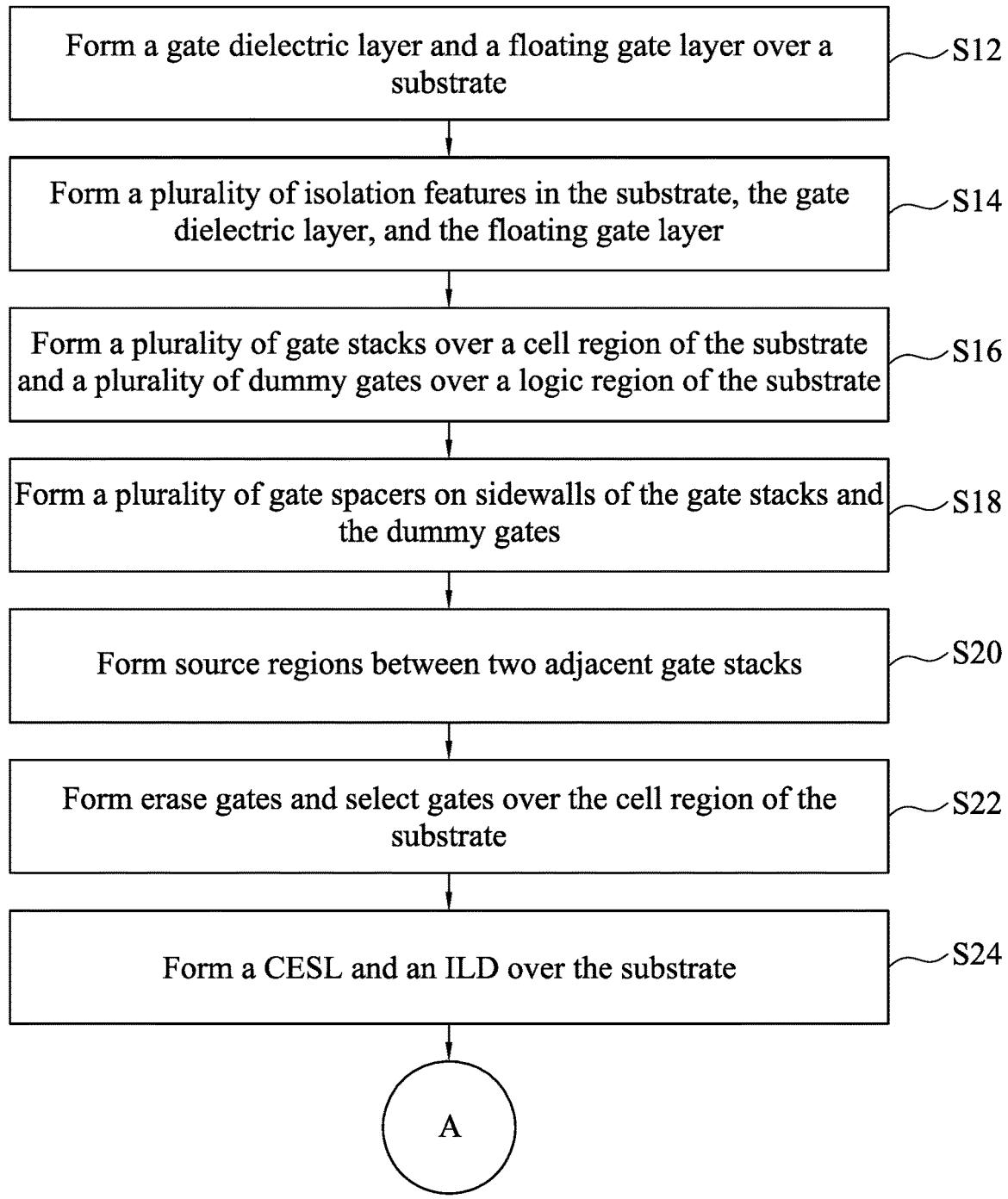
FIGS. 46A and 46B illustrate a method of forming a memory device in accordance with some embodiments.
Figure 46B:
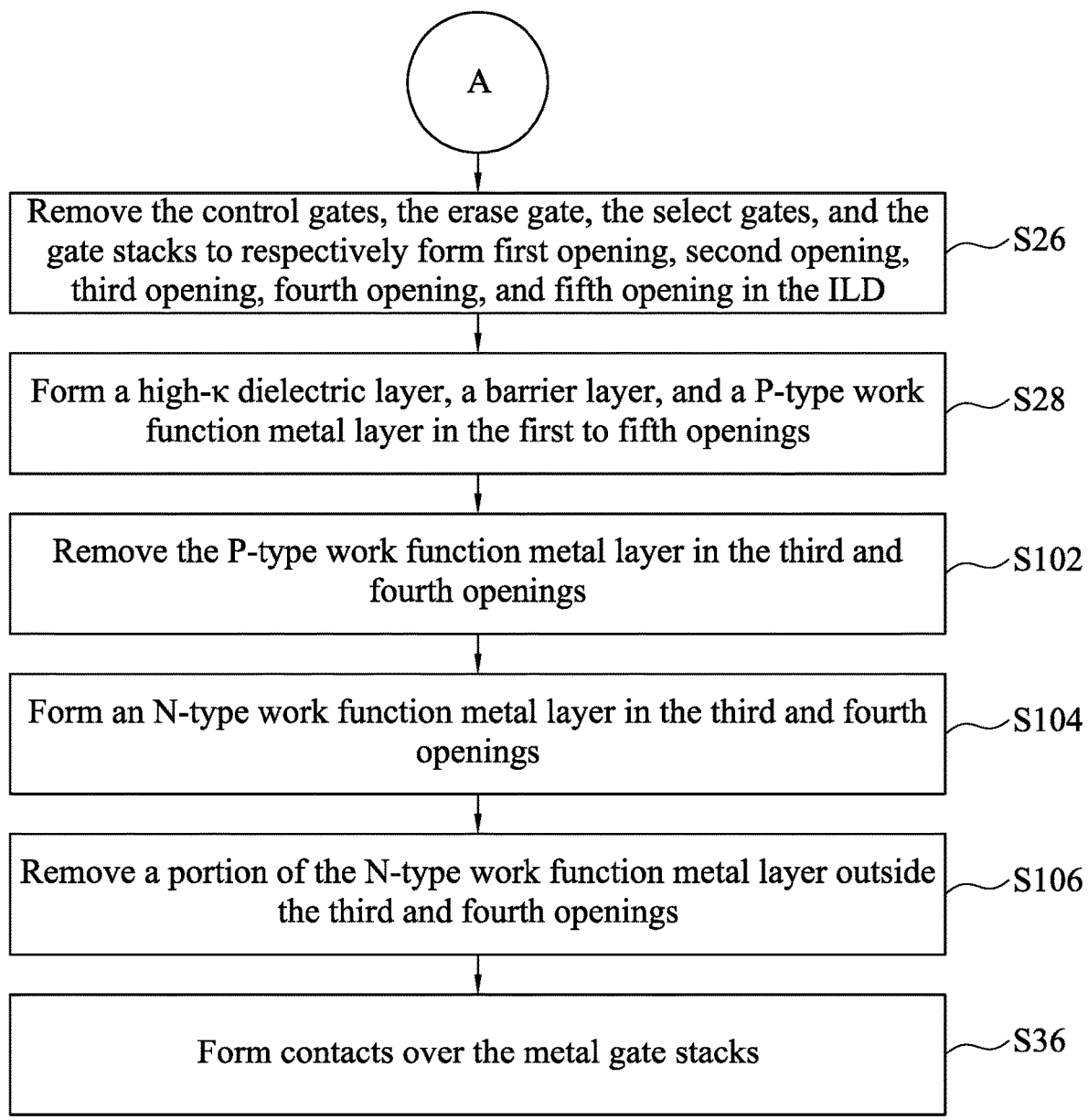

FIGS. 46A and 46B illustrate a method M8 of forming a memory device in accordance with some embodiments. Although the method M8 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Since the processes in blocks S12 to S28 are the same as in the method M1 of FIGS. 29A and 29B, a detailed description is not repeated herein. At block S102, the P-type work function metal layer in the third and fourth openings is removed. At block S104, an N-type work function metal layer is formed in the third and fourth openings. At block S106, a portion of the N-type work function metal layer outside the third and fourth openings is removed. At block S36, contacts are formed over the gate stacks. FIG. 45 illustrates cross-sectional views of some embodiments corresponding to act in block S36.

According to some embodiments, since the erase gate of the memory cell is a metal gate stack, the capacitive coupling from the erase gate to the floating gate is increased. As such, the programming speed of the memory cell may be increased by using potentials at both the erase gate and the control gate. That is, the read and write operations of the memory cell is faster. For example, the programming speed may be reduced by about an order (e.g., from about 100 ms to about 20 ms). Moreover, since the control gate of the memory cell may be a metal gate stack, the capacitive coupling from the control gate to the floating gate is also increased, such that the control gate coupling ratio is improved. Furthermore, the replacement of the erase gate (also the control gate and/or the select gate) can be performed with the replacement of the gates of the transistors in the logic region, so the manufacturing time is not increased. The CMP process also align the heights of the control gate, the erase gate, the select gate, the N-type gate stack, and the P-type gate stack, such that the manufacturing complexity in the following processes is reduced. Also, since the high-κ dielectric layer is formed in the replacement process, which is referred to as the high-κ last process, the thermal budget problem is improved, and the electrical performance of the memory device can be improved.

According to some embodiments, a memory device includes a substrate, a transistor, and a memory cell. The substrate includes a cell region and a logic region. The transistor is over the logic region and includes a first metal gate stack. The memory cell is over the cell region and includes an erase gate. The erase gate is a metal gate stack.

According to some embodiments, a method for forming a memory device includes forming a memory cell over a cell region of a substrate. The memory cell includes a dummy erase gate. A transistor is formed over a logic region of the substrate. The transistor includes a dummy gate stack. The dummy erase gate is removed to form a first opening over the substrate. The dummy gate stack is removed to form a second opening over the substrate. A first metal gate stack is formed in the first opening and a second metal gate stack is formed in the second opening simultaneously.

According to some embodiments, a method for forming a memory device includes forming a memory cell over a substrate. The memory cell includes a dummy erase gate and a dummy control gate. The dummy erase gate is removed to form a first opening over the substrate. The dummy control gate is removed to form a second opening over the substrate. A first metal gate stack is formed in the first opening and a second metal gate stack is formed in the second opening simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device comprising:
    forming a memory cell over a cell region of a substrate, wherein the memory cell comprises a dummy erase gate;
    forming a transistor over a logic region of the substrate, wherein the transistor comprises a dummy gate stack;
    removing the dummy erase gate to form a first opening over the substrate;
    removing the dummy gate stack to form a second opening over the substrate;
    depositing a first work function metal layer in the first and second openings;
    removing a portion of the first work function metal layer in the first opening; and
    after removing a portion of the first work function metal layer in the first opening, depositing a second work function metal layer in the first opening, such that the second opening is free of the second work function metal layer.

2. The method of claim 1, further comprising
depositing a high-K dielectric layer in the first opening and the second opening; and
depositing a barrier layer over the high-K dielectric layer prior to depositing the first work function metal layer in the first and second openings.

3. The method of claim 1, wherein the memory cell further comprises a dummy control gate, and the method further comprises:
removing the dummy control gate to form a third opening over the substrate; and
forming a metal gate stack in the third opening.

4. The method of claim 3, wherein a third work function metal layer of the metal gate stack comprises an N-metal, and the second work function metal layer comprises a P-metal.

5. The method of claim 1, wherein the memory cell further comprises a dummy select gate, and the method further comprises:
removing the dummy select gate to form a third opening over the substrate; and
forming a metal gate stack in the third opening.

6. The method of claim 5, wherein a third work function metal layer of the metal gate stack comprises an N-metal, and the second work function metal layer comprises a P-metal.

7. A method for forming a memory device comprising:
forming a memory cell over a substrate, wherein the memory cell comprises a dummy erase gate and a dummy control gate;
removing the dummy erase gate to form a first opening over the substrate;
removing the dummy control gate to form a second opening over the substrate;
depositing a barrier layer in the first and second openings;
depositing a first work function metal layer in the first opening and in contact with the barrier layer; and
depositing a second work function metal layer in the second opening and in contact with the barrier layer.

8. The method of claim 7, further comprising:
depositing a high-K dielectric layer in the first opening and the second opening prior to depositing the barrier layer in the first and second openings.

9. The method of claim 7, further comprising:
forming a first transistor over a logic region of the substrate, wherein the first transistor comprises a first dummy gate stack;
removing the first dummy gate stack to form a third opening over the substrate; and
forming a first metal gate stack in the third opening.

10. The method of claim 9, wherein a third work function metal layer of the first metal gate stack and the first work function metal layer have different work functions.

11. The method of claim 9, further comprising:
forming a second transistor over the logic region of the substrate, wherein the second transistor comprises a second dummy gate stack;
removing the second dummy gate stack to form a fourth opening over the substrate; and
forming a second metal gate stack in the fourth opening.

12. A method for forming a memory device comprising:
forming a memory cell over a substrate, wherein the memory cell comprises a dummy erase gate;
forming a first transistor over a logic region of the substrate, wherein the first transistor comprises a first dummy gate stack;
removing the dummy erase gate to form a first opening over the substrate;
removing the first dummy gate stack to form a second opening over the substrate;
forming a high-k dielectric layer simultaneously at least in the first opening and the second opening;
forming a first work function metal layer over the high-k dielectric layer and in the first and second openings;
removing a first portion of the first work function metal layer in the first opening such that a second portion of the first work function metal layer remains in the second opening to form a first metal gate stack;
after removing the first portion of the first work function metal layer in the first opening, depositing a second work function metal layer over the first metal gate stack and in the first opening; and
removing a portion of the second work function metal layer outside the first opening to form a second metal gate stack in the first opening.

13. The method of claim 12, wherein the first work function metal layer comprises a P-metal, and the second work function metal layer comprises an N-metal.

14. The method of claim 12, further comprising forming a barrier layer simultaneously in the first opening and the second opening and over the high-k dielectric layer prior to forming the first work function metal layer.

15. The method of claim 14, wherein removing the first portion of the first work function metal layer in the first opening is further such that a portion of the barrier layer in the first opening is exposed after removing the first portion of the first work function metal layer.

16. The method of claim 14, wherein forming the second work function metal layer is such that the second work function metal layer is in contact with the barrier layer.

17. The method of claim 12, wherein removing the first portion of the first work function metal layer in the first opening such that the second portion of the first work function metal layer remains in the second opening to form the first metal gate stack comprises:
removing a third portion of the first work function metal layer outside the first opening and the second opening; and
removing the first portion of the first work function metal layer in the first opening after removing the third portion of the first work function metal layer.

18. The method of claim 12, further comprising:
forming a mask to cover the first opening and expose the second opening prior to forming the high-k dielectric layer; and
forming a gate dielectric layer in the second opening prior to forming the high-k dielectric layer.

19. The method of claim 18, further comprising:
removing the mask after forming the gate dielectric layer and prior to forming the high-k dielectric layer.

20. The method of claim 12, wherein forming the high-k dielectric layer is such that a portion of the high-k dielectric layer is formed outside the first opening and the second opening, and the method further comprises:
removing the portion of the high-k dielectric layer after removing the first portion of the first work function metal layer.

* * * * *